(12) United States Patent
Epstein et al.

(10) Patent No.: US 11,968,504 B1
(45) Date of Patent: Apr. 23, 2024

(54) HEARING-ASSIST SYSTEMS AND METHODS FOR AUDIO QUALITY ENHANCEMENTS IN PERFORMANCE VENUES

(71) Applicant: The Epstein Hear Us Now Foundation, Dallas, TX (US)

(72) Inventors: Barry Epstein, Dallas, TX (US); Christopher Ryan Knox, Erie, CO (US)

(73) Assignee: The Epstein Hear Us Now Foundation, Dallas, TX (US)

( * ) Notice: Subject to any disclaimer, the term of this patent is extended or adjusted under 35 U.S.C. 154(b) by 0 days.

(21) Appl. No.: 18/520,443

(22) Filed: Nov. 27, 2023

(51) Int. Cl.
*H04R 3/04* (2006.01)
*H04R 3/12* (2006.01)
*H04R 27/00* (2006.01)

(52) U.S. Cl.
CPC ............... *H04R 3/04* (2013.01); *H04R 3/12* (2013.01); *H04R 27/00* (2013.01); *H04R 2227/009* (2013.01); *H04R 2430/01* (2013.01)

(58) Field of Classification Search
None
See application file for complete search history.

(56) References Cited

U.S. PATENT DOCUMENTS

| | | | | |
|---|---|---|---|---|
| 8,045,739 B2* | 10/2011 | Paludan-Mueller | ........................ H04R 25/356 381/106 |
| 8,213,653 B2* | 7/2012 | Von Buol | ............. | H04R 25/356 381/104 |
| 8,913,768 B2* | 12/2014 | Kates | .................... | H04R 25/505 381/312 |
| 8,924,220 B2* | 12/2014 | Hosokawa | ............. | H03G 9/025 381/103 |
| 9,654,876 B2* | 5/2017 | Neely | .................... | H03G 9/025 |
| 10,097,929 B2* | 10/2018 | Oshima | ................ | H04R 25/353 |
| 11,234,093 B2* | 1/2022 | Garcia | .................... | H04S 3/008 |
| 2005/0111683 A1* | 5/2005 | Chabries | ................ | H03G 9/005 381/317 |

* cited by examiner

*Primary Examiner* — Paul W Huber
(74) *Attorney, Agent, or Firm* — Foley & Lardner LLP

(57) ABSTRACT

To enable a patron of a venue attending a performance to feel as if he or she is 'front and center' even if located much farther away or angled from a stage of the venue, system and methods that enhance audio quality of audio signals especially over the voice frequency spectrum to generate a processed audio signal including an increased voice frequency spectrum are provided. The processed audio signal may be communicated to a receiving system with a headset or other transducer (e.g., loudspeakers) that allows for ambient sounds to be heard by a patron and for the patron to control volume of the processed audio signal, thereby mixing the processed audio signal with the ambient sounds. The receiving system may be rented and an operator may control usage for both performance or long-term rentals using various control features of the processed audio signals and/or receiving system.

18 Claims, 20 Drawing Sheets

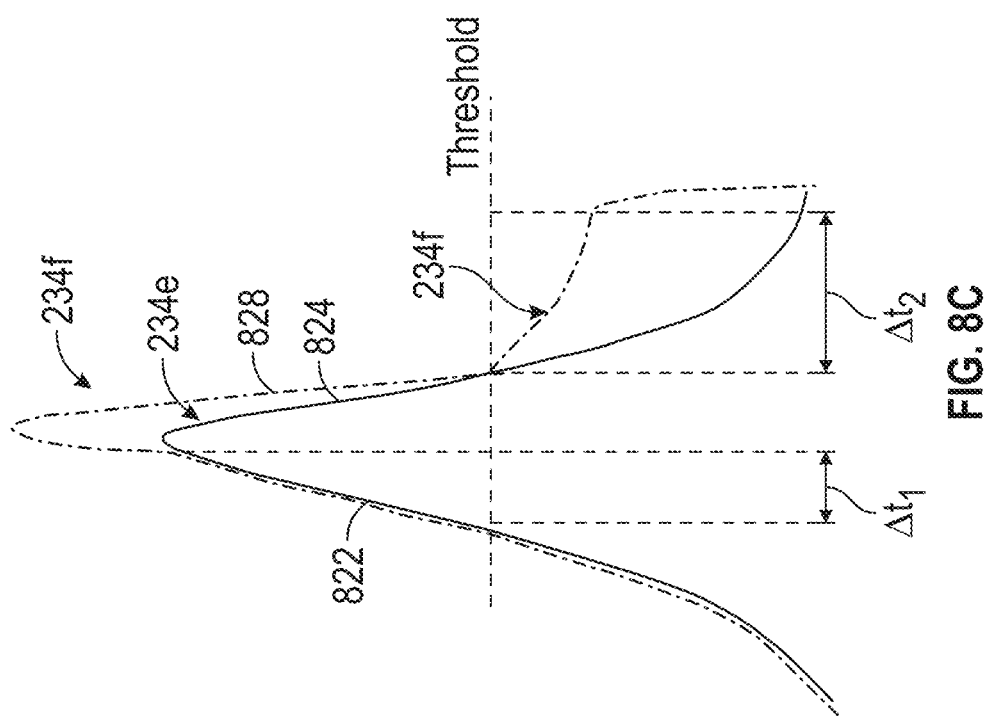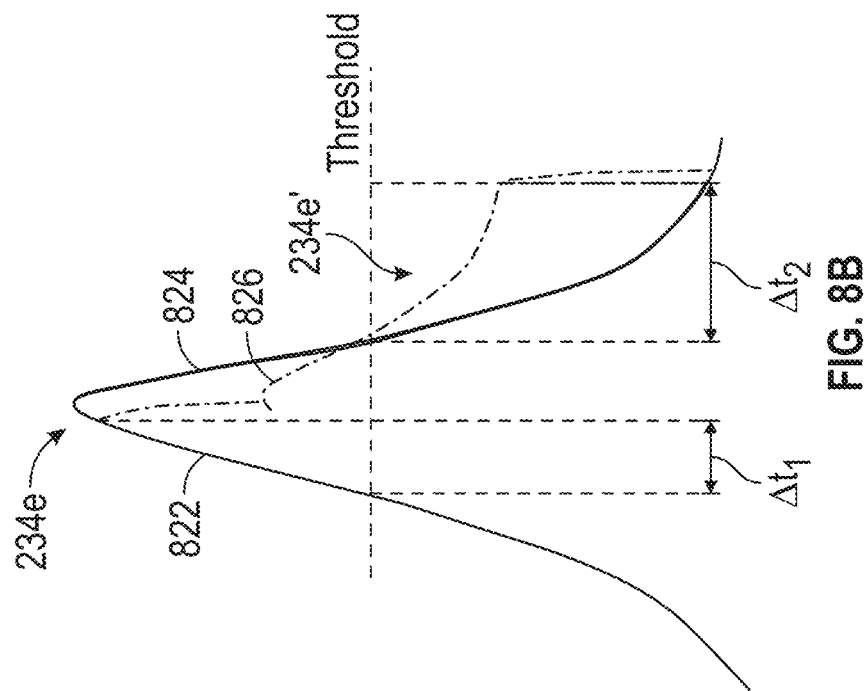

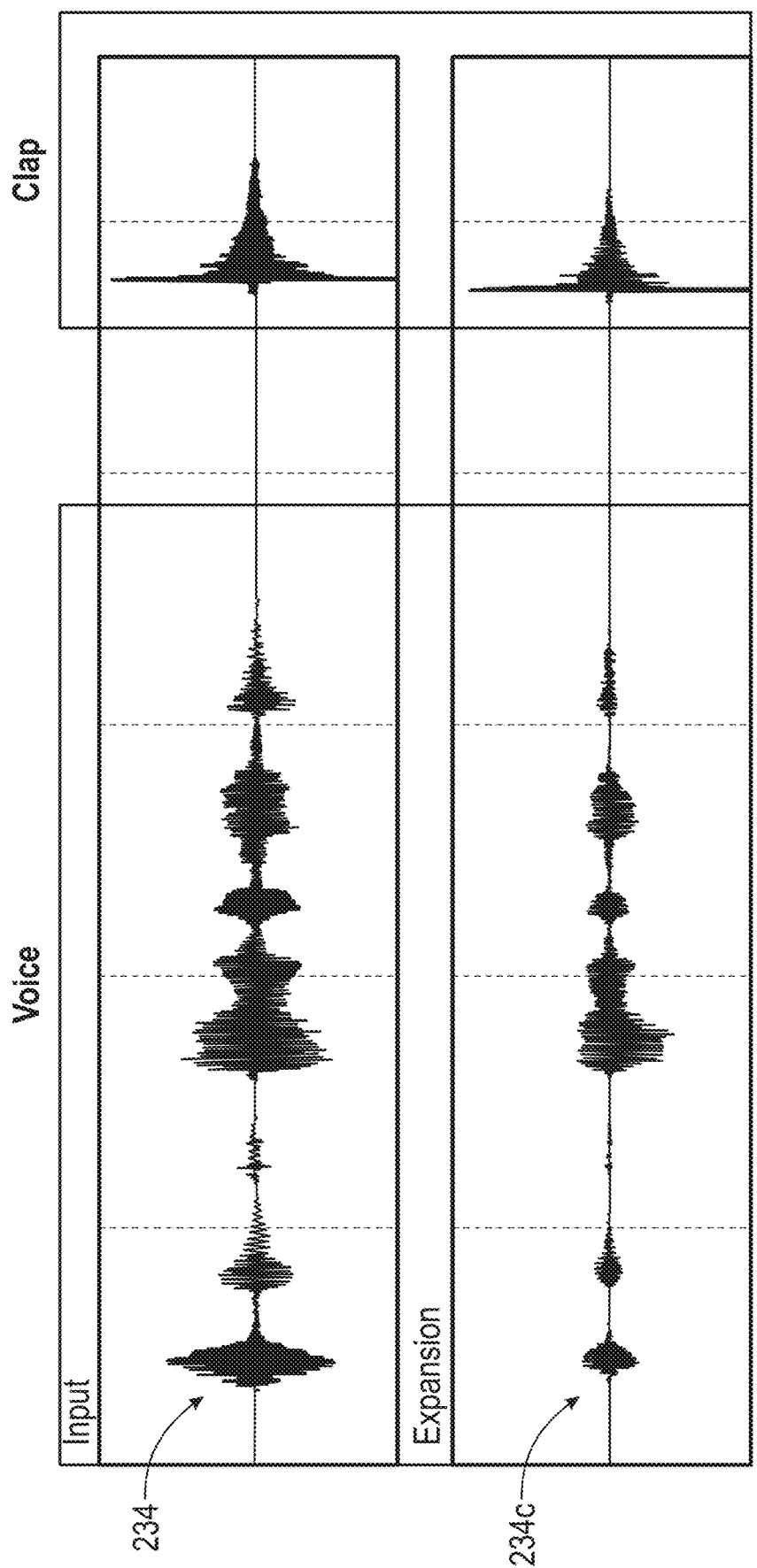

HEARING-ASSIST SYSTEMS AND METHODS FOR AUDIO QUALITY ENHANCEMENTS IN PERFORMANCE VENUES

TECHNICAL FIELD OF THE INVENTION

The present disclosure relates in general to hearing-assist systems and methods for enhancing audio experience in various venues or environments. More specifically, systems, devices and methods described herein improve sound quality and speech intelligibility in venues by reducing the noise floor and adjusting the dynamic ranges of different components of audio signals.

BACKGROUND

The population of hearing-impaired and severely hearing-impaired youth and adults is approaching 50 million in the United States and is growing rapidly. The plight of the severely hearing-impaired can be very difficult. The ability to enjoy live theater, a religious service, or even a movie is more important than just for entertainment purposes. For children, proper hearing enables critical development and contact with the everyday world. For adults or the elderly, proper hearing allows enjoyment, mental stimulation, and social contact that is important. However, due to hearing impairment, some youth and adults may no longer be able to obtain the full benefit from these activities.

Hearing-assist systems, as found in venues, such as churches, movie theaters, live Broadway theaters, other performance venues and/or other types of venues, attempt to provide amplified sound to the hearing-impaired. Many of the performance venues as well as other types of venues are legally required to provide such hearing-impaired systems. The legal requirements for hearing-impaired systems do not provide significant detail with regard to optimizing the sound for a hearing-impaired person. A typical venue operator (and even the sound production staff) is understandably focused on other high-priority tasks, and the hearing-assist system is often described as 'the end of the food chain,' in that minimal effort is made improving the hearing-assist system. Most often, the sound from existing hearing-assist system is perceived by the user to be unintelligible, which can be frustrating for hearing-impaired users such that those users give up and retreat from attending performance venues. It should be understood that hearing-impaired individuals have a wide range of hearing impairments, where some may have certain frequencies that are well perceived, while others simply hear all frequencies poorly. Because most hearing-impaired systems are intended to increase amplitude for all sound frequencies, many people with hearing impairments are still unable to properly understand speech (e.g., words and/or singing) due to other sounds, such as music, multiple speakers, or other ambient noises, such as audience and/or theater noises.

Many hearing-impaired individuals have tried hearing-assist systems in performance venues, such as movie theaters, live Broadway theaters, and churches in an attempt to maintain social contact, but largely without success. Those individuals have been unable to hear or understand the dialog on typical headsets, T-loop, and similar hearing-assist systems and have essentially retreated from these live audience performances. The issue or challenge is that typical hearing-assist systems were not optimized or designed for use in performance venues. Moreover, those individuals with hearing aids, which may or may not be compatible with hearing-assist systems in performance venues, often do not provide suitable hearing solutions within performance venues.

More specifically, the poor hearing-assist sound quality, as perceived by a hearing-impaired person in such performance venues, results from the fact that most hearing-assist systems appear to be designed for a home, museum, or classroom environment, perhaps because cumulatively these markets may be larger than the performance venues of focus herein. The hearing-assist sound is typically transmitted to a headset or hearing aid, such as Cochlear implants, by FM, infrared, magnetic, or similar communicative coupling. It is recognized that the hearing-impaired person may still hear all or portions of the performance venue's ambient sound directly, either through one ear being good (i.e., unaided) or through the person's natural hearing frequency response.

Since there is a time delay between the sound waves propagated through air and representations of the sound propagated electronically to a device, as well as the energies in the ambient propagated sound, there may be significant interference between the ambient sound and the hearing-assisted electronic sound. This interference can be extremely confusing and is likely to render the ultimate signal actually heard by the hearing-assisted user as "gibberish" or cause a synchronization problem, even if minor, that is annoying and distracting for a user of the hearing-impaired system.

The problem for the hearing-assist user in such venues is often referred to as a psychoacoustic effect. That is, as used herein, psychoacoustics is concerned with how sound is perceived, and a psychoacoustic effect is the psychological and physiological response by a hearing-impaired hearing-assist user to receiving sound in a performance venue. This sound heard by the hearing-assist user can include a mix of ambient sound as well as electronically transmitted sound.

As will be described in greater detail below, the psychoacoustic effect for a hearing-assist user occurs in any performance venue where some sound heard by that user is ambient and some sound to be heard by the user is electronically transmitted (e.g., via loud speakers or headsets). In small venues, such as in a home or a classroom or the like, this effect is not significantly affected by differences between ambient sound and electronic sound and tends to not result in the masking or garbling of effects present in the original sound; however, in large performance venues, such as theaters, concert halls, opera houses, or the like, the sound effect can be sufficiently significant to noticeably degrade the person's enjoyment of the program being performed. Conventional hearing-assist systems do not adequately address this sound effect issue that results in a psychoacoustic affect. Accordingly, there is a need for a hearing-assist system that accommodates hearing-impaired people with various hearing impairments without the negative effects that exist in conventional hearing-assist systems that have not been developed for large performance venues. It should be understood that people who are considered to have normal or unimpaired hearing may also benefit from a hearing-assist system that improves speech signals such that words that might otherwise be difficult to hear and understood may be better heard by the patrons using headsets of the hearing-assist system described herein.

BRIEF SUMMARY

To overcome the problem of conventional hearing-assist systems used in performance venues and/or other types of venues, such as theaters, opera halls, airports, airplanes, home theaters, among many other venues, psychoacoustic conflicts between ambient sound and hearing-assisted sound provided by a hearing-assist system may be reduced or eliminated using a hearing-assist system that improves voice signals of performers by improving signal-to-noise ratio of voice signals and reducing bass signals using various signal processing techniques. Utilizing the principles described herein, the hearing-assist system may be economically produced and supported, thereby allowing for people of all means to be able to utilize the hearing-assist system.

Because performance venue sound systems that are meant to capture sounds via microphones and other system inputs (e.g., directly from electronic instruments, for example) are expensive and are not easily maintained or often replaced, a hearing-assist system that solves the above-described psychoacoustic problem/conflicts may be configured to enable existing performance venue sound systems as well as sound systems of other types of venues to be retrofitted with or coupled to the hearing-assist system or be incorporated into new venue sound systems. The principles described herein significantly improve the perception and intelligibility of speech signals (e.g., voices of performers in a performance venue) embedded in or mixed with ambient or music sounds and/or other types of audio signals for a hearing-impaired or non-hearing person, whether he or she uses only a hearing-assist headset or uses a traditional hearing aid system. Moreover, the hearing-assist system principles provided herein bridges the gap between the world of performance venues, such as performing arts theater, movie theater, or other performance (e.g., comedy) venues, as well as other types of venues and the needs of the hearing-impaired person in that environment to hear words, dialogue or singing, of performers in a clearer manner.

The hearing-assist system may include circuitry and/or signal processing software inserted in a signal path between a venue sound system in a venue and a hearing-assist headset (e.g., receiver and wired headphones) used by a user in the venue that limits or eliminates potential psychoacoustic effect due to conflict and/or interference between ambient sound in the venue and sound heard by the user via the hearing-assist headset or unit. The hearing-assist system may recognize and correct the conflict that exists between the hearing-assist sound and the ambient sound of the venue as perceived by the hearing-impaired user of the hearing-assist headset. The hearing-assist system provided herein bridges the gap between audiology science and electronics and combines these two disciplines in a manner not provided in conventional hearing-assist systems.

The hearing-assist system not only customizes the sound so that dialogue is emphasized while other portions of a sound program, such as bass-heavy music, is de-emphasized, or even removed, the system may also be configured to introduce specific delays so that the electronically customized sound reaches the hearing-assist user virtually or substantially simultaneously with sound that is ambient in the performance venue. Still further, the system customizes the sound signal so that low amplitude valleys and peak amplitudes are reduced, using reduction/attenuation techniques that reduce the dynamic range and allow amplification of the remaining signal, such as a companding or similar technique. Also, the system significantly improves the signal/noise ratio and increases available clear speech sound energy by increasing amplitude of the transmitted speech signal.

To further mitigate the problems with conventional hearing-assist systems as well as problems associated with sound systems of various types of venues, the following are examples of signal processing that can be performed on audio signals output by the venue sound system prior to being transmitted by the hearing-assist system to hearing-assist headset(s) used by audience members or performed on audio signals input to the venue sound system:

A. Reduction of low frequencies below approximately 300 Hz by about 12 db to about 15 db. Being "about" may be within 5% or 10% of the level, but higher or lower amounts are possible. Although this low frequency reduction may appear to be a severe bass cut, the overall sound typically still sounds rich and balanced to a hearing-assist listener because the low frequencies are still received from the venue sound system. Hearing the low frequencies occurs by body conduction of low frequencies, and the fact that headsets described herein provide limited sound isolation, such ambient low frequencies are still heard by the hearing-assist listener to a significant degree. By first reducing high disturbing energy (e.g., low frequencies below about 300 Hz), processing the remaining audio signal can be more accurate, signal-to-noise ratio on a transmitter can be improved, voice or dialogue output energy communicated to the hearing-assist headset can be increased, and dynamic range of the audio signal including voice signals after removing the disturbing energy can be improved.

In the chain of signal processing, reducing undesired frequencies first allows the following processing to work more effectively:

B. Further improving dialog or speech quality by applying techniques, such as Aphex and/or moderate bandpass filtering, to favor the speech band, and/or moderate high frequency emphasis, as desired.

C. Reducing the dynamic range of the remaining signal by increasing low amplitude valleys and reducing peak amplitudes, using "companding" or a similar technique.

D. Increasing the amplitude of the transmitted sound signal based upon the above processing, thereby significantly improving the signal/noise ratio and increasing the available clear voice or speech energy at the headset.

E. One or more outputs may be provided with various delays to the hearing-assist signal(s) as used by particular or all segments of a performance venue to reduce timing disparity between a rapidly delivered hearing-assist signal and a later perceived ambient (audience) sound.

The above and other signal processing may dramatically improve the ability for severely hearing-impaired persons to enjoy the hearing-assist system, even using a standard off-the-shelf headset. As a result of the signal processing, a perception by a user of the headset of the hearing affect system that dialog or singing by performers is magnitudes stronger and clearer through the same headsets than previously without the above processing. The hearing-assist listeners who were previously unable to understand dialogue through a conventional hearing-assist system or could only rely upon their special hearing aids with T-loop or other direct input, with mediocre results, may be able to hear dialogue clearly and may use or not use their special hearing aids utilizing the hearing-assist system described herein.

The described hearing-assist system enhancements may be added to an existing or new hearing-assist system of any type, and may utilize a variety of communications protocols, such as wired, FM, infrared, inductive, wide area, Bluetooth®, cell phone, or incorporated in a new system by those skilled in the art. Other variations will also be obvious to those skilled in the art.

The principles described herein can be applied to special situations to further increase the number of hearing-impaired that can be served in such performance venues.

As another example, consider a classroom found in many elementary schools for the severely hearing-impaired. The teacher may speak into a special FM frequency hearing-assist system and the signal is transmitted to special hearing aids worn by the students and equipped with an FM receiver and a microphone, as well. For the young students, the microphone is left on at all times to allow them to stay in touch with their environment as the students may also be too young to have the agility to turn ON and OFF the microphone. In the small quiet classroom leaving the microphone ON is not a negative. A further assumption is that a venue desires to give hearing-assist services to these children by simulating their classroom environment. As part of this simulation, a transmitter on the proper FM frequency can be installed and served by the signal processing described herein. However, the students' microphone may also be turned ON. Therefore, the house ambient sound is injected into the students' ears at a very high and unnatural level. Under these conditions, as previously described, there is a very small tolerance of a few milliseconds that can be tolerated between the hearing-assist sound and the venue ambient sounds. It is understood that this configuration is opposite of using isolated headsets to attenuate undesired venue ambient sounds. Hence, selected adjacent rows of a performance venue (e.g., theater) may be defined as "classroom compatible." In this case, delays of the hearing-assist system for these users are to be precisely adjusted to correlate with the ambient sound in the designated rows. The students are capable of hearing for the first time ever in a performance venue, such as a theater, including students with Cochlear implants.

Therefore, the system embodying the principles described herein may operate in several steps: filtering out excessive unwanted energy, for example, the bass and low-mids as a first step for the hearing-assist signal path. Filtering excessive energy in the bass and low-mids essentially leaves voice or dialog energy (plus low-level bass (after high-pass filtering), moderate music, and sound effects). The system may then effectively apply additional enhancements to the dialog or voice energy unencumbered by the excess bass energy or undesired energy that might 'fool' subsequent audio signal processing. Such enhancements may include adding a small mid-high frequency boost in the frequency range common for hearing-impaired loss, adding automatic volume control, and reducing/attenuating the signal, as by companding (compression of high peaks, expansion of soft sounds), or the like. It is noted that if excessive bass were to remain, the excessive bass would overshadow attempts to enhance the dialog energy and other speech enhancement techniques, as desired. A time delay may also be introduced to the hearing-assist signal so timing correlates better with the ambient sound that is delayed due to propagation through the air and processing in the main venue sound system.

The resulting dialogue or vocal sound heard by the hearing-assist user is perceived to be clearer and louder than other sounds. The total energy is similar, but the vocal energy is increased due to the lack of bass energy and other undesirable sound energy in the hearing-assist audio signal stream.

The quality of sound reaching a hearing-assist user may further be improved by the hearing-assist system including headsets with light-weight headphones (e.g., earsets or earphones with a thin strap to be worn over the head, below the chin, or behind the head) that may be used by the headset user. These headsets can be communicatively connected to the hearing-assist system by over-the-air communication or by patch cords, as suitable. A cellular telephone might even be used to support this venue-user connection.

The hearing-assist system may be most useful in performance venues, such as large concert halls, that are used for musical concerts, operas and musical plays, for example. However, as those skilled in the art will understand the hearing-assist system can be used in any venue.

Another growing segment today of the hearing-impaired population has hearing aids that can accept an external input, such as a line level audio input or T-loop inductive input. These users can be accommodated by a patch cord assembly or T-loop inductive adapter connected to the hearing-assist receiver in place of the headset previously described. In this case the user receives a processed audio signal as described herein as well as additional customization afforded by his or her own hearing aid.

While the hearing-assist system utilizing the principles described herein is directed to speech as being the preferred component of the overall signal, those skilled in the art will understand that the teaching of this disclosure can be used to filter any signal to emphasize desired components and reduce, or eliminate, other undesired components of the signal. As such, speech as the desired component is used herein as an example of the preferred form of the system with the understanding that the disclosure and claims associated therewith is intended to cover the situation where certain desired components of the signal are emphasized and undesired components are reduced or eliminated. For example, if music is the desired component, then the music component may be optimized, or where certain speech components (e.g., female or male voices) are desired and other speech components are undesired, then optimization of the desired speech components may be optimized. These different situations are intended to be encompassed by this disclosure and the claims associated therewith.

The hearing-assist system allows reduction of undesirable audio components, such as about 500:1, which maintains some so a user can hear the desired components of the overall signal, but can also hear some of the undesired components if a portion of those undesired components are helpful to an overall sound experience desired. For example, the hearing-assist system described herein allows a user to hear dialog, but also hear some music so that the overall signal heard by the user is a mix, but a mix that emphasizes dialog so that music does not overpower the dialog and render the voice or dialog signal heard by the hearing-assist headset user as "gibberish." The terms dialog, voice, speech, verbal, or otherwise referring to sounds produced by a performer via their vocal cords are interchangeable herein. As a result, the principles described herein may be utilized in a wide variety of venues and systems, such as home televisions and/or surround systems (e.g., center channel) so as to achieve clearer dialog or even main speakers of a public address system. In an embodiment, sound systems, such as airplane and train sound systems, may employ the principles provided herein.

According to one aspect, a method of enhancing audio quality of audio signals in venues hosting sound programs can include reducing, by a computer system, amplitudes of one or more segments of an audio signal to generate a first audio signal. The amplitudes of the one or more segments determined to be below a first threshold. The method can include applying, by the computer system, multi-band compression to the first audio signal to generate a second audio signal. Applying the multi-band compression includes reducing dynamic ranges of the first audio signal within multiple frequency bands. The method can include the computer system reducing a dynamic range of the second audio signal to generate a third audio signal, generating an output audio signal using a sum of the second audio signal and the third audio signal, and transmitting the output signal over one or more communication channels to a plurality of receivers. Each receiver can be communicatively coupled to a corresponding component (e.g., headset, loud speaker, or any other transducer, such as a cochlear implant or streamer, etc.).

In some implementations, the method can further include applying high pass filtering to the audio signal before reducing the amplitudes of the one or more segments determined to be below the first threshold. The method may further include applying a corrective equalizer to enhance amplitudes of frequency components of the audio signal at frequencies greater than or equal to about 2 KHz before reducing the amplitudes of the one or more segments determined to be below the first threshold.

In some implementations, reducing the amplitudes of the one or more segments of the audio signal can include initiating amplitude suppression of the audio signal upon detecting that an amplitude of the audio signal is below the first threshold for a first predefined time period and turning off the amplitude suppression upon detecting that the amplitude of the audio signal exceeds the first threshold for a second predefined time period. The amplitude suppression can include multiplying a difference between the amplitude of the audio signal and the first threshold by a predefined scaler. The first threshold can be between −25 and −45 decibels relative to full scale (dBFS).

In some implementations, generating the first audio signal can further include applying wide-band compression to the audio signal with reduced amplitudes of the one or more segments, and applying the wide-band compression includes reducing a dynamic range of the audio signal after reducing the amplitudes of the one or more segments. Applying the wide-band compression can include detecting, after reducing the amplitudes of the one or more segments, one or more second segments of the audio signal having amplitudes exceeding a second threshold and including frequency components within a predefined frequency band and reducing the dynamic range of audio signal within the one or more second segments. The method can further include initiating amplitude suppression of the audio signal upon detecting that (i) an amplitude of the first audio signal exceeds the second threshold for a first predefined time period and that (ii) the audio signal includes at least one frequency component within the predefined frequency band during the first predefined time period, and turning off the amplitude suppression of the audio signal upon detecting that (i) the amplitude of the audio signal is below the second threshold for a second predefined time period or that (ii) the audio signal does not include frequency components with the predefined frequency band during the second predefined time period. The amplitude suppression can include multiplying a difference between the amplitude of the audio signal and the second threshold by a predefined scalar. The second threshold can be between −25 and −10 decibels relative to full scale (dBFS). The predefined frequency band can be between about 100 Hz and about 2 KHz. It should be understood that more than 2 KHz may be utilized for the predefined frequency band, as well.

In some implementations, applying multi-band compression to the first audio signal can include applying a first band-pass filter to the first audio signal to generate a first band-pass filtered audio signal, applying a second band-pass filter to the first audio signal to generate a second band-pass filtered audio signal such that the first band-pass filter and the second band-pass filter are associated with different frequency bands, detecting one or more segments of the first band-pass filtered audio signal having amplitudes exceeding a second threshold, reducing a dynamic range of the one or more segments of the first band-pass filtered audio signal, detecting one or more segments of the second band-pass filtered audio signal having amplitudes exceeding a third threshold, reducing a dynamic range of the one or more segments of the second band-pass filtered audio signal and generating the second audio signal using a sum or weighted sum of the first band-pass filtered audio signal and the second band-pass filtered audio signal. The method can include initiating amplitude suppression of the first band-pass filtered audio signal upon detecting that an amplitude of the first band-pass filtered audio signal exceeds the second threshold for a first predefined time period, turning off the amplitude suppression of the first band-pass filtered audio signal upon detecting that the amplitude of the first band-pass filtered audio signal is below the second threshold for a second predefined time period, initiating amplitude suppression of the second band-pass filtered audio signal upon detecting that an amplitude of the second band-pass filtered audio signal exceeds the third threshold for a third predefined time period, and turning off the amplitude suppression of the second band-pass filtered audio signal upon detecting that the amplitude of the second band-pass filtered audio signal is below the third threshold for a fourth predefined time period. The amplitude suppression of the first band-pass filtered audio signal can include multiplying a difference between the amplitude of the first band-pass filtered audio signal and the second threshold by a first predefined scalar and the amplitude suppression of the second band-pass filtered audio signal can include multiplying a difference between the amplitude of the second band-pass filtered audio signal and the third threshold by a second predefined scalar. The second threshold can be between −35 and −25 decibels relative to full scale (dBFS) and the third threshold can be between −30 and −15 dBFS.

In some implementations, reducing the dynamic range of the second audio signal can include reducing the dynamic range of the second audio signal within a predefined frequency range. Reducing the dynamic range of the second audio signal within the predefined frequency range can include initiating amplitude suppression of the second audio signal upon detecting that (i) an amplitude of the second audio signal exceeds a second threshold for a first predefined time period and that (ii) the second audio signal includes at least one frequency component within the predefined frequency band during the first predefined time period, and turning off the amplitude suppression of the first band-pass filtered audio signal upon detecting that (i) the amplitude of the second audio signal is below the second threshold for a second predefined time period or that (ii) the second audio signal does not include frequency components with the predefined frequency band during the second predefined time period. The first threshold can be between −20 and −40 decibels relative to full scale (dBFS). The predefined frequency band can be between about 600 Hz and about 6 KHz.

According to at least one other aspect, a system for enhancing audio quality of audio signals in venues hosting sound programs can include circuitry including one or more processors. The circuitry can be configured to reduce amplitudes of one or more segments of an audio signal to generate a first audio signal, wherein the amplitudes of the one or more segments are determined to be below a first threshold, apply multi-band compression to the first audio signal to generate a second audio signal, applying the multi-band compression includes reducing dynamic ranges of the first audio signal within multiple frequency bands, reduce a dynamic range of the second audio signal to generate a third audio signal and generate an output audio signal using a sum or a weighted sum of the second audio signal and the third audio signal, and transmit the output signal over one or more communication channels to a plurality of receivers, each receiver communicatively coupled to a corresponding output component.

In some implementations, the circuitry can be configured to apply high pass filtering to the audio signal before reducing the amplitudes of the one or more segments determined to be below the first threshold. The circuitry can be configured to apply a corrective equalizer to enhance amplitudes of frequency components of the audio signal at frequencies greater than or equal to 2 KHz before reducing the amplitudes of the one or more segments determined to be below the first threshold.

In some implementations, in reducing the amplitudes of the one or more segments of the audio signal, the circuitry can be configured to initiate amplitude suppression of the audio signal upon detecting that an amplitude of the audio signal is below the first threshold for a first predefined time period and turn off the amplitude suppression upon detecting that the amplitude of the audio signal exceeds the first threshold for a second predefined time period. In initiating or applying the amplitude suppression, the circuitry can be configured to multiply a difference between the amplitude of the audio signal and the first threshold by a predefined scaler. The first threshold can be between −25 and −45 decibels relative to full scale (dBFS). It should be understood that wider and narrower amplitude threshold ranges may be utilized.

In some implementations, in generating the first audio signal the circuitry can be configured to apply wide-band compression to the audio signal with reduced amplitudes of the one or more segments. Applying the wide-band compression includes reducing a dynamic range of the audio signal after reducing the amplitudes of the one or more segments. In applying the wide-band compression, the circuitry can be configured to detect, after reducing the amplitudes of the one or more segments, one or more second segments of the audio signal having amplitudes exceeding a second threshold and including frequency components within a predefined frequency band and reducing the dynamic range of audio signal within the one or more second segments. The circuitry can be configured to initiate amplitude suppression of the audio signal upon detecting that (i) an amplitude of the first audio signal exceeds the second threshold for a first predefined time period and that (ii) the audio signal includes at least one frequency component within the predefined frequency band during the first predefined time period, and turn off the amplitude suppression of the audio signal upon detecting that (i) the amplitude of the audio signal is below the second threshold for a second predefined time period or that (ii) the audio signal does not include frequency components with the predefined frequency band during the second predefined time period. In initiating or applying the amplitude suppression, the circuitry can be configured to multiply a difference between the amplitude of the audio signal and the second threshold by a predefined scalar. The second threshold can be between −25 and −10 decibels relative to full scale (dBFS). The predefined frequency band can be between about 100 Hz and about 2 KHz. It should be understood that wider and narrower amplitude threshold and frequency ranges may be utilized.

In some implementations, in applying multi-band compression to the first audio signal the circuitry can be configured to apply a first band-pass filter to the first audio signal to generate a first band-pass filtered audio signal, apply a second band-pass filter to the first audio signal to generate a second band-pass filtered audio signal such that the first band-pass filter and the second band-pass filter are associated with different frequency bands, detect one or more segments of the first band-pass filtered audio signal having amplitudes exceeding a second threshold, reduce a dynamic range of the one or more segments of the first band-pass filtered audio signal, detect one or more segments of the second band-pass filtered audio signal having amplitudes exceeding a third threshold, reduce a dynamic range of the one or more segments of the second band-pass filtered audio signal and generate the second audio signal using a sum or weighted sum of the first band-pass filtered audio signal and the second band-pass filtered audio signal. The circuitry can be configured to initiate amplitude suppression of the first band-pass filtered audio signal upon detecting that an amplitude of the first band-pass filtered audio signal exceeds the second threshold for a first predefined time period, turn off the amplitude suppression of the first band-pass filtered audio signal upon detecting that the amplitude of the first band-pass filtered audio signal is below the second threshold for a second predefined time period, initiate amplitude suppression of the second band-pass filtered audio signal upon detecting that an amplitude of the second band-pass filtered audio signal exceeds the third threshold for a third predefined time period and turn off the amplitude suppression of the second band-pass filtered audio signal upon detecting that the amplitude of the second band-pass filtered audio signal is below the third threshold for a fourth predefined time period. In initiating or applying the amplitude suppression of the first band-pass filtered audio signal, the circuitry can be configured to multiply a difference between the amplitude of the first band-pass filtered audio signal and the second threshold by a first predefined scalar and in initiating or applying the amplitude suppression of the second band-pass filtered audio signal, the circuitry can be configured to multiply a difference between the amplitude of the second band-pass filtered audio signal and the third threshold by a second predefined scalar. The second threshold can be between −35 and −25 decibels relative to full scale (dBFS) and the third threshold can be between −30 and −15 dBFS.

In some implementations, in reducing the dynamic range of the second audio signal the circuitry can be configured to reduce the dynamic range of the second audio signal within a predefined frequency range. In reducing the dynamic range of the second audio signal within the predefined frequency range, the circuitry can be configured to initiate amplitude suppression of the second audio signal upon detecting that (i) an amplitude of the second audio signal exceeds a second threshold for a first predefined time period and that (ii) the second audio signal includes at least one frequency component within the predefined frequency band during the first predefined time period, and turn off the amplitude suppression of the first band-pass filtered audio signal upon detecting that (i) the amplitude of the second audio signal is below the second threshold for a second predefined time period or that (ii) the second audio signal does not include frequency components with the predefined frequency band during the second predefined time period. The first threshold can be between −20 and −40 decibels relative to full scale (dBFS). The predefined frequency band can be between about 600 Hz and about 6 KHz. According to yet another aspect, a computer-readable medium can include computer code instructions stored thereon. The computer code instructions, when executed by one or more processors, cause the one or more processors to reduce amplitudes of one or more segments of an audio signal to generate a first audio signal, wherein the amplitudes of the one or more segments are determined to be below a first threshold, apply multi-band compression to the first audio signal to generate a second audio signal, wherein applying the multi-band compression includes reducing dynamic ranges of the first audio signal within multiple frequency bands, reduce a dynamic range of the second audio signal to generate a third audio signal and generate an output audio signal using a sum or a weighted sum of the second audio signal and the third audio signal; and transmit the output signal over one or more communication channels to a plurality of receivers, each receiver communicatively coupled to a corresponding output component.

According to yet another aspect, a method for providing enhanced audio experience can comprise generating, by the computer system, an enhanced-quality version of an audio signal; transmitting, by the computer system, the enhanced-quality version of the audio signal to a plurality of receivers via one or more communication channels; determining, by the computer system, one or more receivers of the plurality of receivers eligible to access the enhanced-quality version of the audio signal; and restricting, by the computer system, access of the enhanced-quality version of the audio signal to the one or more receivers eligible to access the enhanced-quality version of the audio signal.

According to yet another aspect, a system for providing enhanced audio experience can comprise circuitry including one or more processors and configured to generate an enhanced-quality version of an audio signal; transmit the enhanced-quality version of the audio signal to a plurality of receivers via one or more communication channels; determine one or more receivers of the plurality of receivers eligible to access the enhanced-quality version of the audio signal; and restrict access of the enhanced-quality version of the audio signal to the one or more receivers eligible to access the enhanced-quality version of the audio signal.

According to yet another aspect, a computer-readable medium can include computer code instructions stored thereon. The computer code instructions, when executed by one or more processors, cause the one or more processors to generate an enhanced-quality version of an audio signal; transmit the enhanced-quality version of the audio signal to a plurality of receivers via one or more communication channels; determine one or more receivers of the plurality of receivers eligible to access the enhanced-quality version of the audio signal; and restrict access of the enhanced-quality version of the audio signal to the one or more receivers eligible to access the enhanced-quality version of the audio signal.

BRIEF DESCRIPTION OF THE DRAWINGS

Illustrative embodiments of the present invention are described in detail below with reference to the attached drawing figures, which are incorporated by reference herein and wherein:

FIGS. 8A-8E depict example audio signal peaks that are processed by the parallel compression component or module, according to example embodiments described herein;

FIGS. 9A-9E are graphs depicting example audio signals at different audio signal processing stages of the hearing-assist system of FIG. 3A, according to example embodiments described herein;

FIG. 11 is a block diagram of a computer system that can be used to implement the venue sound system equipment, the hearing-assist system, the headset management computing system and/or any of the modules described in relation to FIGS. 3-8A and 10;

DETAILED DESCRIPTION OF THE DRAWINGS

Following below are more detailed descriptions of various concepts related to, and implementations of, methods, apparatuses, and systems for enhancing audio quality for patrons to improve hearing of speech and singing by performers (or recorded) in performance venues as well as hearing of other types of audio signals (e.g., music and/or added audio effects). The various concepts introduced above and described in greater detail below may be implemented in any of numerous ways as the described concepts are not limited to any particular manner of implementation. Examples of specific implementations and applications are provided primarily for illustrative purposes.

Figure 1:
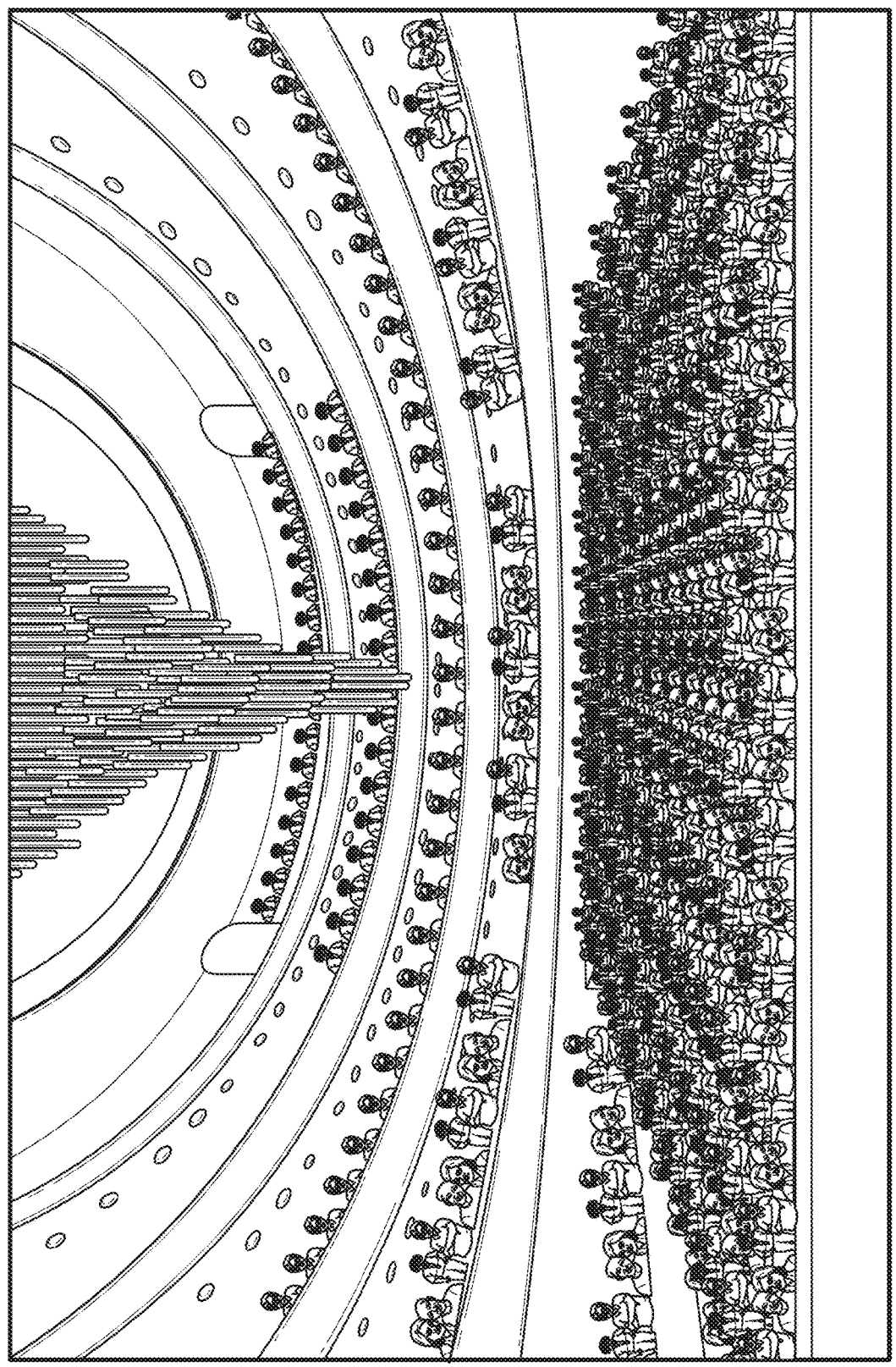
FIG. 1 is a photograph of an example performance venue, in this case, a multi-level theater auditorium, where a hearing-assist system and methods described herein can be deployed.

With regard to FIG. 1, an illustrative photograph of an example performance venue configured with a multi-level theater auditorium 100, where a hearing-assist system (also referred to herein as audio enhancement system) and methods described herein may be deployed is shown. The auditorium 100 is an example of how patrons sitting at different locations (e.g., lower level, upper level, close to stage, farther from stage, centered, side, etc.) within the auditorium may be able to hear words spoken or sung by a performer and/or other sounds differently within the auditorium 100. For example, a patron who is sitting close to the stage on the bottom level may be able to hear voices of the performers, music sounds or other types of sounds better than those sitting farther back on the bottom level. Similarly, patrons sitting in the second level may hear voices of the performers different from patrons sitting in the upper level. Such differences in hearing the voices of the performers are a result of natural acoustics of the auditorium 100, acoustics of a venue sound system within the auditorium, quality of microphones of the venue sound system for capturing voices of the performers, or combination thereof.

Moreover, in the multi-level theater auditorium 100 of the performance venue, patrons or spectators can be seated at significantly different distances and angles with respect to the stage and/or audio sources (e.g., loudspeakers) venue sound system. Also, the geometry of the auditorium 100 affects acoustics as sound waves reflect off walls and/or other internal structures of the auditorium 100, thereby resulting in echoes, reverberations, and/or other undesired sound effects. For example, the bass/mid-low frequencies can mask speech signals for at least a portion of the audience, thereby rendering the voice or speech signals to be "poor" or often inaudible. Bass signals are typically perceived by spectators through their ears and via body and/or bone conduction. Also, reverberation due to multiple reflection from surfaces of the auditorium 100 increases the bass energy, thereby causing an overall signal "smearing" and further loss of intelligibility. Eliminating or mitigating such "smearing" and optimizing or enhancing sound quality at various regions of the auditorium 100 is a challenge for sound production staff during performance programs.

As can be attested by patrons of most auditoriums, including the auditorium 100, there are "dead spots" within auditoriums in which voices and other sounds from performers are not well heard (e.g., at a natural sound node at which signals at one or more audio frequencies have lower magnitudes than at anti-nodes of those audio frequencies, where an anti-node may be as close as one seat over from the node). In addition to "dead spots," other factors may cause hearing voices of performers to be difficult for patrons, such as loud music, poor natural hearing of a patron, use of standard hearing aids, and so on. As such, there is a need for a hearing-assist system that improves hearing of voices of performers within auditoriums or performance venues, as further described herein.

Performance venues or venues can include auditoriums, amphitheaters, concert halls, jazz clubs, live houses, opera houses, night clubs, sports arenas, theaters, movie theaters, restaurants, public halls, comedy clubs, convention centers, classrooms, dwellings, airports, train stations, and/or bus stations, among other types of venues in which voice signals (e.g., speech or singing) to be broadcast or rendered by a sound system can be processed by the hearing-assist system (or audio enhancement system), such as shown in FIG. 2, to improve the sound quality perceived by individuals in the venue. Venues can include open-air venues, such as parks, sports stadiums or fields or other open spaces hosting sound programs. Performance programs or events or sound programs can include a live music concert, a play, a symphony orchestra concert, an opera concert, a choral music concert, a children's concert, a recitals concert, a DJ set, a movie, a comedy show, a lecture, a political rally, a sports game or event and/or audio signals (e.g., announcements and/or music) broadcast in airports, train stations, bus stations and/or other public places. Poor or degraded venue acoustics leads to a bad audio experience of the intended audience. For performance venues, an unsatisfied audience may eventually have a negative impact on ticket sales. For example, if the audience is made up of a large percentage of people who are older and have reduced hearing capabilities already, then that audience segment may tend to avoid attending the performance venue simply because of the difficulties in hearing or understanding words spoken or sung by the performers. Also, non-uniform sound quality across different zones of a performance venue may result in lower ticket prices for zones with relatively poor sound quality as such poor sound quality zones are often spread by word-of-mouth of audience members or patrons of the performance venue. For public places, bad audio quality can result in a segment of the intended audience missing important announcements, which leads to a degraded public service. For example, in venues for public transportation, passengers may end up missing their plane, train, or bus due to bad quality announcement audio.

In general, improving acoustics and sound quality in venues is a challenging technical problem to solve not only overall, but also for individual performance programs. In many venues, sound absorbing structures are used to mitigate reverberation, echoes, and/or any other undesired sound effects resulting from reflections of sound waves from internal surfaces of the performance venue. Sound absorbing structures often include acoustical ceiling tile, suspended baffles, acoustic partitions, and/or acoustic foam, among others. Seats and foam cushions affixed thereto also contribute to sound absorption. Even with sound absorbing structures in place, performance venue attendees may still not be able to understand speech by performers or have a good sound experience in some zones of the performance venue.

Hearing-assist systems and methods described herein, also referred to herein as audio enhancement systems and methods, allow for improving audio experience of patrons or intended audience in the performance venues and/or other types of venues by providing enhanced-quality audio channels or audio signals including voices (e.g., speech and singing) to individual patrons or audience members via audio receivers, e.g., with headsets connected thereto, irrespective of location with respect to audio source or seating location relative to the stage in performance venues. The systems and methods may include suppressing a noise floor and reducing the dynamic range of an audio signal including voice frequencies provided or fed by an existing venue sound system of the performance venue, where the hearing-assist system is configured to process signals output by the existing venue sound system. Reducing the dynamic range of the audio signals may include applying broadband compression, multi-band compression and/or parallel compression to the audio signal with a suppressed or reduced noise floor. The systems and methods may include transmitting or broadcasting the audio signal with reduced dynamic range over one or more wireless (or wired) channels to audio receivers (e.g., connected to headsets) being used by patrons or individuals in the venue. In an embodiment, a separate delay depending on the location of receiving audio set can be applied to each audio signal before transmission.

The systems and methods described herein are not to be limited to applications or uses specific to hearing-impaired individuals. In general, the systems and methods described herein can be used to enhance audio quality of audio signals for hearing-impaired individuals and/or individuals with normal hearing. Also, the systems and methods described herein can be applied to audio signals output by sound systems or to audio signals to be input to sound systems.

Typical sound systems of venues create sound mixes that usually have loud music/bass and sound effects that often overpower voice, especially when considering added pickup of bone conduction (i.e., sound conducted as subtle vibration along bones to the inner ear housing the organs of hearing and balance). Using the principles described herein, a patron using a receiving system is able to perform a custom mix of voice, music/bass, and sound effects. More specifically, a patron using the receiving system is able to perform the mix by simply adjusting the volume of the receiving system as signals communicated to the receiving system have processed the audio of a performance such that if the patron turns the volume higher, the volume of the voice(s) increases without significantly increasing the music/bass or sound effects. As a result, the patron may 'customize' the mix to improve hearing voice(s), as desired.

Moreover, a hearing-impaired patron (i.e., a patron with some level of natural hearing loss) may also vary the volume desired to hear a sound that is more properly balanced given the hearing-impaired patron's hearing loss. For example, a hearing-impaired patron who uses the receiving system may turn the volume significantly higher than a non-hearing-impaired patron who uses the receiving system simply to hear the voices better during a performance. In other words, both the hearing-impaired patron and the non-hearing-impaired patron may receive the same audio if sitting in a common distance from a stage, for example, but the hearing-impaired patron may elect a higher volume setting of the receiving system than the non-hearing impaired patron. Simply put, each patron, hearing-impaired and non-hearing-impaired, adjusts the volume of the receiving system to mix the voice(s) of the performers to meet the needs of the patron. In part such a patron-enabled mix control is possible because the headset admits ambient sound such that the mixing is a mix of voices to enhance dialog with the ambient sounds (i.e., voices, music/bass, and sound effects).

Figure 2A:
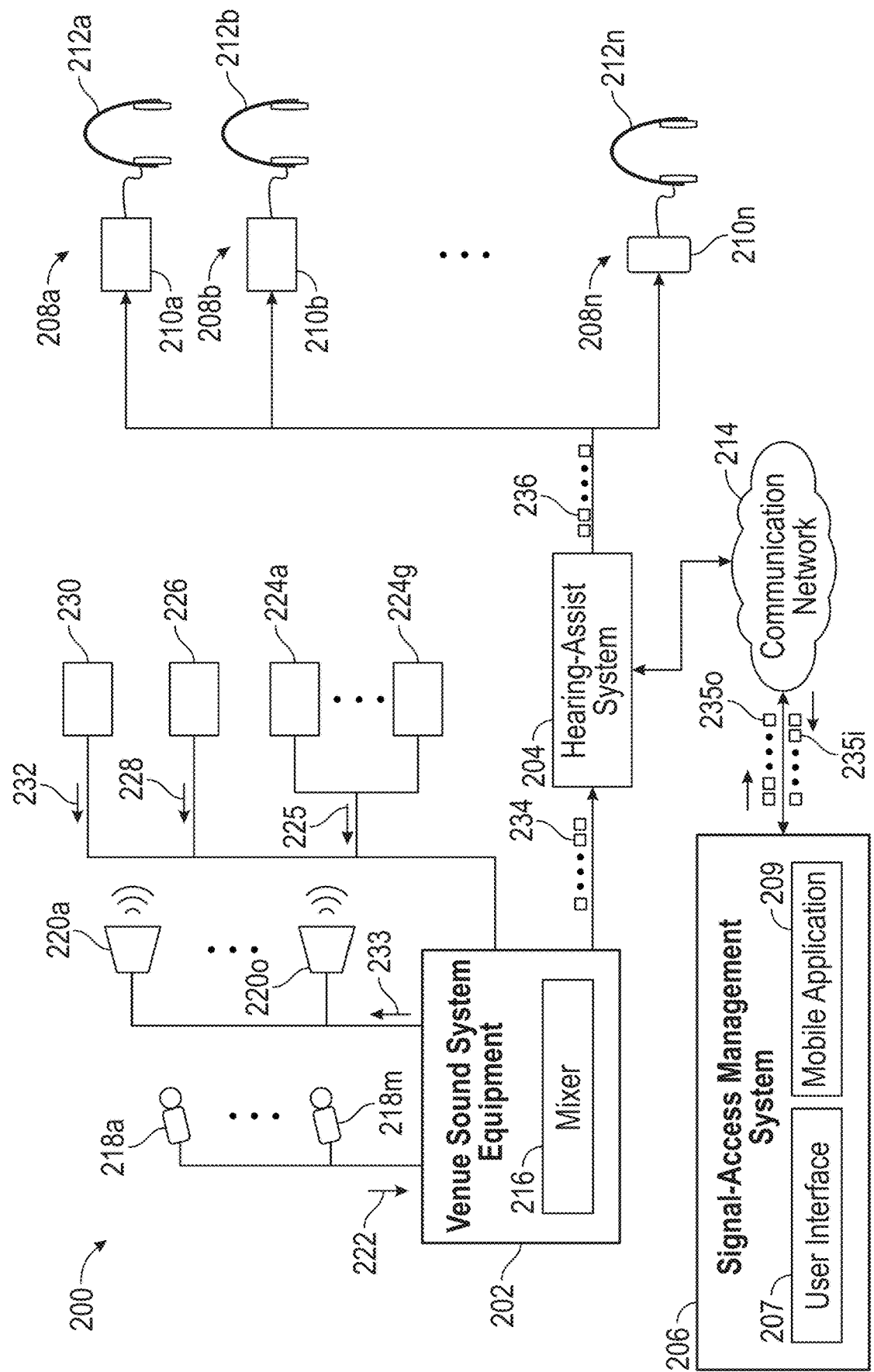
FIG. 2A is a block diagram of an illustrative venue sound system including venue sound system equipment and a hearing-assist system configured to improve user audio experience in a performance venue, according to example embodiments described herein.

Referring now to FIG. 2A, a block diagram of an illustrative overall venue sound system 200 configured to improve user audio experience in a venue is shown, according to example embodiments described herein. In brief overview, the overall venue sound system 200 may include venue sound system equipment 202, a hearing-assist system 204 (also referred to herein as audio enhancement system 204), a signal-access management system 206 communicatively coupled to the hearing-assist system 204, and multiple receiving systems 208a-208n (collectively 208) that are used by patrons or individuals who are using or have access to the audio signals provided by the hearing-assist system 204. In an alternative embodiment, the signal-access management system 206 may be integrated into the hearing-assist system 204 (e.g., software and/or hardware integrated therein). In an embodiment, the signal-access management system 206 may be in communication with the hearing-assist system 204 via a communications network 214, such as a local area network (LAN) or wide area network (WAN). The hearing-assist system 204 can be deployed or installed in a venue, such as performance venue 100, either during installation of the venue sound system 200 or as an add-on after the venue sound system 200 is installed.

The receiving systems 208 may include wireless or wired receivers 210a-210n (collectively 210) and respective headsets 212a-212n (collectively 212). The receivers 210 may be configured to receive wireless audio signals that are broadcast or communicated point-to-point from the hearing-assist system 204 utilizing one or more wireless communication technologies or protocols, such as Wi-Fi®, frequency modulation (FM) communication, amplitude modulation (AM) communication, T-loop, BLUETOOTH, Auracast™, any other wireless or wired communication protocols or technologies or a combination thereof. The headsets 212 may be wired or wireless and may be in communication with the respective receivers 210.

In some implementations, the receivers 210 can include mobile or handheld devices, such as, cellphones, tablets, personal digital assistants (PDAs), portable media players, smart watches, iPads, iPods, handheld computers, or the like. For example, the mobile or handheld devices can be equipped with FM receivers, WiFi receivers, BLUETOOTH receivers, Auracast™ receivers, telecoils and/or other signal reception technologies. The headphones or headsets 212 can be coupled, e.g., via wireless or wired connections, to the mobile or handled devices. In some implementations, the receivers 210 may be integrated into the headphones (or headsets) 212, e.g., if such an integration can be sufficiently lightweight so as to not be too bulky or heavy for the users thereof. In some implementations, the receivers 210 can be communication devices configured to receive communication signals over wired or wireless links. In some implementations, the receivers 210 can include hearing-aid receivers.

Headphones or headsets 212 are available in a wide variety of configurations, including over-the-ear, single ear, multi-ear, physically heavy, physically light, and other configurations. Over-the-ear headphones tend to block or reduce outside noises, which can be beneficial in certain settings, such as airplane travel, but over-the-ear headphones for live performances can (i) be uncomfortable to wear for a long duration of time, such as a few hours for a musical, and (ii) overly reduce or dampen desirable ambient auditorium sounds, such as music and audience reactions, that are part of the experience of live performances. Also, over-the-ear headphones can reduce or prevent verbal communication between patrons or individuals in the venue, thereby detracting from a shared experience of the patrons or individuals. By not being uncomfortably isolated from the environment by large over-ear headphones, the patrons or individuals can feel more the performance or audio environment around them and less stress, with more "brain power" to understand dialog and comfortably enjoy the various components of perceived audio signals (e.g., music and speech in performance audio signals). In performance venues, patrons can enjoy the performance and feel the environment or surrounding. It is to be noted that loud bass or lowpass signals distract the human brain and make it difficult for individuals to process speech in the audio signal or conversations with other individuals.

Figure 2B:
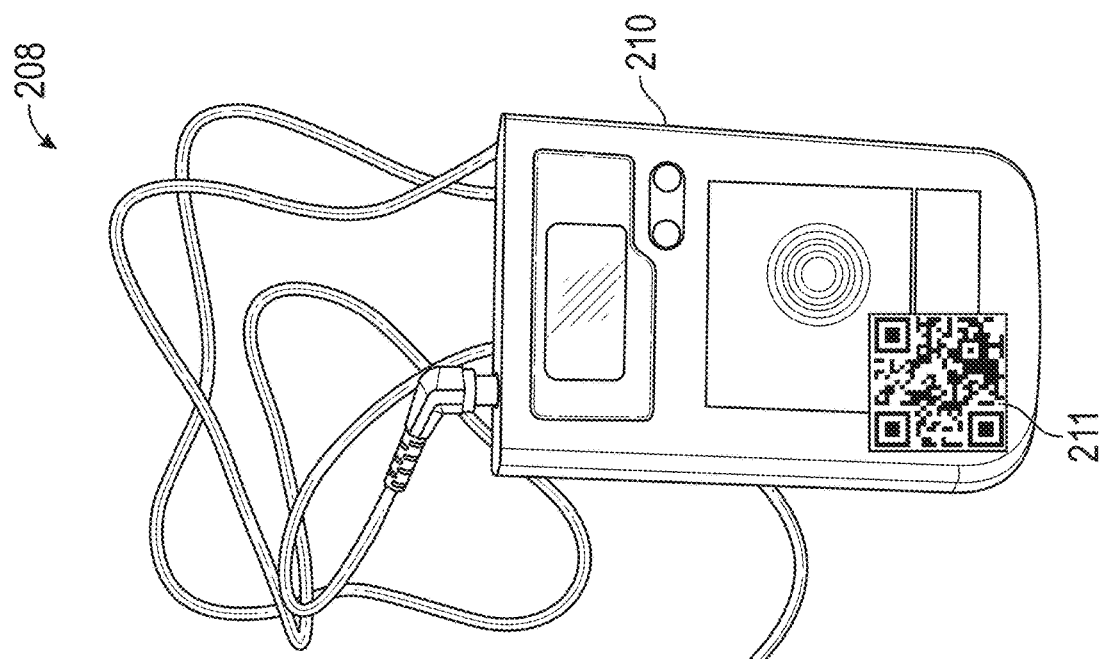
FIG. 2B is a picture of an illustrative headset used by users of the hearing-assist system, according to example embodiments described herein.

Rather than using physically heavy headphones or headphones with heavy ambient sound cancellation (e.g., over-the-ear headphones), light-weight headphones or headphones with light or partial ambient sound cancellation that are comfortable and allow for ambient sounds from the venue sound system equipment 202 to be heard in an attenuated form in addition to enhanced audio quality signals (e.g., provided by the hearing-assist system 204) may be utilized. In other words, the use of lightweight headphones that allows for ambient sound to be heard along with the enhanced verbal audio as processed and enhanced by the hearing assist system, as described herein. In an embodiment, and as shown in FIG. 2B, the headphones (or headset) 212 may (i) have foam covers 240 disposed on ear pieces 242 of the headphones 212 such that the foam covers 240 rest on a user's ears without extending into the ear canal, and (ii) have a flexible strap 244 that is able to be worn on a user or patron's head, hung below the patron's chin, or be positioned behind the patron's neck, thereby enabling patrons to wear the headphones 212 in comfortable position for him or herself. By being a headphone 212 with relatively light or partial cancellation/attenuation of ambient sound and that does not have ear pieces that enter an individual's ear canals, the individual is able to hear enhanced voice signals along with other suppressed sound signals (e.g., music) that may be, suppressed during processing and passed through the hearing-assist system 204 and communicated to the receiving system 208, while also enabling a user to hear ambient sounds or sounds output by the venue sound system equipment 202 via loudspeakers in the venue.

In some implementations, the foam in or defining the covers 240 can be selected or configured to have an attenuation or cancellation of ambient audio signals within a predefined range (e.g., generally between about 3 dB to 6 dB, but possibly outside that range for different types of shows). In some implementations, the headphones 212 can include headphones, e.g., including over-the-ear, earbuds, single ear, multi-ear, etc., with ambient control. For instance, a set of headphones 212 may include at least two modes of operations, e.g., with one mode providing full ambient sound cancellation and one or more other modes allowing the individual using the set of headphones to hear attenuated version(s) of the ambient sound. The headphones 212 may provide different attenuation levels of the ambient sound where the individual can adjust the ambient sound attenuation based on their preferences. The foam of the covers 240 may be formed by any conventional or unconventional material.

It is to be noted that using headphones 212 which allow at least an attenuated version of the ambient sound to be heard calls for "accurate" synchronization between the enhanced-quality (or processed) audio signal 236 and the audio signal 233 as output by the loudspeakers 220. In other words, the delay or time offset between the enhanced-quality (or processed) audio signal 236 and the ambient sound should be small enough to avoid perception of an echo signal by the individual(s) using the headphones 212. In general, with a delay that is less than or equal to about 80 milli seconds (ms), the two signals will be perceived as a single audio signal. Otherwise, a delay greater than 80 ms will cause the listener to hear two voices, which will decrease the intelligibility of any speech content in the audio signals and will degrade the audio quality, therefore degrading user experience and/or enjoyment of the performance event (e.g., in a performance venue). It is to be noted that the limit on acceptable delay may vary based on age, loudness of the ambient compared to the enhanced sound, gender, health conditions (e.g., hearing impairment). With headsets allowing hearing of ambient sounds, individuals or users are not deprived of feeling the atmosphere or environment around them and can still engage in conversations while enjoying enhanced audio experience. Isolating users or individuals from the audio atmosphere in a venue causes stress to the individuals and make them less likely to enjoy performance programs or audio experience in general. The stress may even reduce tolerance to time delay between the ambient sounds and the enhanced audio quality signal(s) 236. Using headsets that offer a moderate degree of attenuation of ambient sounds, echoes and/or reverberation is reduced, intelligibility of speech signals is increased and/or a feeling of the surrounding atmosphere is maintained, which leads to enhanced audio experience and enjoyment of performance events in performance venues.

The headphones 212 may be connected via a wire 246 or may be wirelessly connected via Bluetooth or other local wireless communications protocol. The headphones 212 may have alternative configurations, such as earPods, earbuds, smart headsets, or a combination thereof, among others, but provide the same or similar functionality as to enable the patron to hear the audio signals processed by the hearing-assist system 204 while also enabling ambient sound from the stage and venue sound system equipment 202 to be heard without too much attenuation by the headphones 212. If the headphones 212 are to be rented or otherwise shared amongst multiple patrons, having headphones 212 with earpieces 242 that avoid entry into the ear canal is more sanitary than if the headphones 212 were to enter the ear canal. In an embodiment, the foam covers 240 may be disposable and replaced after each use or be sanitized.

The venue sound system equipment 202 can include an audio mixing console 216 that is electrically connected or coupled to microphones 218a-218m (collectively 218) and loudspeakers 220a-220o (collectively 220). The mixing console 216 can receive input audio signals 222 from the microphones 218 and optionally electric or electronic instruments 224a-224g (collectively 224) configured to communicate music signals 225 therefrom, device(s) 226 storing recorded sounds 228, and/or other audio devices 230 configured to feed input audio signals 232 to the venue sound system 202. The audio mixing console 216 can mix the input audio signals 222, 225, 228, and/or 232 and perform equalization or other signal processing to produce an output audio signal 233, which may be analog and/or digital, that is fed to the loudspeaker(s) 220 for producing audible sounds in the performance venue (e.g., auditorium). An output audio signal 234, which may be the same or different from the output audio signal 233, may also be output to the hearing-assist system 204.

An operator of the venue sound system 200 can control processing of the input audio signals 222, 225, 228, and/or 232 using the mixing console 216. For example, the operator can balance the input audio signals 222, 225, 228, and/or 232, equalize and/or change the dynamics of the input audio signals 222, 225, 228, and/or 232, among others, to produce the output audio signals 233 that is desired for output by the loudspeakers 220. In some implementation, the venue sound system 200 can be a program audio system provided or managed by a performance program provider. It should be understood that the venue sound system 200 may be a permanent sound system for use in most performances or a temporary sound system that is installed for a particular performance, such as a concert of a band or Broadway play.

During a performance event or program, stage sound can be projected directly from a stage (and/or orchestra pit) and through the loudspeakers 220 of the venue sound system 200 that captures the stage sound using the microphones 218. The stage sound that is projected directly from the stage is not amplified, and can be heard by patrons, especially those located close to the stage. The stage sound is the sound component that would be heard or perceived by the venue patrons even if the venue sound system 200 were tuned OFF. In other words, the stage sound is the sound component that is neither processed nor amplified by the venue sound system equipment 202 and output by the loudspeakers 220 of the venue sound system 202, but is rather received directly by the patrons from the performers, for example. The sound can include speech, music, any kind of noise, or a combination thereof. Sound that is heard by patrons includes the stage sound and sound that is captured by the microphones 218, processed (e.g., equalized and amplified) by the venue sound system equipment 202, and output by the loudspeaker(s) 220. Of course, the sound that is output by the loudspeaker(s) 220 interacts with internal surfaces and structures of the performance venue as a function of the venue acoustics and is fed back, e.g., through the microphones 218, to the venue sound system equipment 202 to be reprocessed and output again via the loudspeaker(s) 220. This sound feedback loop, or feedback chain, degrade quality of the sound heard and/or perceived by the patrons at different locations or zones of the performance venue.

Each performance venue, or more generally each space, has its own "sound fingerprint" in terms of how structures in the performance venue affect the quality of a sound propagating therein. The "sound fingerprint" of a performance venue (e.g., auditorium) depends on the geometry (e.g., internal architecture) of the performance venue, structures within the performance venue, sound absorption characteristics of the internal surfaces and structures of the performance venue, and/or characteristics of the sound waves broadcast or propagating in the performance venue. In general, the effects on sound quality are dependent on the structure of the performance venue, crowd size, seating layout, as well as the performance program (e.g., music, speech, song, speaker(s), singer(s), etc.). This dependency together with the complexity of the performance venue acoustics as well as the dynamic nature and wide range of sounds that are created and played through the venue sound system equipment 202 during performances make the optimization of the sound quality at various zones or locations within the performance venue a very challenging technical problem to solve.

The hearing-assist system 204 (or audio enhancement system 204) can receive the audio signal output 234 by the venue sound system equipment 202 for further processing and transmission to the receiving systems 208 provided to patrons in the venue. The hearing-assist system 204 can receive the audio signal 234, digital and/or analog, that is output by the venue sound system equipment 202 and represent a mixture or combination of the input signals 222, 225, 228, and/or 232 fed to the venue sound system equipment 202 or can receive multiple audio signals from the venue sound system equipment 202. Functional blocks and the functions performed by the hearing-assist system 204 (or audio enhancement system 204) are described in further detail below.

At a high level, the hearing-assist system 204 (or audio enhancement system 204) can be configured reduce the dynamic range of the audio signal received from the venue sound system 202 and/or reduce noise to enhance speech intelligibility, e.g., of performers, and improve the sound quality perceived by individuals in the venue, e.g., patrons attending a performance program in a performance venue. Reducing the dynamic range and/or the noise in the audio signal 234 received from the venue sound system 202 can introduce undesired effects or distortions to the audio signals 234, which leads to sound quality degradation. The hearing-assist system 204 (or audio enhancement system 204) is configured to correct for or mitigate the effects of the introduced undesired distortions, such that the audio signals 236 that are communicated to the receiving systems 208 have voice signals that are clear for the audience members or patrons using the receiving systems 208.

The signal-access management system 206 can include a computer server, a desktop, a laptop, or a mobile device among others, and be configured with (or can provide) a user interface (UI) 207, such as a graphical user interface (GUI), and/or a mobile application 209 to enable a user or operator of the receiving systems 208 to register (e.g., pay for enhanced audio experience) and/or provision specific receiving systems 208 that are rented or otherwise deployed to patrons or individuals. The signal-access management system 206 can be communicatively coupled or connected to the hearing-assist system 204 (or audio enhancement system 204) directly or via the communication network 214. In some implementations, the hearing-assist system 204 (or audio enhancement system 204) can encrypt the audio signals 236 before sending or transmitting to the receiving systems 208, and the signal-access management system 206 can manage the distribution of decryption keys for (or access to decryption keys by) individuals or users. In some implementations, the signal-access management system 206 may provide other functionality, such as online purchase or order of tickets for future performances, food and/or drink, among others.

The signal-access management system 206 can execute an application or computer code instructions to adjust operating parameters of the hearing-assist system 204 (or audio enhancement system 204), e.g., based on the performance venue or the performance program, among others. For example, various modules or components of the hearing-assist system 204 (or audio enhancement system 204) may have adjustable operating parameters as discussed in further detail below. The signal-access management system 206 can determine, e.g., based on input from a respective operator and/or based predefined information about the venue and/or program, which sets of parameters to be implemented by the hearing-assist system 204 (or audio enhancement system 204). In some implementations, the signal-access management system 206 can send information or data to hearing-assist system 204 (or audio enhancement system 204) that enables communication of the audio signals 236 to the registered receiving systems 208. As shown, communications signals 235o may be communicated to the hearing-assist system 204 to cause the hearing-assist system 204 to send the audio signals 236 to the respective registered receiving systems 208. For example, the data signals 235o can include data or signals indicative of encryption keys to encrypt the audio signals 236, identifiers of communication channels (e.g., in the case of wired communication channels) over which to transmit the audio signals 236 and/or signal delays to be introduced in the audio signals 236 for various communication channels or receiving systems 208. The hearing-assist system 204 may communicate data signals 235i to the signal-access management system 206 to acknowledge receipt of the data signals 235o, confirm the operating parameters of the hearing-assist system 204 being used and/or report any detected errors or problems to be checked by an operator of the signal-access management system 206.

In some implementations, signal-access management system 206 may enable, e.g., via UI 207 and/or mobile application 208, the users and/or operators of registered receiving systems 208 to report any issues and/or provide feedback (e.g., with regard to the sound quality). In the case where the receiving systems 208 are rented to patrons or individuals in the venue, the signal-access management system 206 can track which of the devices is deployed and then returned for management purposes. The signal-access management system 206 may enable processing of payment or such payment processing may be performed using an alternative process (e.g., cash, credit card reader, etc.). In an embodiment, the signal-access management system 206 can control which patron channels or receiving systems 208 are turned ON or OFF, e.g., based on payment or subscription information. For instance, the signal-access management system 206 may enable only receiving systems 208 corresponding to patrons or individuals who paid or subscribed for the service to receive or render audio signals generated by the hearing-assist system 204 to access the audio signals 236. Rather than the signal-access management system 206 being independent of the hearing-assist system 204, the two systems 204 and 206 may be integrated with one another so as to perform both signal-access management and audio signal processing without having the communication network 214 disposed therebetween. In an embodiment, the receiving systems 208 may be configured to receive an access code and/or decryption keys from the signal-access management system 206 and/or the hearing-assist system 204 that, in response, enables the respective receiving systems 208 to be activated or to decrypt the audio signals 236.

By using the receiving systems 208 that output the audio signals 236 with increase signal-to-noise ratios, enhance speech signals of performers and reduce non-speech audio (e.g., bass music), a patron or individual can hear the audio signal output by the headset 212 and at the same time can hear, albeit at attenuated levels, the ambient sound(s), e.g., over-the-air sound(s) in the performance venue. A partial reduction of ambient sounds allows patrons or individuals in the venue to still enjoy the sound atmosphere or ambience in the performance venue, but with improved speech intelligibility of the performers because of the enhanced speech signals in the audio signals 236 received via the receiving systems 208. That is, although the headphones 212 slightly attenuate the level of the ambient sounds, the overall patron experience, e.g., compared to substantial or almost full noise cancellation, is enhanced because of the improved speech signals (e.g., clearer and louder compared to low-frequency signals) that are heard using the hearing-assist system 204. The audio signals 236 that are output by the receiving systems 208 allow for better speech intelligibility and more balance sound or audio components. Hearing a combination of both the audio output provided by the receiving systems 208 and a reduced version of the ambient sound(s) utilizing the principles described herein provides patrons or individuals with an audio experience that combines both higher quality sound together with the feeling or perception of the atmosphere in the venue. In some implementations, the receiving systems 208 can be configured to have an enhanced performance (e.g., increased gain, higher s/n ratio, etc.) with the frequency band associated with speech to further enhance the processed audio signals 236. The receiving systems 208 may include just a single volume control dial and may include additional dials, such as channel, timing, and/or other audio adjustment(s).

As previously described, the receiving systems 208 can be communicatively coupled to the hearing-assist system 204 via the communication network 214, frequency modulation (FM) radio communication, amplitude modulation (AM) radio communication, Bluetooth®, infrared communication technology, telecoil (or t-coil), or a combination thereof, among others. The communication network 214 can include a local area network, such as a communication channel Wi-Fi, among others.

Figure 3A:
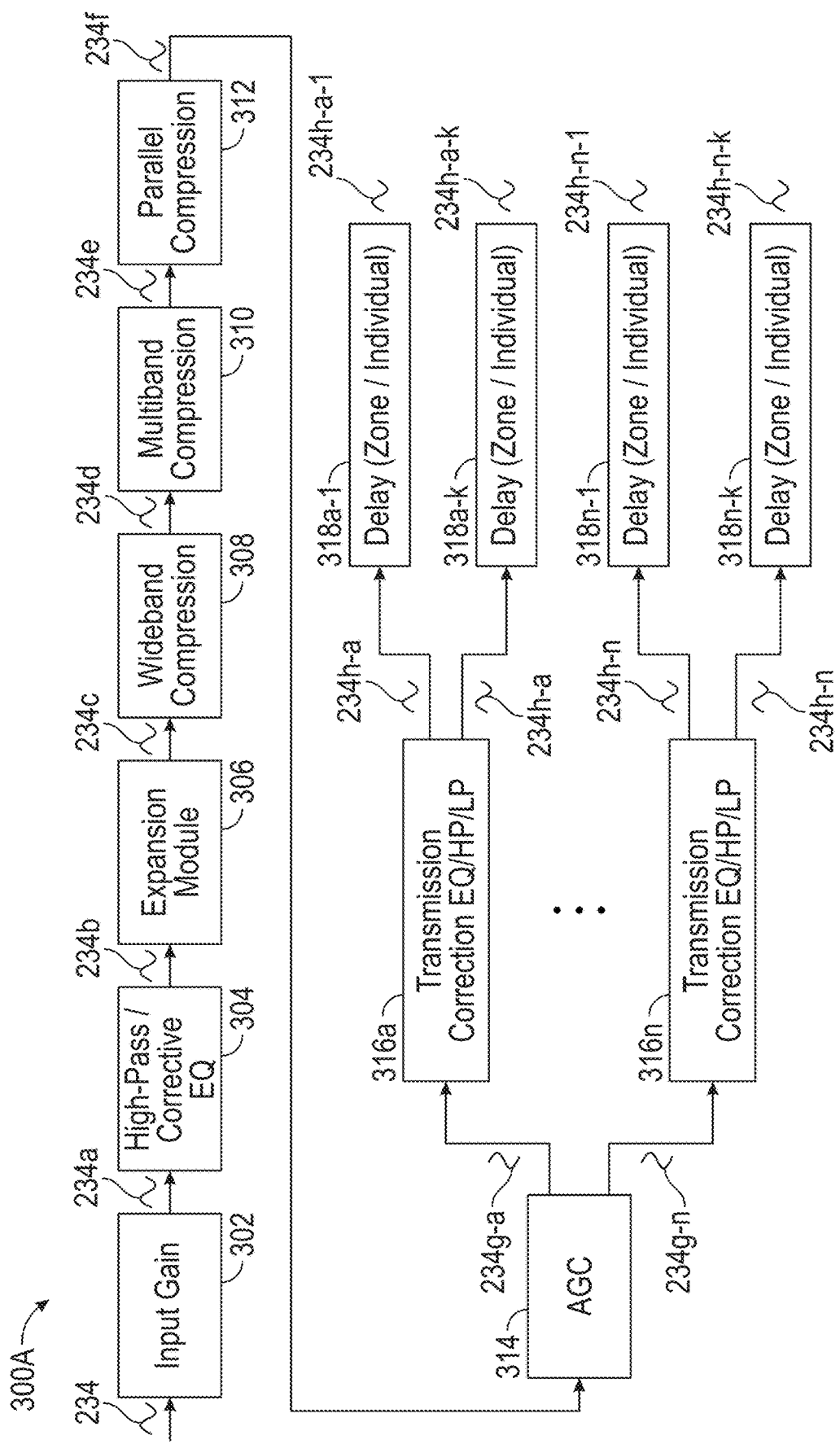
FIG. 3A is a block diagram of an illustrative hearing-assist system configured to improve audio quality of speech perceived by users in a performance venue, according to example embodiments described herein.

Referring now to FIG. 3A, a block diagram (or functional diagram) of the hearing-assist system 204 is shown, according to example embodiments described herein. In brief overview, the hearing-assist system 204 may include a number of components or modules to perform the functions described herein, including an input gain component or module (input gain stage) 302, a high-pass/corrective EQ component or module 304, an expansion module or component 306, a wide band compression component 308, a multi-band compression component 310, a parallel compression component 312, an adaptive gain control (AGC) component 314, multiple transmission correction components 316a-316n (collectively 316), and multiple delay components or modules 318a-1-318n-k (collectively 318). The components or modules of the hearing-assist system 204 can be implemented as hardware, firmware, software instructions or a combination thereof. For example, one or more components may be implemented as electrical or electronic circuits. One or more components of the hearing-assist system 204 may be implemented, either fully or partially, as software instructions that are executed by one or more processors to perform one or more corresponding functions. The processors may be any general or specific processors (e.g., digital signal processors (DSPs)) that improve signal processing speed and performance.

The input gain component 302 may be configured to apply a gain to the audio signal 234 received from the venue sound system equipment 202. In some implementations, the gain applied by the input gain component 302 can be a user-controlled gain or automated gain. For example, an operator of the venue sound system 202 can provide a desired audio level as input to the hearing-assist system 204 based on the desired audio level provided by the operator of the venue sound system equipment 202 to produce an audio signal 234a. The input gain component 302 can apply a fixed or dynamic gain to the input audio signal 234 so that the audio signal 234a has the desired level. In some implementations, the operator of the venue sound system equipment 202 can provide multiple audio levels, e.g., three audio levels associated with respective colors yellow, green and red, where yellow may represent quiet or low audio level, green may represent good or desired level, and red may represent loud or high level. The input gain component 302 may apply the gain to the input audio signal 234 so that the audio signal 234a has a green level. In an embodiment, an output audible volume may be set by an operator and the input gains component 302 may automatically adjust to accommodate other gain adjustments that result from other components of the hearing-assist system 204.

The audio signal 234a output by the input gain component 302 may be input to the high-pass/corrective equalizer (EQ) component 304. The component 304 can be viewed or implemented as a combination of a high-pass and a corrective EQ. The corrective EQ may be dependent on the performance venue and/or the performance program or event. For example, in some performance venues, the combination of both the high-pass filter and the corrective EQ may be used, while in some other performance venues, only the high-pass filter may be used. A high-pass filter tends to be used in all or a majority of cases because reduction of bass content allows for the hearing-assist system 204 to focus on the audio content that allows patrons to better understand speech of performers, which include dialogue and articulation thereof (i.e., parts of the signal that can get "muddied" by too much low frequency content). When used, the corrective EQ can be a parametric EQ with parameters that may be set per venue, event, and/or program type.

The high-pass filter of component 304 may be configured to significantly reduce or suppress audio signals below a predefined frequency. The predefined frequency can be equal to about 200 Hz plus or minus an octave. In some implementations, the predefined frequency can be between about 100 Hz and about 400 Hz. Most venues or rooms typically have substantial natural support at a corresponding frequency range defined as smaller than or equal to a corresponding predefined frequency (e.g., about 200 Hz or less), thereby leading to an excess of energy in that frequency range. In particular, sound from bass drum and/or bass strings is more likely to reverberate, and the operator of sound system equipment 202 may not realize how much bass is boosted due to operator's location in the venue and/or hearing damage the operator may be suffering from, e.g., if the operator has been doing such work for years. The frequency range can vary with the size, geometry, and/or other characteristics of the performance venue. The high-pass filter eliminates or suppresses audio signals within the low-frequency band (e.g., about 200 Hz or less). In some implementations, the high-pass filter or the corrective EQ may accentuate some of the higher frequencies depending on the venue and/or the performance program. In an embodiment, the component 304 may automatically set a frequency at which low frequencies are reduced (e.g., 3 dB level) based on energy content of low frequencies using a spectral analysis or otherwise.

The corrective EQ may be configured, based on the performance venue and/or the performance program, to adjust the audio signal level at different bands to define an overall mix at a listener's ears that is balanced. In particular, acoustic characteristics of the venue may include reverberations at some frequencies or frequency bands. The reverberations may result in a suppression of certain frequencies. The reverberations may be loud and long at some frequency ranges, e.g., 500 Hz-800 Hz, and may not be damped by acoustical treatments resulting in degraded sound quality. Given the anticipated effects of the venue acoustics, the venue sound system equipment 202 may accentuate or amplify the mixture or combination of the input signals 222, 225, 228, and/or 232 at suppression frequencies and/or may reduce the amplitude of mixture or combination of the input signals 222, 225, 228, and/or 232 at low frequencies. Since the audio signal 234 output by the venue sound system equipment 202 and fed to the hearing-assist system 204 is not broadcast over the air, the audio signal 234 is not affected by the venue acoustics. In an embodiment, the corrective EQ can be designed or configured, based on how the venue sound system equipment 202 is expected to compensate for the effects of the venue acoustics, to substantially reverse the compensation steps made by the venue sound system equipment 202. For example, if the venue sound system 202 is expected to suppress the mixture or combination of the input signals 222, 225, 228, and/or 232 at a first frequency range, the corrective EQ can be configured to amplify or accentuate the signal 234a at the same frequency range. Also, if the venue sound system equipment 202 is expected to accentuate or amplify the mixture or combination of the input signals 222, 225, 228, and/or 232 at a second frequency range, the corrective EQ can be configured to suppress the signal 234a at the same frequency range to produce the signal 234b with the signal amplification being substantially reversed.

Figure 4:
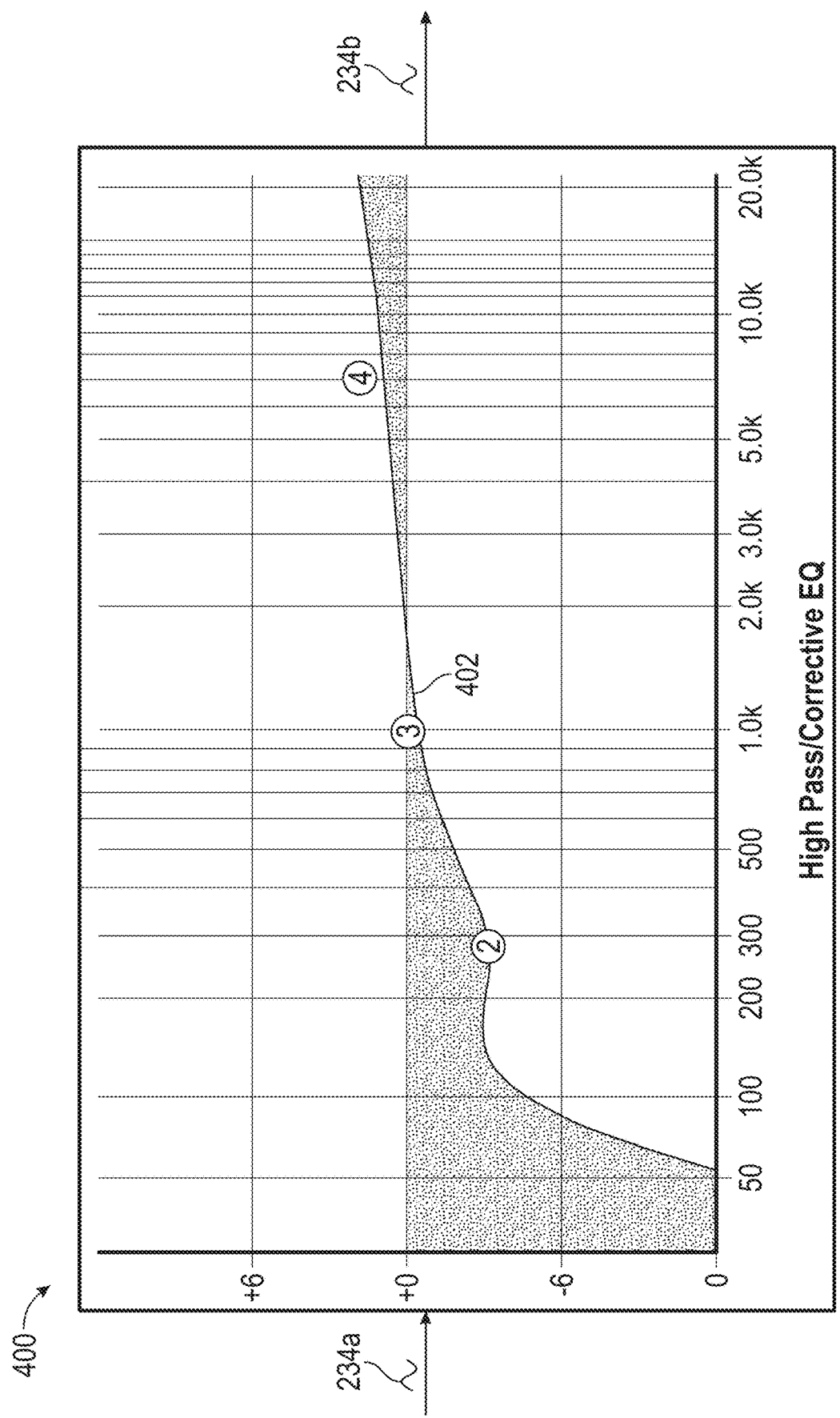
FIG. 4 is a block diagram illustrating an example implementation of a high-pass/corrective equalizer (EQ) component or module for altering audio signals, such as voice signals, according to example embodiments described herein.

Referring now to FIG. 4, an example high-pass/corrective EQ component 400 is shown, according to example embodiments herein. The high-pass/corrective EQ component 400 in FIG. 4 depicts an example transfer function 402 of the high-pass/corrective EQ component 400 in the frequency domain. According to the transfer function 402, the high-pass/corrective EQ component 400 suppresses signals at low frequencies at about 300 Hz by at least 3 dB or more. In an embodiment, the high-pass/corrective EQ component 400 further suppresses the audio signal 234a by at least 6 dB at frequencies less than about 80 Hz and suppresses the audio signal 234a by at least 12 dB at frequencies less than about 60 Hz. At frequencies greater than about 2 KHz (high frequencies for speech), the high-pass/corrective EQ component 400 may amplify the audio signal 234a to enhance speech intelligibility. The signal enhancement rate at high frequencies for speech can increase with increasing frequency. For instance, the amplification rate at around 20 KHz is higher than the amplification rate at 10 KHz and the latter is higher than the amplification rate at 3 KHz.

The transfer function 402 shown in FIG. 4 is provided as an illustrative example of a high-pass/corrective EQ transfer function. The knee and slope of the high-pass filter transfer function can vary over an octave range and between about 12 dB/octave and about 48 dB/octave. Electronics and/or signal processing software for processing the audio signal 234a may be utilized, as understood in the art. In particular, the transfer function 402 of the high-pass/corrective EQ component 304, 400 can vary along the frequency-axis (or x-axis) by plus or minus (+/−) 1 octave and/or can vary along the y-axis by +/−6 dB. The transfer function 402 of the high-pass/corrective EQ component 304, 400 may vary by a greater amount, especially for varying live content. In some implementations, the corrective EQ can be configured to linearize the spectral audio content of the audio signal 234a. The output audio signal 234b of the high-pass/corrective EQ component 304, 400 is fed as input to the expansion component or module 306. Electronics and/or software used to generate the transfer function 402 to process the audio signal 234a may have a variety of different configurations, and support adjustments to frequency points and/or gain/attenuation levels, for example.

Figure 5:
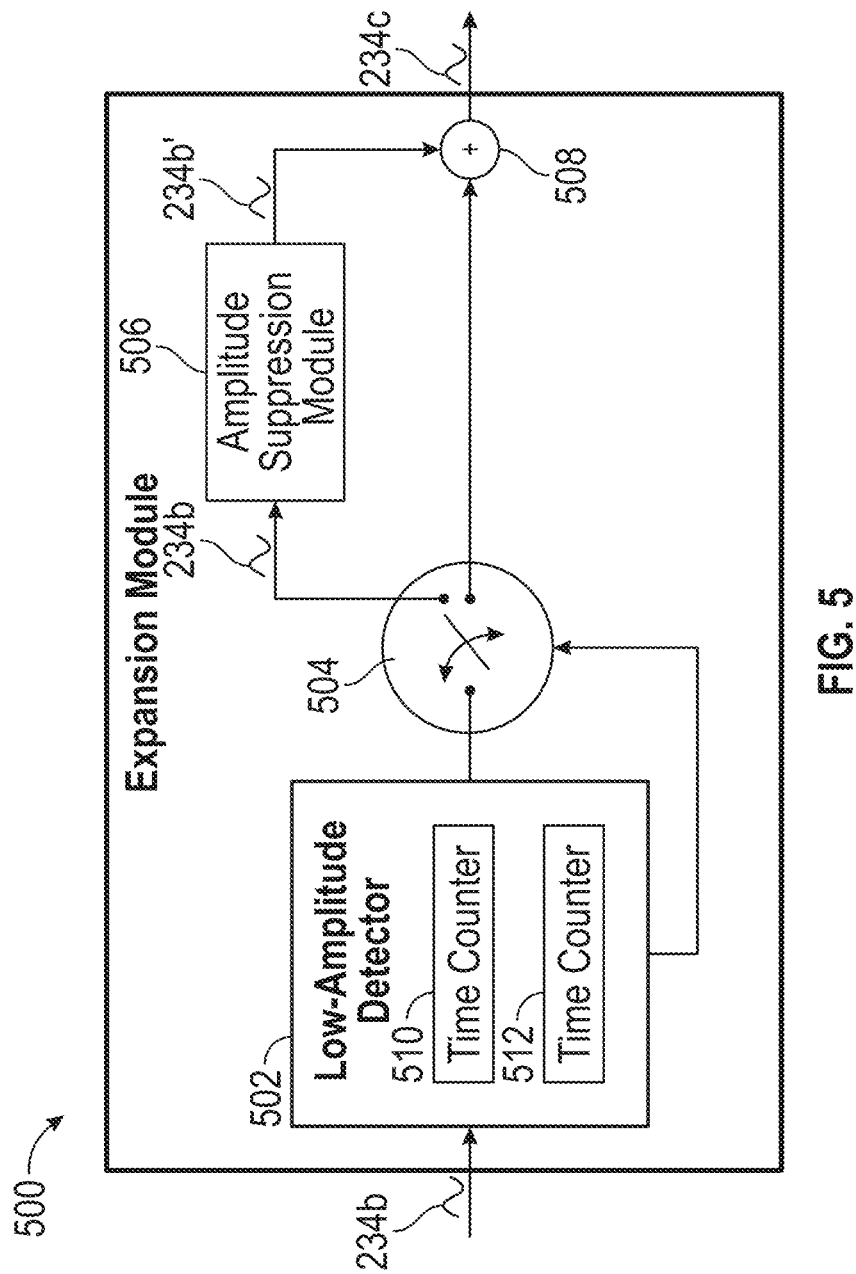
FIG. 5 is a block diagram illustrating an example implementation of an audio expansion component or module, according to example embodiments described herein.

FIG. 5 shows a block diagram of an expansion module 500, according to example embodiments herein. The expansion module 500 represents an example implementation of the expansion module 306 shown in FIG. 3A. At a high level, the expansion module 306, 500 is configured to reduce or suppress background noise floor and effectively increase or accentuate the difference or gap in amplitude between the loudest peaks and the quietest parts of the audio signal 234b. In a way, the expansion process performed by the expansion module 306, 500 can be viewed as having an opposite effect compared to compression because the expansion suppresses low-amplitude portions of the audio signal 234b and leads to a wider frequency range between the signal peaks and the noise floor. The expansion module 306, 500 can be configured to suppress or reduce amplitudes of portions of the audio signal 234b that are below a predefined threshold by some reduction rate (also referred to herein as expansion rate). Reducing the noise floor at this stage helps avoid or mitigate noise amplification in the following stages or components of the hearing-assist system 204, 300A and 300B. In a way, the expansion module 306, 500 can be configured to expand the amplitude range (e.g., in the logarithmic scale) of the audio signal 234b by reducing amplitudes of relatively quiet portions of the audio signal 234b. As a result, the amplitude range (in the logarithmic scale) of the audio signals 234b' and/or 234c is expected to be wider (at the lower end) than the amplitude range of the audio signal 234b.

The expansion module or component 500 can include a low-amplitude detector 502, a switch 504, an amplitude suppression module or component 506, and an accumulator 508. Each of the modules or components 502, 504, 506, or 508 can be implemented as hardware, firmware, software or a combination thereof using a variety of configurations. The low-amplitude detector 502 may be configured to detect portions of the audio signal 234b having amplitudes below the predefined amplitude threshold. The predefined amplitude threshold can be defined or specified in terms of decibels relative to full scale (dBFS). For example, the predefined threshold can be between about −25 and about −45 dBFS for live audio content. In some implementations, the predefined amplitude threshold can be defined as an amplitude value. It should be understood that alternative thresholds and parameters may be utilized.

The low-amplitude detector 502 can actuate or trigger the signal compression module 506 upon detecting a portion of the audio signal 234b that is below the predefined threshold. In particular, the low-signal detector 502 can trigger the switch 504 to direct the audio signal 234b to the amplitude suppression module 506 in response to detecting that the audio signal 234b is below the predefined threshold. The predefined amplitude threshold can be indicative of a noise floor. The low-amplitude detector 502 can deactivate the signal compression module 506 or trigger the switch 504 to direct the audio signal 234b to be output unmodified as audio signal 234c upon detecting that the audio signal 234b is above the predefined threshold. Activating the amplitude suppression module 506 (or directing the audio signal 234b to the amplitude suppression module 506) immediately in response to detecting that the audio signal 234b is below the predefined threshold can lead to distortions of impulsive transients, which are very common in audio signals. Specifically, immediate activation of the amplitude suppression module 506 leads to suppression of bottom portions (portions below the predefined threshold) of impulsive transients or peaks of the audio signal 234b that are not part of the noise of audio signal 234b. In some implementations, the low-amplitude detector 502 can activate (or trigger the switch 504 to direct the audio signal 234b to) the amplitude suppression module 506 in response to detecting that the audio signal 234b has been below the predefined threshold for a predefined time duration $\Delta t_1$. For example, the predefined time duration $\Delta t_1$ can be between about 10 and about 30 milli-seconds (ms) or may be set to some other value that avoids distortions of impulse transients.

In some implementations, the low-amplitude detector 502 can deactivate (or trigger the switch 504 back to direct the audio signal 234b away from) the amplitude suppression module 506 upon detecting that the audio signal 234b has exceeded the predefined threshold for another predefined time duration $\Delta t_2$ (e.g., between about 10 ms and about 30 ms). The low-amplitude detector 502 can include a first time counter 510 to keep track of the time during which the signal amplitude has been below the predefined threshold and a second time counter to keep track of the time duration during which the signal amplitude has been above the predefined threshold after rising above the threshold. The low-amplitude detector 502 can reset the time counter 510 in response to the corresponding time duration reaches or exceeds $\Delta t_1$ and/or can reset the time counter 512 in response to the corresponding time duration reaches or exceeds $\Delta t_2$. The amplitude suppression module 506 may suppress audio signals 234b according to an expansion rate. For instance, the amplitude suppression module 506 can suppress the low-amplitude portions of the audio signal 234b by a rate of about 4 to about 10 dB per dB below (or in difference with) the predefined threshold. For example, considering a predefined threshold of about −30 dBFS, a signal level of about −32 dBFS and an expansion ratio of about 5 dB per dB below (or in difference with) the threshold, the amplitude suppression module 506 can expand the signal level from about −2 dBFS to about −10 dBFS below the predefined threshold. As such, the signal suppression module 506 decreases the signal level from about −32 dBFS to about −40 dBFS. In some implementations, the amplitude suppression module 506 can employ other expansion rates. It should be understood that the predefined threshold may be a dynamic threshold that is automatically or semi-automatically adjusted based on various parameters, such as energy levels or signal levels over certain frequency levels. It is to be understood that while the expansion module 500 is configured is configured to reduce or suppress background noise floor or portions of the audio signal 234b with relatively low amplitudes, the amplitude suppression effectively increases or accentuates the difference or gap in amplitude between the loudest peaks and the quietest parts of the audio signal 234b, which translates in an expansion in the signal range in dBFS.

The accumulator 508 can be viewed or implemented as a switch similar to the switch 504. In other words, the expansion module or component 500 can output the audio signal 234b' output from the signal compression module 506 when the signal compression module 506 is activated, otherwise output the unmodified audio signal 234b output from the switch 504 when the amplitude suppression module 506 is deactivated. In general, the expansion module or component 306, 500 can suppress low-amplitude portions of the audio signal 234b by a suppression rate (or expansion rate). The activation and/or deactivation of the suppression of the low-amplitude portions of the audio signal 234b can be delayed by some time duration, as described hereinabove.

The expansion module 500 and the block diagram shown in FIG. 5 depict an illustrative implementation of the expansion module 306 shown in FIG. 3A. In general, the expansion module 306 is configured to suppress low-amplitude portions of an input signal. Other implementations of the expansion module 306 (e.g., other than the implementation described above in relation with FIG. 5) are also contemplated by the current disclosure.

Figure 6:
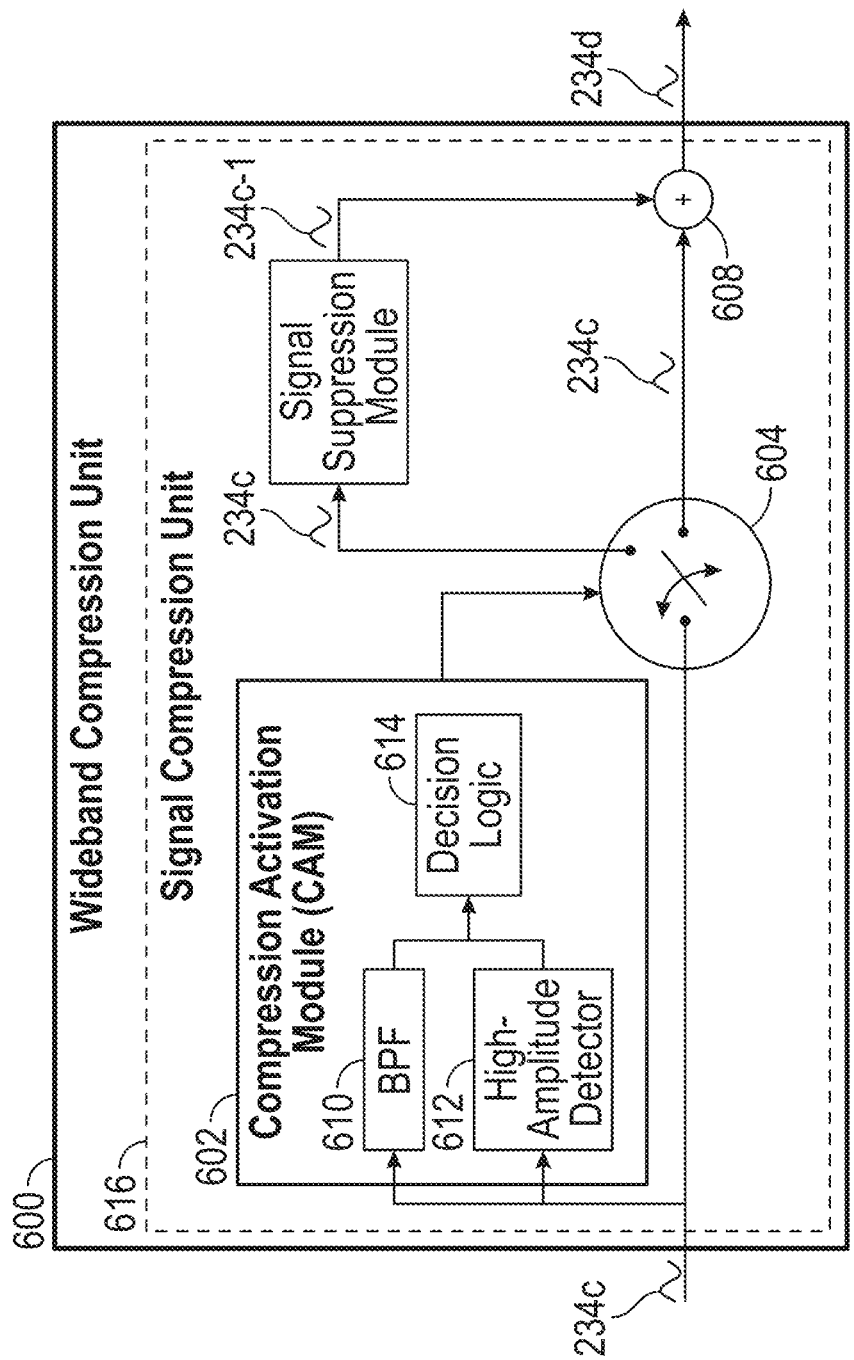
FIG. 6 is a block diagram illustrating an example implementation of a wideband (or broadband) compression component or module, according to example embodiments described herein.

FIG. 6 shows a block diagram of a wideband compression component or module 600, according to example embodiments herein. The wideband compression component or module (also referred to as broadband compression component or module) 600 represents an example implementation of the wideband (or broadband) compression component 308 shown in FIG. 3A. In general, the wideband compression module 308 or 600 can be configured to suppress signals or portions thereof with amplitudes above a predefined threshold while maintaining other portions that do not exceed the threshold unchanged. In some implementations, the wideband compression module 308 or 600 can be configured to suppress signals or portions thereof with amplitudes above the predefined threshold and having frequency components within a predefined frequency range while maintaining other portions unchanged. In some implementations, the wideband compression module 308 or 600 may not trigger or deactivate signal suppression immediately after detecting a signal amplitude exceeding the predefined threshold or, respectively, detecting that the signal amplitude falling below the predefined threshold. The wideband compression module 308 or 600 may trigger signal suppression upon detecting that the signal amplitude has been above the predefined threshold for a predefined time duration $\Delta t_3$ and/or may deactivate signal suppression upon detecting that the signal amplitude fell below the threshold for a time period $\Delta t_4$. For example, the time duration $\Delta t_3$ can be equal to 5 ms to about 10 ms. The time duration $\Delta t_4$ may be less than or equal to 100 ms. For example, the wideband compression module 308 or 600 may be configured to apply signal suppression for no more than about 100 ms after the audio signal 234c crosses below the threshold. For live content, the wideband compression module 308 or 600 may begin processing or suppressing signals or portions thereof that are above a predefined threshold of about −25 dBFS to about −10 dBFS with a compression rate (or suppression rate) of about 1.5 dB to about 3 dB per dB above the threshold. Other predefined time durations, threshold values, and/or other suppression rate values may be employed for live content or other types of audio content.

The wideband compression module 600 can include a compression activation module 602, a switch 604, a signal suppression module 606, and accumulator 608. The compression activation module 602 can include a bandpass filter 610, a high-amplitude detector and a decision logic 614. The compression activation module 602 can be configured to activate and deactivate signal compression, e.g., by directing the input signal 234c either to the signal suppression module 606 or directly to the accumulator 608. To direct the input signal 234c, the compression activation module 602 can be configured to control the switch 604 based on detected characteristics of the input audio signal 234c. The bandpass filter 610 can have a pass band between about 100 and about 2000 Hz and can be configured to detect whether segments of the input signal 234c include frequency components within the filter pass band. That is, the wideband compression module 600 can be configured to be sensitive to or apply signal suppression to segments of the audio signal 234c that include frequencies in the fundamental voice range, e.g., between about 100 and about 2000 Hz. While being configured to compress or suppress all frequencies (with amplitudes higher than the predefined threshold) when active, the wideband compression module 600 may not suppress peaks or portions of the audio signal 234c with amplitudes above the threshold that are below about 100 Hz or above about 2000 Hz without also having content in the frequency range between about 100 Hz and 2000 Hz. In other words, the bandpass filter 602 can be configured to detect whether segments or portions of the audio signal 234c include frequency components within the passband, and exclude signal portions outside the passband that fall within a peak or include relatively high amplitudes from being suppressed or compressed by the signal suppression module 606. The bandpass filter 610 can send or provide a signal to the decision logic 614 indicative of whether frequency components within the passband are detected. For example, the bandpass filter 610 can send or provide a filtered version of the audio signal 234c to the decision logic 614.

The peak detector 612 or high-amplitude detector 612 can be configured to detect signals or signal portions with amplitudes higher than a predefined threshold. In some implementations, the predefined threshold can be between about −25 dBFS and about −10 dBFS. The peak detector 612 or high-amplitude detector 612 can be configured to send indications of detected high amplitude signals to the decision logic 614. For instance, the high-amplitude detector 612 may send an indication (e.g., a binary indicator) to the decision logic 614 each time the audio signal 234c is detected to cross the predefined threshold. For example, the high-amplitude detector 612 can send a binary value "1" to the decision logic 614 when the audio signal 234c is detected to cross and exceed the predefined threshold and can send a binary value "0" to the decision logic 614 when the audio signal 234c is detected to cross and go below the predefined threshold.

The decision logic 614 can include or can maintain a first time counter and a second time counter, e.g., similar to time counters 510 and 512. The first time counter can keep track of the time duration during which the signal 234c exceeds and stays above the predefined threshold. For example, the decision logic 614 can trigger or start the first time counter upon receiving an indication (e.g., a binary value "1") from the high-amplitude detector 612 indicative of the audio signal 234c crossing and exceeding the predefined threshold. The second time counter can keep track of the time duration during which the signal 234c goes below and stays below the predefined threshold. For example, the decision logic 614 can trigger or start the second time counter upon receiving an indication (e.g., a binary value "0") from the high-amplitude detector 612 indicative of the audio signal 234c crossing and going below the predefined threshold when the signal suppression module 606 is already activated. The decision logic 614 can compare the time duration associated with the first time counter to a predefined time value $\Delta t_3$ and reset the first time to zero counter upon reaching or exceeding $\Delta t_3$, at which time the decision logic 614 may actuate (or cause the switch 604 to direct the signal 234c to) the signal suppression module 606 if frequency components within the passband of the bandpass filter 610 are detected within the signal segment or portion corresponding to the time period $\Delta t_3$. The decision logic 614 can reset the first time counter to zero upon receiving an indication from the high-amplitude detector 612 indicative of the audio signal 234c crossing and going below the predefined threshold before the first time counter reaching $\Delta t_3$.

The decision logic 614 can compare the time duration associated with the second time counter to a predefined time value (or time duration) $\Delta t_4$ and reset the second time counter to zero upon reaching or exceeding $\Delta t_4$, at which time the decision logic 614 can deactivate (or cause the switch 604 to direct the signal 234c away from) the signal suppression module 606. The decision logic 614 can activate and/or deactivate the signal suppression module 606 or control the switch 604 based on signals or indications from the bandpass filter 610 and the high-amplitude detector 612. The decision logic 614 can activate the signal suppression module 606, or direct via switch 604 the audio signal 234c to signal suppression module 606, upon determining that the audio signal 234c exceeded the predefined threshold for at least a time duration $\Delta t_3$ and the audio signal 234c included frequency components within the passband of bandpass filter 610 during that time duration. The decision logic 614 can deactivate the signal suppression module 606, or direct via switch 604 the audio signal 234c away from signal suppression module 606, upon determining that the audio signal 234c went below the predefined threshold for at least a time duration $\Delta t_4$ during which the signal suppression module 606 was activated. The signal 234c-1, when the signal suppression module 606 is activated, can represent a version of the signal 234c, where peaks or portions exceeding the predefined threshold and including frequency components within the passband are suppressed by a suppression rate, e.g., a compression (or suppression) rate of 1.5 to 3 dB for every single dB above the predefined threshold. When the signal suppression module 606 is not activated, or the switch 604 is directing the audio signal away from the signal suppression module 606, the output signal 234c-1 can be equal or substantially equal to zero.

The accumulator 608 can sum the output signal 234c-1 of the signal suppression module 606 and the output signal of the switch 604 directed to the accumulator 608. In some implementations, the accumulator 608 can be implemented as a switch that is synchronized with switch 604. The output signal 234d can be viewed as the signal 234c with peaks or portions (i) exceeding the predefined threshold (e.g., between about −25 dBFS and about −10 dBFS) and (ii) having frequency components within the frequency band between about 100 Hz to about 2000 Hz being suppressed by a compression/suppression rate, e.g., defined per dB beyond (or in difference with) the predefined threshold.

For live music, limiting the peak (or high-amplitude signal) suppression to signal segments or portions having frequency components within the frequency band between about 100 Hz to about 2000 Hz allows low frequencies below about 100 Hz (e.g., kick drum, bass guitar, etc.) and high frequencies above about 2000 Hz (e.g., whistles, chimes, etc.) to pass without undue distortion. With live content that has a vocal-heavy mix, the wideband compression module 600 also allows music between vocal phrases to pass without audibly-significant compression, which preserves a "natural" listening experience.

The signal compression unit 616 can be viewed as representing the combination of the compression activation module (CAM) 602, the switch 604, the signal suppression module 606 and the accumulator 608 (or alternatively a corresponding switch). From a functional perspective, the signal compression unit 616 can detect signal portions (in the time domain) to be suppressed and suppress the detected portions according to a suppression rate (or compression rate). In other words, the signal compression unit 616 can receive an input signal (e.g., signal 234c) and output a corresponding output signal where portions of the input signal exceeding the predefined threshold and including frequency components within a predefined passband are suppressed (e.g., subject to the time delays $\Delta t_3$ and $\Delta t_4$).

Figure 3B:
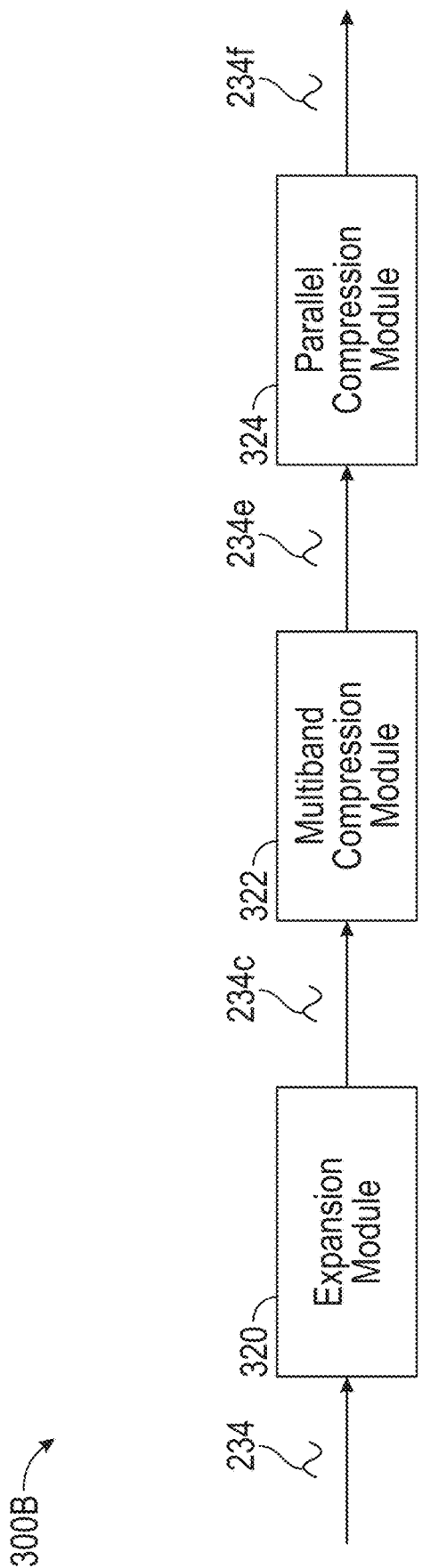
FIG. 3B is a block diagram of another hearing-assist system configured to improve audio quality of audio signals, according to example embodiments described herein.

The wideband compression module 600 and the corresponding block diagram represent an illustrative implementation of the wideband compression module 308 (FIG. 3). However, other implementations are also contemplated by the current disclosure. In general, any implementation whether in hardware, firmware, software or a combination thereof leading to suppression (e.g., subject to activation and deactivation delays $\Delta t_3$ and $\Delta t_4$) of signal portions within the passband and exceeding the predefined threshold is contemplated by the current disclosure. The activation/deactivation delays $\Delta t_3$ and/or $\Delta t_4$ may be static or dynamic based on a member of factors, such as music tempo, speech tempo, or other factors.

Figure 7:
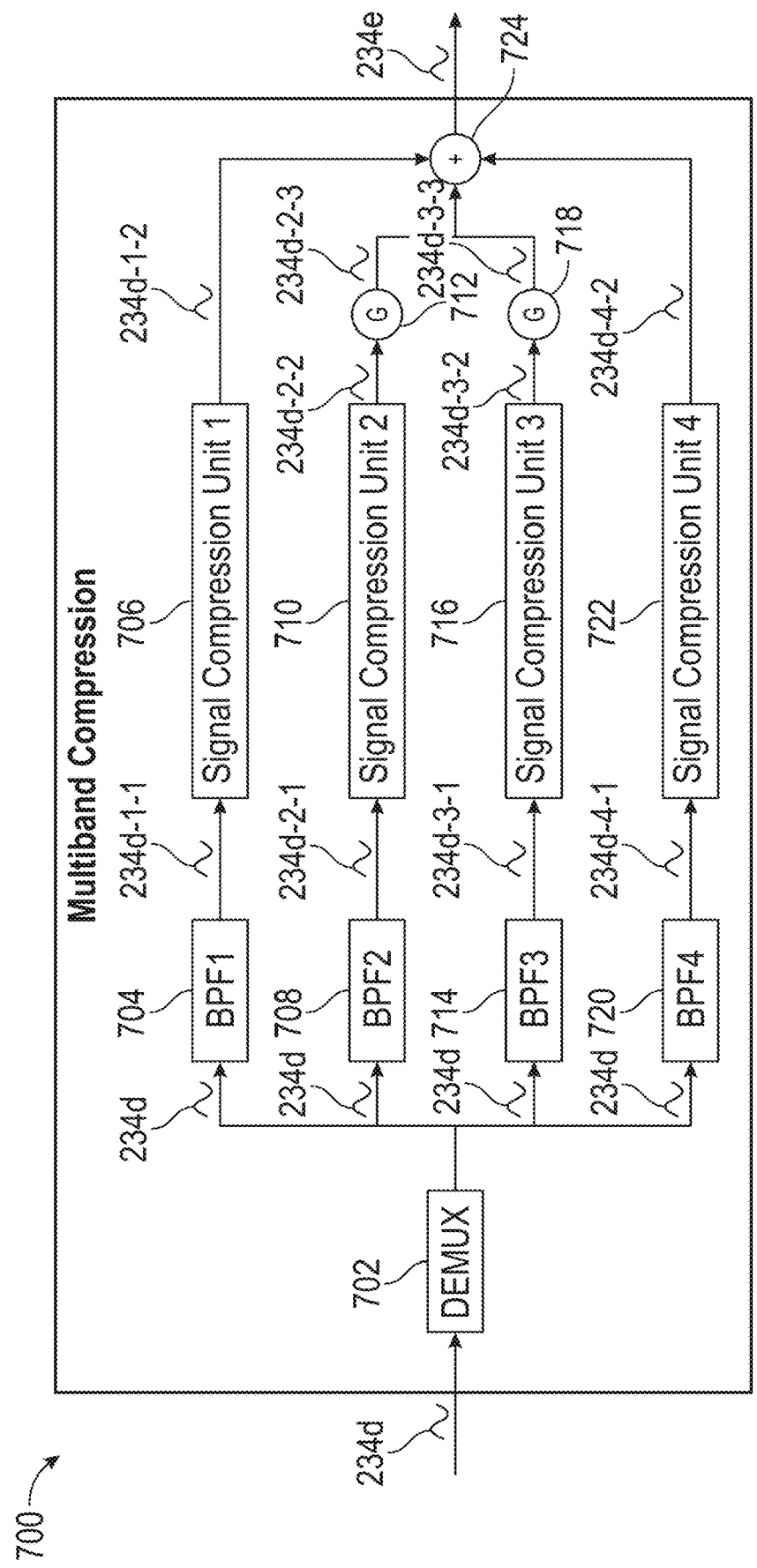
FIG. 7 is a block diagram illustrating an example implementation of a multi-band compression component or module, according to example embodiments described herein.

FIG. 7 shows a block diagram of a multi-band compression component or module 700, according to example embodiments herein. The multi-band compression module 700 represents an example implementation of the multi-band compression module 310 shown in FIG. 3A. In general, the multi-band compression module 310 or 700 can be configured to apply signal compression (or signal suppression) at different frequency bands where the applied signal suppressions may vary per frequency band. In other words, the multi-band compression module 310 or 700 can be configured to apply frequency band specific signal compression or suppression. The multiband compression module 310 or 700 can independently process, or apply signal compression, to the signal 234d across multiple frequency bands, e.g., n frequency bands, where n is an integer greater than or equal to 2. For instance, the multiband compression module 310 or 700 can have separate signal compression parameters (e.g., threshold, compression rate, suppression activation delay and/or suppression deactivation delay) for each frequency band. The multiband compression module 310 or 700 may apply separate signal gain at each of one or more frequency bands. In contrast to the broadband (or wideband) compression module 308 or 600, the multiband compression module 310 or 700 allows for frequency band specific adjustment or reduction of the signal (or amplitude) range before summing the narrow signals into a broadband signal.

The multiband compression module 700 can include a demultiplexer 702 configured to direct the signal 234d to four processing channels associated with four distinct frequency bands. The first processing channel can include a first bandpass filter 704 and a signal suppression unit 706. The second processing channel can include a second bandpass filter 708, a signal suppression unit 710 and a gain unit 712. The third processing channel can include a third bandpass filter 714, a signal suppression unit 716 and a gain unit 718. The fourth processing channel can include a fourth bandpass filter 720 and a signal suppression unit 722. The multiband compression module 700 can include an accumulator 724 to sum the output signals of the processing channels to generate the output signal 234e. While FIG. 7 shows four processing channels, the multiband compression module 700 may include any number of processing channels. Each of the signal suppression units 706, 710, 716 and 722 can be functionally and/or structurally similar to the signal suppression unit 614 in FIG. 6, while possibly having different parameters. For instance, each of the signal suppression units 706, 710, 716 and 722 can include a separate compression activation module and a separate signal suppression module. However, the compression activation module in each of the signal suppression units 706, 710, 716 and 722 may not include a bandpass filter. In other words, the activation/deactivation of the corresponding signal suppression module can be based on peak detection (or high-amplitude detection) and corresponding delay parameters. In other words, each of the signal suppression units 706, 710, 716, and 722 can include a corresponding peak detector to detect signal portions exceeding a corresponding threshold, a corresponding decision logic to determine based on peak (or high-amplitude) detection when to activate or deactivate, a signal suppression module to suppress the amplitudes of the detected signal portions by a corresponding compression rate and a corresponding decision logic to determine based on peak (or high-amplitude) detection when to activate or deactivate the corresponding signal suppression module. Each of the signal suppression units 706, 710, 716, and 722 or corresponding decision logics may include corresponding time counters similar to the time counters 510 and 512 of FIG. 5.

The first bandpass filter 704 may have a frequency passband of 10 Hz (+/−1 octave) to 200 Hz (+/−1 octave). The first signal suppression unit 706 may have a corresponding threshold between about −20 dBFS and −35 dBFS above which signal suppression is applied. The first signal suppression unit 706 may have a compression rate between about 1.5 dB per dB and about 2.25 dB per dB above (or in difference with) the threshold. The signal 234d-1-1 can represent a filtered version of the input signal 234d and the signal 234d-1-2 can represent a suppressed version (e.g., with a reduced dynamic range) of the signal 234d-1-1. The first signal suppression unit 706 may be configured to activate signal suppression after detecting that the input signal 234d exceeds the threshold for a first time duration $\Delta t_1$ and deactivate signal suppression after detecting that the input signal 234d goes below the threshold for a second time duration $\Delta t_2$ (when signal suppression is already activated), where $\Delta t_1$ may be between about 15 ms to about 30 ms and $\Delta t_2$ may be between about 60 ms to about 200 ms. In some implementations, the first bandpass filter 704 may be replaced with a lowpass filter, e.g., having a cutoff frequency of 200 Hz +/−1 octave. The first processing channel may have a target compression of less than or equal to 3 dB.

The second bandpass filter 708 may have a frequency passband of 200 Hz (+/−1 octave) to 1000 Hz (+/−1 octave). The second signal suppression unit 710 may have a corresponding threshold between about −15 dBFS and −30 dBFS above which signal suppression is applied. The second signal suppression unit 710 may have a compression rate between about 1.5 dB per dB and about 3 dB per dB above (or in difference with) the threshold. The signal 234d-2-1 can represent a filtered version of the input signal 234d and the signal 234d-2-2 can represent a suppressed version (e.g., with a reduced dynamic range) of the signal 234d-2-1. The second signal suppression unit 710 may be configured to activate signal suppression after detecting that the input signal 234d exceeds the threshold for a first time duration $\Delta t_1$ and deactivate signal suppression after detecting that the input signal 234d goes below the threshold for a second time duration $\Delta t_2$, where $\Delta t_1$ may be between about 10 ms and about 25 ms and $\Delta t_2$ may be between about 60 ms and about 200 ms. The gain unit 712 can be configured to amplify the signal 234d-2-2 and provide the signal 234d-2-2 with a gain increase by 5 dB to 8 dB. The second processing channel may have a target compression of less than or equal to 6 dB.

The third bandpass filter 714 may have a frequency passband of 1000 Hz (+/−1 octave) to 5000 Hz (+/−1 octave). The third signal suppression unit 716 may have a corresponding threshold between about −15 dBFS and −30 dBFS above which signal suppression is applied. The third signal suppression unit 716 may have a compression rate between about 1.3 dB per dB and about 2.5 dB per dB above (or in difference with) the threshold. The signal 234d-3-1 can represent a filtered version of the input signal 234d and the signal 234d-3-2 can represent a suppressed version (e.g., with a reduced dynamic range) of the signal 234d-3-1. The third signal suppression unit 716 may be configured to activate signal suppression after detecting that the input signal 234d exceeds the threshold for a first time duration $\Delta t_1$ and deactivate signal suppression after detecting that the input signal 234d goes below the threshold for a second time duration $\Delta t_2$, where $\Delta t_1$ may be between about 10 ms and about 25 ms and $\Delta t_2$ may be between about 60 ms and about 200 ms The gain unit 718 can be configured to amplify the signal 234d-3-2 and provide the signal 234d-3-3 with a gain increase by about 5 dB to 8 dB. The third processing channel may have a target compression of less than or equal to 6 dB.

The fourth bandpass filter 720 may have a frequency passband of 5000 Hz (+/−1 octave) to the Nyquist frequency (+/−1 octave). The fourth signal suppression unit 722 may have a corresponding threshold between about −20 dBFS and −35 dBFS above which signal suppression is applied. The fourth signal suppression unit 722 may have a compression rate between about 1.1 dB per dB and about 2.3 dB per dB above (or in difference with) the threshold. The signal 234d-4-1 can represent a filtered version of the input signal 234d, and the signal 234d-4-2 can represent a suppressed version (e.g., with a reduced dynamic range) of the signal 234d-4-1. The fourth signal suppression unit 722 may be configured to activate signal suppression after detecting that the input signal 234d exceeds the threshold for a first time duration $\Delta t_1$ and deactivate signal suppression after detecting that the input signal 234d goes below the threshold for a second time duration $\Delta t_2$, where $\Delta t_1$ may be between about 5 ms and about 15 ms and $\Delta t_2$ may be between about 60 ms and about 150 ms The fourth processing channel may have a target compression of less than (or equal to) about 1 dB.

It is to be noted that the above parameters values, and/or configuration of the multiband compression module 700 are provided for illustration and other parameters and/or configuration may be employed. For example, the configuration and/or parameters of the multiband compression module 700 may vary based on the venue, program or performance, characteristics of audio signal, and/or other factors. In general, the multiband compression module 310 or 700 can be configured to reduce the signal dynamic range (e.g., signal amplitude range) per frequency band. Higher signal compression can be applied in the middle frequency bands corresponding to or including the speech frequency band.

Moreover, and to summarize, the signal 234d is divided into multiple paths such that each of the paths have compression of different bandwidths or frequency ranges (i.e., multiband compression). Gain correction may also be performed over each of the respective frequency ranges, but primarily in the mid and high frequency ranges. By performing the multiband compression and gain correction, the overall level of those signals may be increased. The respective signals may thereafter be shaped so as to accentuate the mid and high frequency ranges more than the low frequency range so that voice signals of the performers are increased so that the words spoken or sung by performers are more easily heard by the patrons using the system.

Figure 8A:
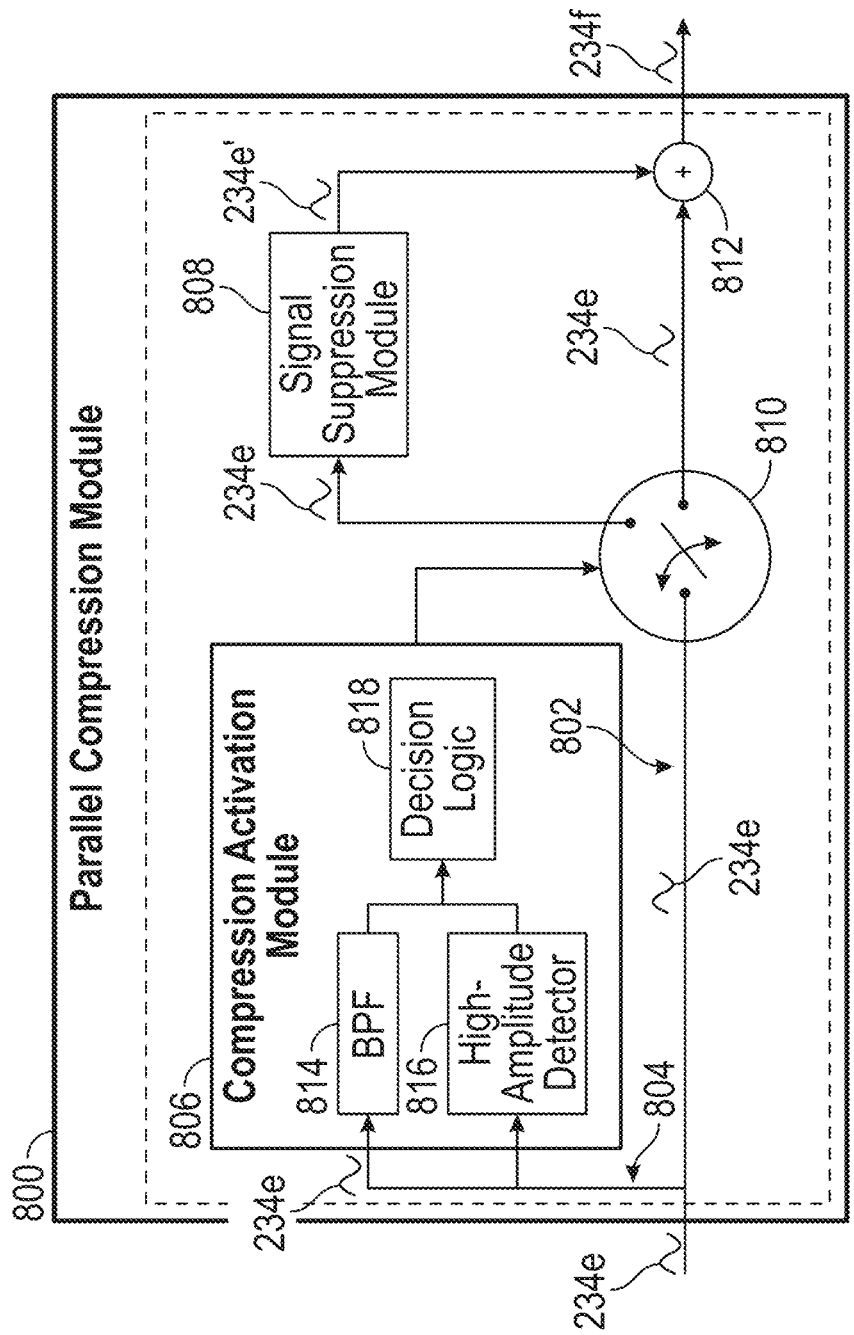
FIG. 8A is a block diagram illustrating an example implementation of a parallel compression component or module, according to example embodiments described herein.

FIG. 8A shows a block diagram of a parallel compression component or module 800, according to example embodiments herein. The parallel compression component or module 800 represents an example implementation of the parallel compression component 312 shown in FIG. 3A. In general, the parallel compression module 312 or 800 can be configured to further reduce the dynamic range of the audio signal by further suppressing peaks or signal portions with relatively high amplitudes. The reduction of the dynamic range would bring the range of the speech components in the audio signal closer to the range of the music components therefore enhancing the perception of speech by patrons. The parallel compression component or module 800 can be configured to generate a compressed version 234e' of the audio signal 234e and provide a sum of the audio signal 234e and the compressed signal 234e' as output.

The parallel compression module 800 can include two processing paths 802 and 804. Along the processing path 802, the input signal 234e can be kept unmodified while the processing path 804 can be configured to apply signal compression to the input signal 234e and generate a corresponding compressed signal 234e'. For instance, the processing path 804 can include a compression activation module 806, a signal suppression module 808, a switch 810 and an accumulator 812. The compression activation module 806, e.g., similar to CAM 602 of FIG. 6, can include a bandpass filter 814, a high-amplitude detector 816 (or peak detector 816) and a decision logic 818. The compression activation module 806 can be configured to operate similar to the compression activation module 602 according to similar or different parameter values (e.g., passband, Δts, compression rate). The compression activation module 806 can be configured to detect signals or portions thereof exceeding a corresponding amplitude threshold and having frequency components within the passband of the bandpass filter 814. In particular, the bandpass filter 814 can be configured to detect whether the audio signal 234e or segments thereof include frequency components within a passband of the bandpass filter 814 and the high-amplitude detector 816 can be configured to detect whether the audio signal 234e or segments thereof have amplitudes exceeding a corresponding predefined threshold. The decision logic 816 can determine when to activate or deactivate the signal suppression (e.g., activating signal suppression module 808 or actuating switch 810) based on signals and/or indications from the bandpass filter 814 and the high-amplitude detector 816.

In some implementations, the bandpass filter 814 can have a passband frequency range of 600 Hz +/−1 octave to 6000 Hz +/−1 octave. Other frequency ranges may be used, e.g., depending on the venue, program, characteristics or nature of audio signal and/or other factors. With regard to the peak detector 816, the amplitude threshold can be between about −20 dBFS and about −40 dBFS. The decision logic 818 can be configured to actuate the signal suppression module 808 responsive to detecting that a portion (e.g., of a predefined duration) of the input signal 234e exceeds the amplitude threshold and that the portion of the of the input signal 234e include frequency components within the passband of the bandpass filter 814. Once the signal suppression is activated, the decision logic 818 can be configured to deactivate the signal suppression module 808 (or direct the audio signal 234e away from the signal suppression module 808) responsive to detecting that the input signal 234e falls below the threshold and/or does not include frequency components within the passband of the bandpass filter for a predefined time period. When activated, the signal suppression module 808 can suppress the input signal 234e or a portion thereof by a compression rate. For example, the compression rate can be between about 3 dB and about 6 dB per dB above (or in difference with) the threshold. The decision logic 818 can actuate the signal suppression responsive to detecting that the input signal 234e exceeds the amplitude threshold for a first time duration $\Delta t_1$ and that within the first time duration $\Delta t_1$, the input signal 234e includes frequency components within a predefined frequency range (e.g., passband of the bandpass filter 814). The decision logic 818 can deactivate signal suppression responsive to detecting that the input signal 234e falls below the amplitude threshold for a second time duration $\Delta t_2$ and/or that within the second time duration $\Delta t_2$, the input signal 234e does not include frequency components within the predefined frequency range (e.g., passband of the bandpass filter 814). For example, the decision logic 818 can include or maintain a first time counter, e.g., to keep track of time passed after the input signal 234e exceeds the amplitude threshold, and a second time counter, e.g., to keep track of the time passed after the input signal 234e falls below the amplitude threshold when signal suppression is already activated. The decision logic 816 can reset the first time counter and the second time counter as discussed above with regard to FIG. 6. In some implementations, $\Delta t_1$ can be between about 25 ms and about 50 ms. The second time duration $\Delta t_2$ may be between about 200 ms and about 1000 ms. Other values of $\Delta t_1$ and/or $\Delta t_2$ may be used.

The parallel compression module 800 can include an accumulator 812 to sum the signal 234e from the processing path 802 and the output signal, e.g., signal 234e', from the processing path 804. Summing the original input signal 234e and the corresponding compressed version 234e' to obtain the output signal 234f allows for alleviating the effect of the peak suppression (or signal compression). The summation of the original input signal 234e and the corresponding compressed version 234e' allows to rebuild the signal transients and increase the energy content in the voice fundamental range, approximately 100 Hz to approximately 2000 Hz. In an embodiment, a delay to synchronize phase between input signal 234e and corresponding compressed version 234e' may be included prior to the summer the accumulator 812. Other signals that may be processed prior to accumulator 812 or any other accumulator disclosed herein may also utilize a delay. By allowing the signal suppression module 808 to continue to be activated for the time duration $\Delta t_2$ after the input signal falls below the threshold, the signal suppression module 808 can rebuild transients that were reduced or suppressed by the expansion module 500.

Referring now to FIGS. 8B-8E, two example signal peaks of the audio signal 234e to which signal suppression is applied are depicted, according to example embodiments herein. In FIG. 8B, signal suppression is not applied to the signal portion 822 (shown in thin continuous line) of the signal 234e, but is applied to the signal portion 824 (shown in thick continuous line) and extending from the end of $\Delta t_1$ until the end of $\Delta t_2$. In other words, and as described above, the parallel compression module 310 or 800 triggers signal suppression $\Delta t_1$ after the input signal 234e exceeds (and stays above) the threshold and maintains the signal suppression on until the input signal is detected to fall (and stay) below the threshold for a time duration $\Delta t_2$. By waiting for a time duration $\Delta t_1$ before activating the signal suppression, the parallel compression module 310 or 800 may maintain the upward transient portion of the peak 820. The signal portion 826 (shown in dashed line) represents the suppressed or compressed version of the signal portion 824. The signal 234e includes the portion 822 (thin continuous line) and the portion 824 (thick continuous line).

FIG. 8C depicts a signal 234f (or a portion thereof) shown as a dashed line and corresponding to the portion or peak of signal 234e of FIG. 8B. The signal 234f in FIG. 8C includes the signal segment 822, which is the same as in signal 234e, and signal portion 828 which can be viewed as a sum (or weighted sum) of the signal segment 824 of input signal 234e and the corresponding suppressed version 826 or 234e'. In other words, the signal portion 828 of the output signal 234f depicts in the sum of the input signal 234e and the corresponding suppression version 234e' within the time period when signal suppression is activated.

Figure 8E:
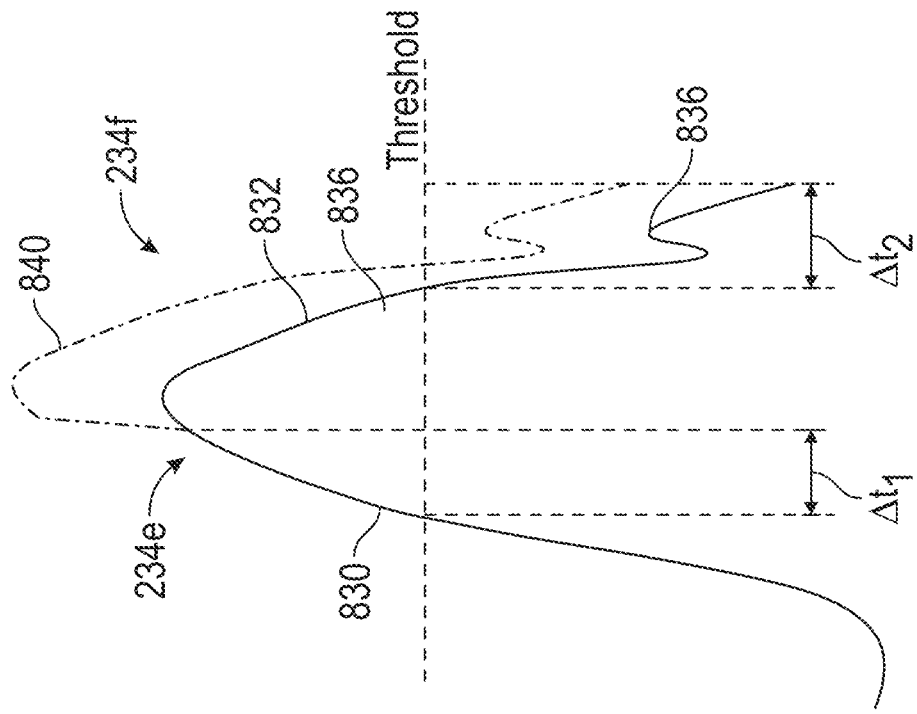
Figure 8D:
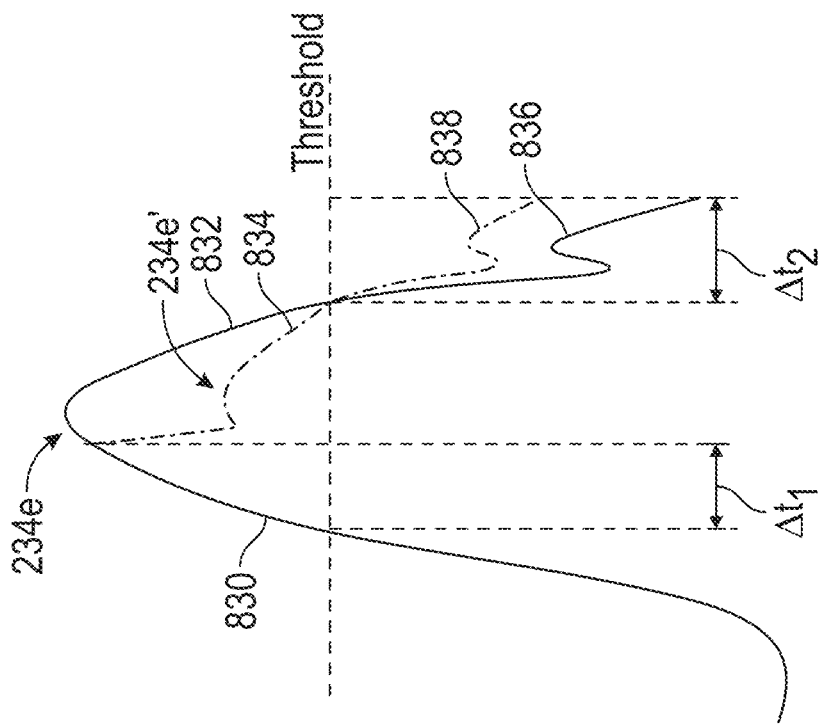

In FIG. 8D, another example portion or peak of signal 234e and corresponding suppression version 234e' are shown, according to an example embodiment. In this case, signal suppression is not applied to the signal portion 830 (shown in thin continuous line) of the signal 234e, but is applied to the signal portion 832 (shown in thick continuous line) and extending from the end of time period $\Delta t_1$ until the end of time period $\Delta t_2$. In other words, and as described above, the parallel compression module 310 or 800 may trigger signal suppression a time period $\Delta t_1$ after the input signal 234e exceeds (and stays above) the threshold and maintains the signal suppression ON until the input signal falls (and stays) below the threshold for a time period $\Delta t_2$. By waiting the time period $\Delta t_1$ before activating the signal suppression, the parallel compression module 310 or 800 may maintain the upward transient portion 830 of the signal 234e. The signal portion 834 represents the suppressed or compressed version of the signal portion 832. By waiting for a time period $\Delta t_2$ after the signal falls below the threshold before deactivation signal suppression/compression, the parallel compression module 310 or 800 can increase or amplify the relatively small transient (or relatively small peak) 836 to a larger transient or peak 838. The transient (or peak) 836 may have been reduced or suppressed by the expansion module 306 or 500. As such, the parallel compression module 310 or 800 allows for correcting undesired effects of the expansion module 310 or 800. The signal 234e includes the portion 830 (ending at the end of $\Delta t_1$) and the portion 832 (starting from the end of $\Delta t_1$).

FIG. 8E shows an output signal 234f of the parallel compression module 800 corresponding to the input signal 234e shown in FIG. 8D. The output signal 234f includes the segment or portion 830, which is the same as in the input signal 234e, and the segment or portion 840 (in dashed line). The portion or segment 840 represents a sum (or weighted sum) of the segment 832 of the input signal 234e and the corresponding suppressed signal 834 or 234e'.

Referring back to FIG. 3A, the AGC component or module 314 can be configured to apply an adaptive gain to the signal 234f output by the parallel compression module 312. The AGC module 314 can select the adaptive gain to be applied based on the characteristics of the communication channels or communication systems used to transmit the audio signal to the headsets 208. The ACG module 314 can output multiple output signals 234g-a-234g-n corresponding to different gains applied to the signal 234f or can generate a single output signal 234g with a single adaptive gain applied to the signal 234f. For instance, if multiple transmission channels and/or multiple transmission systems are used with different gain characteristics, the ACG module 314 can output multiple output signals 234g-a-234g-n corresponding to different gains applied to the signal 234f.

The transmission correction components 316a-316n (collectively 316) can be configured to correct for non-linearities in third party transmission systems. Each transmission correction component 316 can include a corresponding equalizer, a corresponding high-pass filter, a corresponding low-pass filter and/or some other filter. Parameters of the transmission correction components (e.g., transfer functions, cutoff frequencies, etc.) can be set based on measurements, preference and/or some algorithm. For instance, the effect of the transmission systems can be measured and used to determine the characteristics of the transmission correction components 316.

The delay modules 318a-1-318n-k can be configured to apply time delays to the signals 234h-a-234h-n output by the transmission correction components or modules 316a-316n, respectively. The delays applied to the signals 234h-a-234h-n allow for synchronizing the audio signals output by the headsets 208 with sound waves propagating in the air at corresponding regions or zones of the performance venue. Some applications may call for multiple delay zones for example due to the size of the venue and the distances separating the stage from different region or zones of the venue and/or due to different internal latencies of multiple transmission systems used. Discrepancy in time-alignment between the output of a headset 208 and propagating sound waves at the same location as the headset 208 are expected to be less than 50 ms or less than 80 ms in order not to be noticed by users classifying themselves as having "normal" hearing. For users with personal hearing aids and similar medical devices, the acceptable range is much narrower.

Figure 9A:
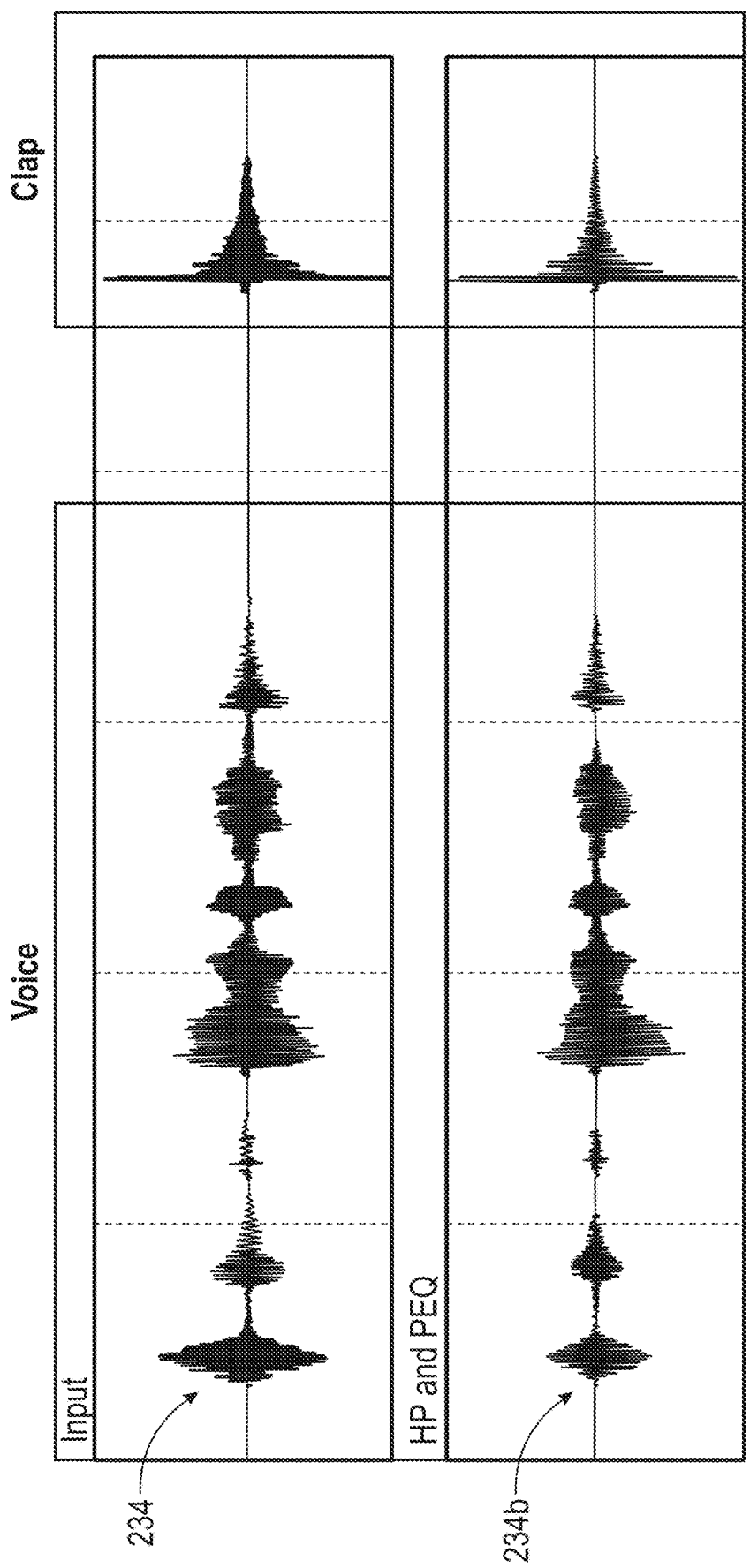

FIGS. 9A-9E show example signals at different stages of the hearing-assist system, according to example embodiments described herein. FIG. 9A shows an example input audio signal 234 and the corresponding signal 234b output by the high-pass/correction EQ module 304 or 400. The signal 234b represents a filtered version of the input signal 234. As described above in relation with FIG. 4, low-pass components of the input signal 234 are filtered out while some high-pass components may be amplified by the corrective EQ.

FIG. 9B shows the input signal 234 and the corresponding signal 234c output by the expansion module 306 or 500. Compared to the input signal 234, the signal 234c shows significant reduction in low amplitude signal portions. Specifically, portions of the signal 234 having relatively low amplitudes are suppressed to have much lower amplitudes in the signal 234c leading to reduced noise floor. Also, due to the delay $\Delta t_2$ in deactivating the signal suppression module 506, some transients (or peaks) of the input signal 234 are suppressed regardless of their amplitudes. In other words, some of the signal transients/peaks corresponding to time periods $\Delta t_2$ when applying signal expansion are suppressed by the expansion module 306 or 500. Comparing the signal 234b in FIG. 9A and the signal 234c in FIG. 9B, one can see that many peaks or transients with relatively large amplitudes (e.g., above the threshold used by the expansion module 500) have been suppressed in the signal 234c.

Figure 9C:
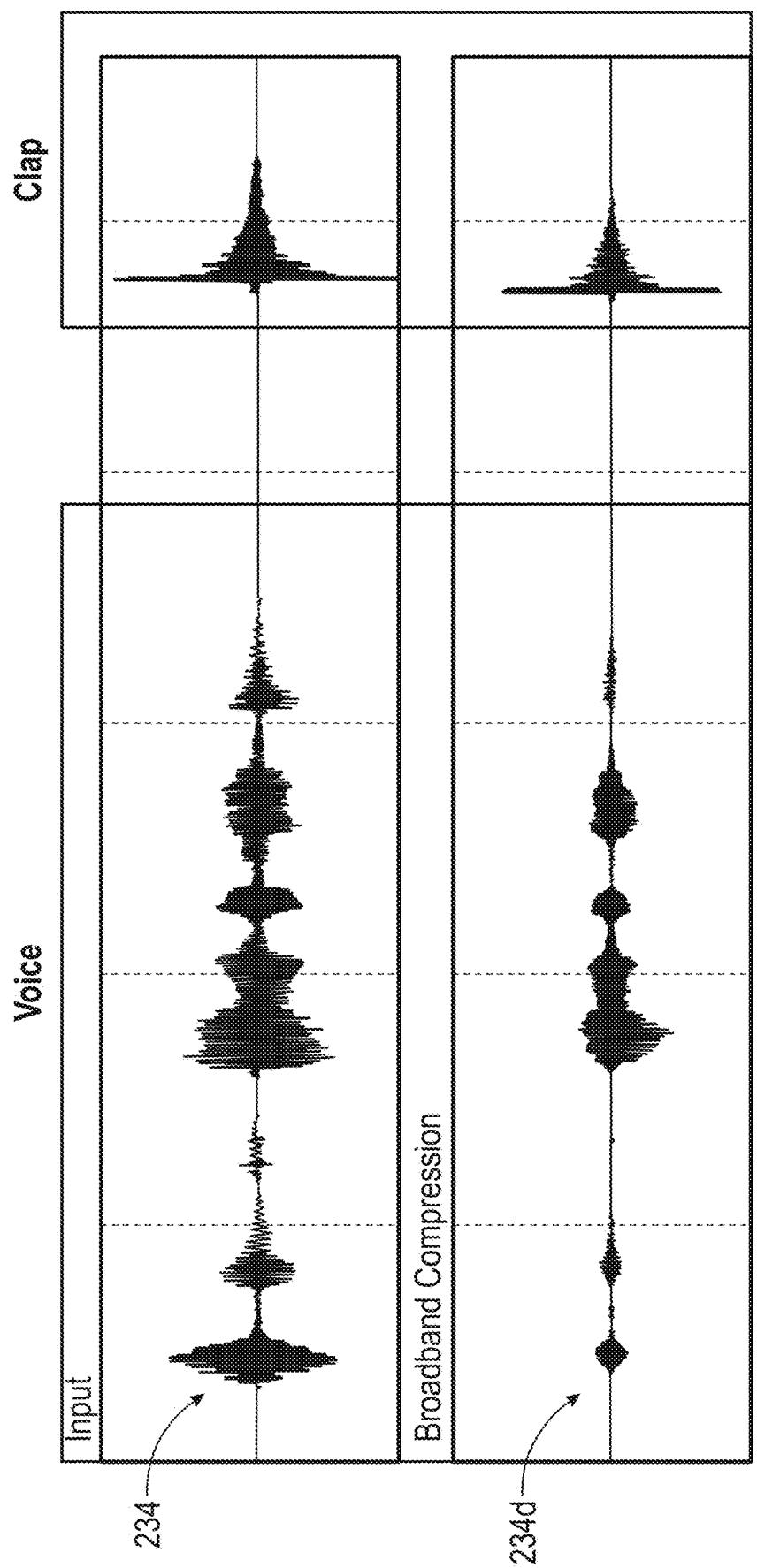

FIG. 9C shows the input signal 234 and the corresponding signal 234d output by the wideband compression module 308 or 600. Wideband compression, as described in relation with FIG. 6, is applied to the signal 234c shown in FIG. 9B to obtain the signal 234d in FIG. 9C. Comparing the signal 234d of FIG. 9C to the signal 234c of FIG. 9B, one can see that the dynamic range (e.g., amplitude range) of the signal 234d is smaller than the dynamic range of the signal 234c. The reduction in the dynamic range can be seen in the portion of the signal representing the speech or voice as well as the portion of the signal representing the clap.

Figure 9D:
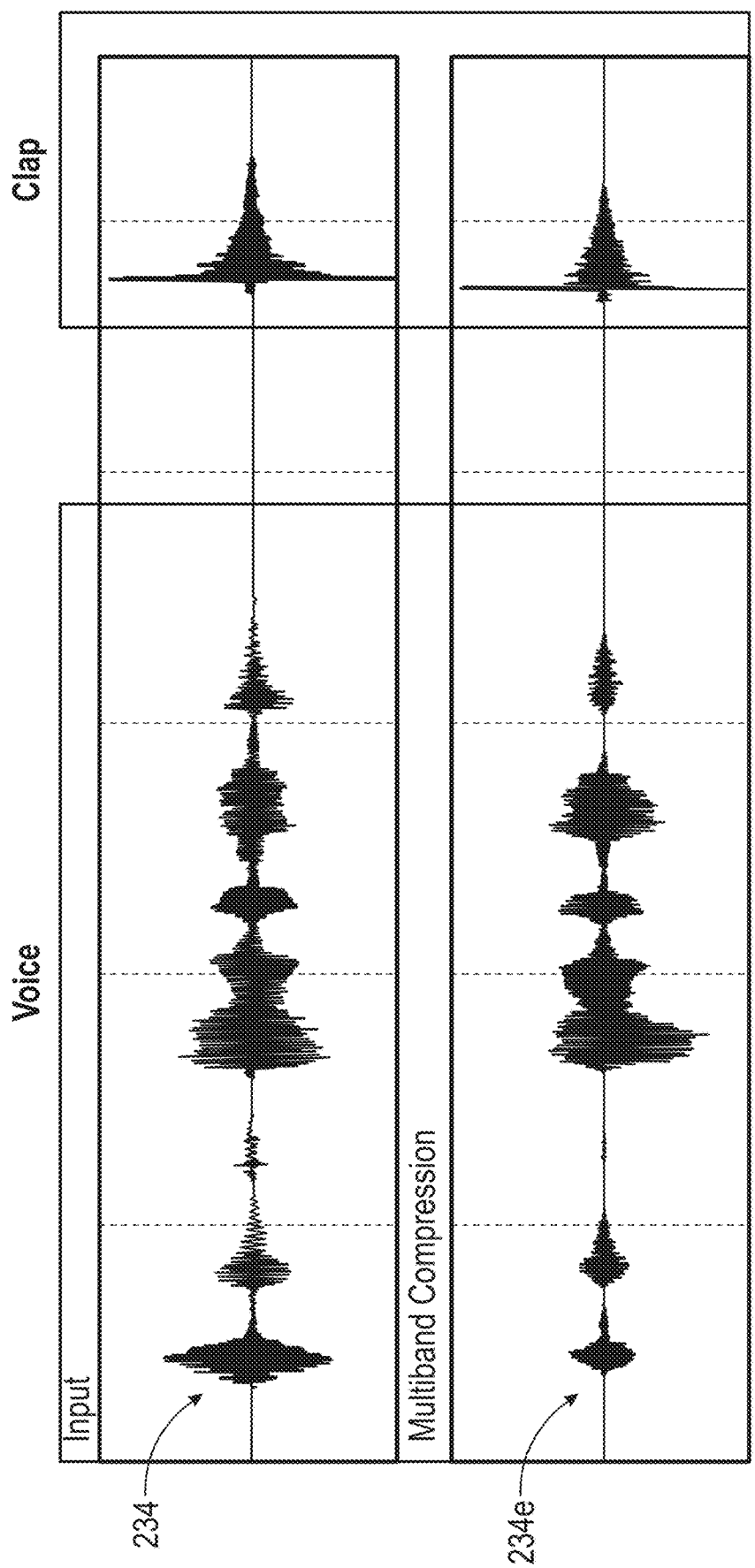

FIG. 9D shows the input signal 234 and the corresponding signal 234e output by the multiband compression module 310 or 700. Multiband compression, as discussed in relation with FIG. 7, is applied to the signal 234d shown in FIG. 9C to obtain the signal 234e in FIG. 9D.

Figure 9E:
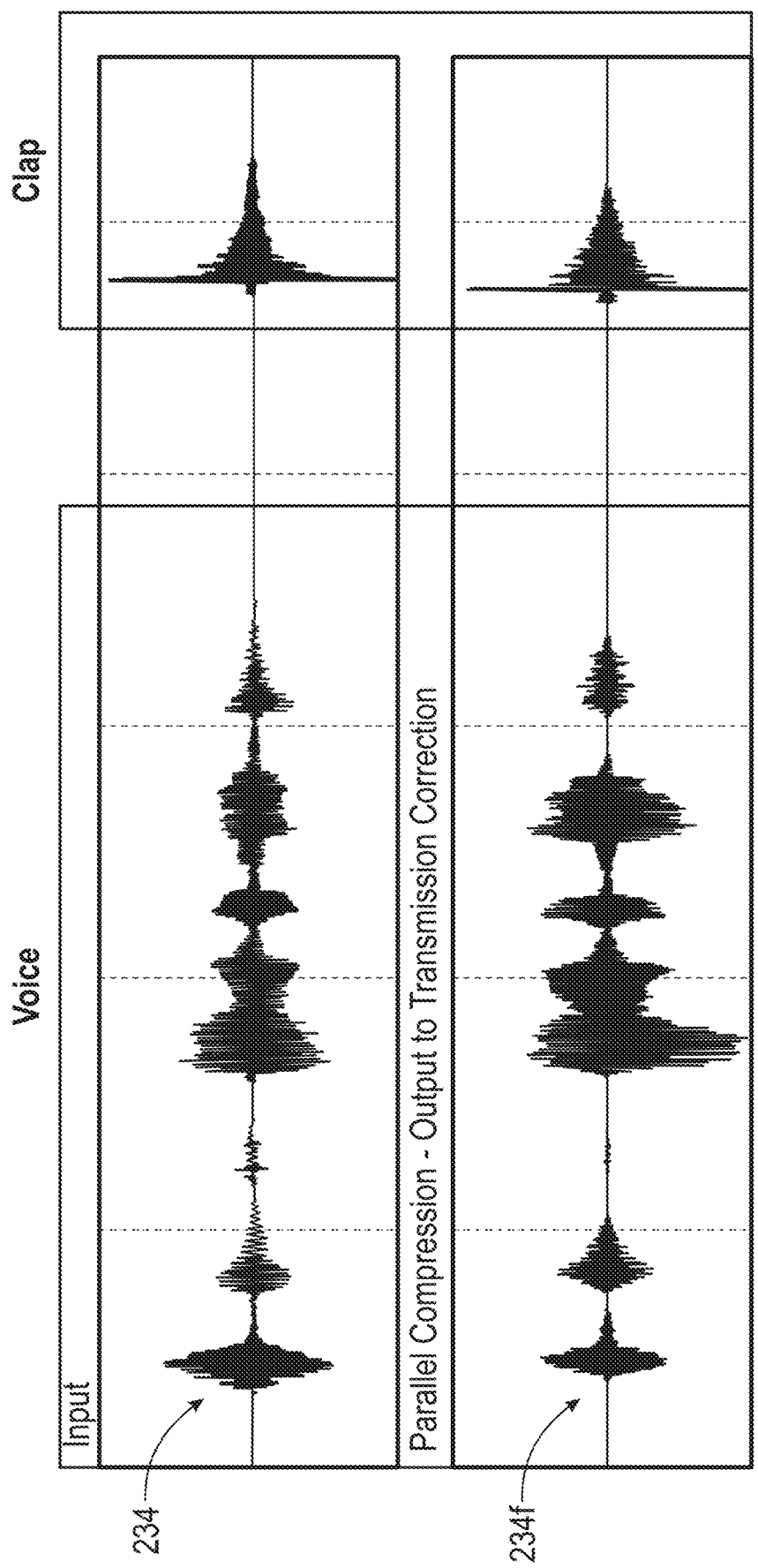

FIG. 9E shows the input signal 234 and the corresponding signal 234f output by the parallel compression module 312 or 800. Parallel compression, as discussed in relation with FIG. 8, is applied to the signal 234e shown in FIG. 9D to obtain the signal 234f in FIG. 9E. Comparing the signal 234e shown in FIG. 9D to the signal 234f of FIG. 9E, one can see that many signal transients (apart from the noise signal) that were suppressed due to signal expansion are recovered in the signal 234f. In other words, the parallel compression allows for correcting some of the undesired effects associated with the signal expansion, wideband compression, and/or multiband compression. Specifically combining the parallel compression module 312 or 800 with the expansion module 306 or 500, the wideband compression module 308 or 600 and/or the multiband compression module 310 or 700 allows for reducing the dynamic range of the audio signal 234 to enhance audibility of speech signals (or other types of signals) without negatively affecting the quality of other relatively loud signals, such as music or base signals. Furthermore, the wideband compression module 308 may be omitted. For example, the processing performed by the wideband compression module 308 may be integrated into the multiband compression module 310.

It is to be noted that some of the components or modules described in relation with FIGS. 3-8A may be omitted or combined with other components or devices. For example, the gain module 302 or 400 and/or the high-pass/corrective EQ module 304 or 500 may be omitted or may be integrated within the venue sound system equipment 202. In an embodiment, to avoid high frequency artifacts, a filter and/or parametric equalization may be utilized. Also, the AGC module 314, the transmission correction module(s) 316 and/or the delay modules 318 may be integrated into the transmission systems employed to transmit the audio signal to the headsets 208.

Referring back to FIG. 3B, a block diagram of another hearing-assist system (or audio enhancement system) 300B configured to improve audio quality of audio signals, according to example embodiments described herein. In brief overview, the hearing-assist system (or audio enhancement system) 300B can include an expansion module 320, a multiband compression module 322 and a parallel compression module 324. The hearing-assist system (or audio enhancement system) 300B may be used in a similar way as the hearing-assist system (or audio enhancement system) 300A of FIG. 3A to generate an enhanced-quality audio signal that is transmitted to receiving systems 208 of FIG. 2 or to process audio signals to be fed to sound system equipment, such as venue sound system equipment 202, or to loudspeakers, such as loudspeakers 220. In general, the hearing-assist system (or audio enhancement system) 300B may be used to process any audio signal, e.g., to enhance audio quality or improve speech intelligibility.

The expansion module 320 can be configured to operate in a same or similar way as expansion module 306 of FIG. 3A or 500 of FIG. 5. The expansion module 320 can receive an input audio signal 238b and generate a corresponding output signal 238c where portions or segments of the input signal 238b with relatively small amplitudes (e.g., below a predefined threshold) are suppressed as discussed above in relation with FIG. 5. In particular, the expansion module 320 can include a low-amplitude detector and an amplitude suppression module, e.g., as shown in FIG. 5. The parameters of the expansion module 320, e.g., amplitude threshold, expansion rate and/or the time durations $\Delta t_1$ and $\Delta t_2$, can have similar or different values as those described above in relation to FIG. 5.

In some implementations, the input signal 238b can include a combination of signals 222, 225, 228 and/or 232 shown in FIG. 2 that is to be processed by the hearing-assist system (or audio enhancement system) 300B. In some implementations, the input signal 238b can include a signal to be fed to one or more speakers, such as signal 233 of FIG. 2A, that is output by venue sound system equipment 202. For instance, the hearing-assist system (or audio enhancement system) 300B can receive signal 233 as input and provide a corresponding output signal to be sent to loudspeakers 220. In some implementations, signal 238b can be the same or similar to signal 234 or processed version thereof. In some implementations, signal 238b can include other audio signals, e.g., an audio signal including a mix of speech signals and other background audio signals.

The multiband compression module 322 can be configured to operate in a similar way as multiband compression module 310, 700 described above in relation with FIGS. 3A and 7. In particular, the multiband compression module 322 can receive signal 234c or a processed version thereof as input and apply signal compression per frequency band for multiple frequency bands as described above in relation with FIG. 7 to generate signal 238e. The parameters, e.g., frequency bands, amplitude thresholds, compression rates, gains, time delays $\Delta t$s, etc., can have similar or different values compared to those described in relation with FIG. 7 above.

In some implementations, the hearing-assist system (or audio enhancement system) 300B can further include a wideband compression module, e.g., similar to wideband compression module 308, 600 described above in relation with FIGS. 3A and 6, arranged between expansion module 320 and multiband compression module 322. For instance, the wideband (or broadband) compression module 308 of FIG. 3A can receive signal 238c as input and apply signal compression as described in relation to FIG. 6. The output signal of the wideband compression module can be fed as input to the multiband compression module 322.

The parallel compression module 324 can be functionally similar to parallel compression module 312, 800 described above in relations to FIGS. 3A and 8A-8E. The parallel compression module 324 can receive signal 238e as input and apply parallel compression as discussed above in relation to FIGS. 8A-8E to generate output signal 234f. The parameters of parallel compression module 324 can have similar or different values as those described above in relation with FIG. 8A. The output signal 238f, or a processed/modified version thereof (e.g., as discussed in relation with AGC 314 of FIG. 3A, transmission correction EQ/HP/LP 316 and/or delay modules 318 of FIG. 3A) can be transmitted to receiving systems 210. In some implementations, the output signal 238f or a processed/modified version thereof can be provided as input to loudspeakers 220 or venue sound system equipment 202.

In some implementations, the hearing-assist system (or audio enhancement system) 300B can further include any combination of input gain module 302, high-pass/corrective EQ 304, wideband compression module 308 and/or other modules of hearing-assist system (or audio enhancement system) 300A.

Referring back to FIG. 3B, a block diagram of another hearing-assist system (or audio enhancement system) 300B configured to improve audio quality of audio signals, according to example embodiments described herein. In brief overview, the hearing-assist system (or audio enhancement system) 300B can include an expansion module 320, a multiband compression module 322 and a parallel compression module 324. The hearing-assist system (or audio enhancement system) 300B may be used in a similar way as the hearing-assist system (or audio enhancement system) 300A of FIG. 3A to generate an enhanced-quality audio signal that is transmitted to receiving systems 208 or to process audio signals to be fed to sound system equipment, such as venue sound system equipment 202, or to loudspeakers, such as loudspeakers 220. In general, the hearing-assist system (or audio enhancement system) 300B may be used process any audio signal, e.g., to enhance audio quality or improve speech intelligibility.

The expansion module 320 can be configured to operate in a similar way as expansion module 306 or 500. The expansion module 320 can receive an input audio signal 238b and generate a corresponding output signal 238c where portions or segments of the input signal 234 with relatively small amplitudes (e.g., below a predefined threshold) are suppressed as discussed above in relation with FIG. 5. In particular, the expansion module 320 can include a low-amplitude detector and an amplitude suppression module, e.g., as shown in FIG. 5. The parameters of the expansion module 320, e.g., amplitude threshold, expansion rate and/or the time durations $\Delta t_1$ and $\Delta t_2$, can have similar or different values as those discussed above in relation to FIG. 5.

In some implementations, the input signal 238*b* can include a combination of signals 222, 225, 228 and/or 232 shown in FIG. 2 that is to be processed by the hearing-assist system (or audio enhancement system) 300B. In some implementations, the input signal 238*b* can include a signal to be fed to one or more speakers, such as signal 233 of FIG. 2 that is output by venue sound system equipment 202. For instance, the hearing-assist system (or audio enhancement system) 300B can receive signal 233 as input and provide a corresponding output signal to be sent to loudspeakers 220. In some implementations, signal 238*b* can be the same or similar to signal 234 of FIG. 3A or processed version thereof. In some implementations, signal 238*b* can include other audio signals, e.g., an audio signal including a mix of speech signals and other background audio signals.

The multiband compression module 322 can be configured to operate in a similar way as multiband compression module 310, 700 described above in relation with FIGS. 3A and 7. In particular, the multiband compression module 322 can receive signal 238*c* or a processed version thereof as input and apply signal compression per frequency band for multiple frequency bands as described above in relation with FIG. 7 to generate signal 238*e*. The parameters, e.g., frequency bands, amplitude thresholds, compression rates, gains, time delays Δts, etc., can have similar or different values compared to those described in relation with FIG. 7 above.

In some implementations, the hearing-assist system (or audio enhancement system) 300B can further include a wideband compression module, e.g., similar to wideband compression module 308, 600 described above in relation with FIGS. 3A and 6, arranged between expansion module 320 and multiband compression module 322. For instance, the wideband (or broadband) compression module can receive signal 238*c* as input and apply signal compression as described in relation to FIG. 6. The output signal of the wideband compression module 308 can be fed as input to the multiband compression module 322.

The parallel compression module 324 can be functionally similar to parallel compression module 312, 800 described above in relations to FIGS. 3A and 8A-8E. The parallel compression module 324 can receive signal 238*e* as input and apply parallel compression as discussed above in relation to FIGS. 8A-8E to generate output signal 238*f*. The parameters of parallel compression module 324 can have similar or different values as those described above in relation with FIG. 8A. The output signal 238*f*, or a processed/modified version thereof (e.g., as discussed in relation with AGC 314, transmission correction EQ/HP/LP 316 and/or delay modules 318 of FIG. 3A) can be transmitted to receiving systems 210 of FIG. 2. In some implementations, the output signal 238*f* or a processed/modified version thereof can be provided as input to loudspeakers 220 or venue sound system equipment 202.

In some implementations, the hearing-assist system (or audio enhancement system) 300B can further include any combination of input gain module 302, high-pass/corrective EQ 304, wideband compression module 308 and/or other modules of hearing-assist system (or audio enhancement system) 300A.

Any of the components or modules described above in relation with FIGS. 2A-8A can be implemented as hardware, firmware, software or a combination thereof. For instance, any of these components or modules can be implemented as software instructions that are executed by one or more processors.

Figure 10:
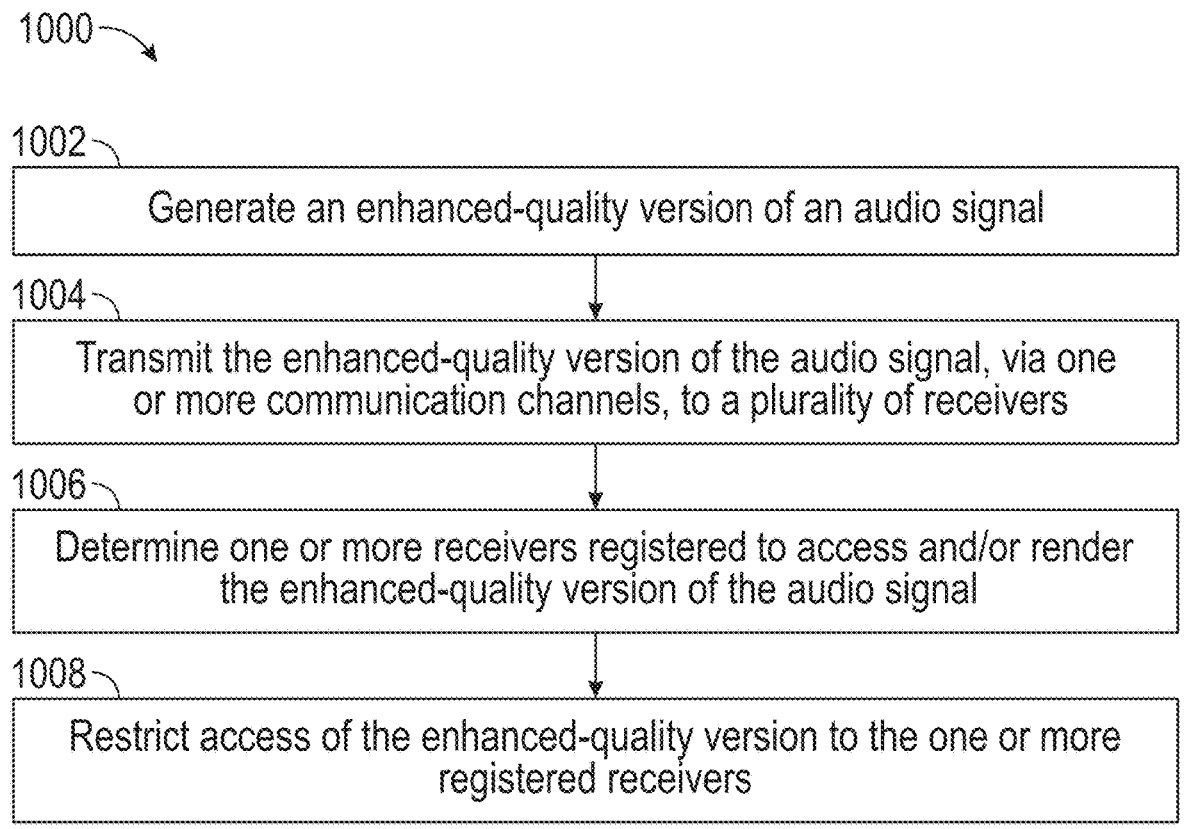
FIG. 10 is a flow chart illustrating a method for providing enhanced audio experience, according to example embodiments described herein.

FIG. 10 is flowchart diagram depicting a method 1000 for providing enhanced audio experience, according to example embodiments herein. In brief overview, the method 1000 can include generating and enhanced-quality version of an audio signal (STEP 1002), transmitting the enhanced-quality version via one or more communication channels to multiple receivers (STEP 1004), determining a receiver registered to access and/or render the enhanced-quality version (STEP 1006), and causing the registered receiver to access and/or render the enhanced-quality version (STEP 1008).

The method 1000 can include a computing system, e.g., including a memory and one or more processors, or audio enhancement system 300A, 300B generating an enhanced-quality version of an audio signal rendered in a venue via one or more loudspeakers (STEP 1002). The enhanced-quality version can be generated as discussed above in relation to FIGS. 3A-8E. For instance, the enhanced-quality version can include signal 234*f* of FIG. 3A or FIG. 3B. In particular, generating the enhanced-quality version can include using an expansion module 306, 320, 500, a multiband compression module 310, 322, 700 and a parallel compression module 312, 324, 800. Generating the enhanced-quality version may further include using other modules, such as any combination of input gain module 302, high-pass/corrective EQ 304, wideband compression module 308 and/or other modules of hearing-assist system (or audio enhancement system) 300A and/or other modules. As described in relation with FIG. 3A, the audio signal for which the enhanced-quality version is generated may be rendered or broadcast via one or more loudspeakers, e.g., loudspeakers 220, in a venue.

The method 1000 can include transmitting the enhanced-quality version via one or more communication channels to a plurality of receivers (STEP 1004). A transmitter or transmission system can transmit the enhanced-quality version of the audio signal to a plurality of receivers, such as receiving systems 208 or receivers 210. In a venue, the enhanced-quality version of the audio signal can be transmitted or broadcast to a plurality of individuals or users in the venue. Various types of transmission systems and/or receiving systems 208 can be used in a venue as described below:

Wired-Transmission

In some implementations, a transmission system or transmitter can transmit the enhanced-quality version of the audio signal over a plurality of wired links. Each wired link can connect the transmitting system or transmitter to a corresponding headphone jack or speaker. For example, in a theater auditorium or a movie theatre among other types of venues, there can be a headphone jack per seat or one or more speakers integrated into the seat. A user or an individual can plug a headset to a headphone jack to hear or listen to the enhanced-quality version of the audio signal, e.g., in addition to or simultaneously with receiving the audio signal via other loudspeakers, e.g., loudspeakers 220.

The signal-access management system 206 can control the headphone jacks or loudspeakers connected to the transmitting system. For example, the signal-access management system 206 can turn such headphone jacks or loudspeakers ON and OFF. In some implementations, the signal-access management system 206 can control over which wired links or to which headphone jacks or loudspeakers the transmitting system is to transmit the enhanced-quality version of the audio signal.

FM Broadcast

In some implementations, the venue sound system 200 can include one or more frequency modulation (FM) transmitters configured to transmit the enhanced-quality version of the audio signal over one or more commercial low-power FM channels. In such case, the receivers 210 can include FM receivers. In some implementations, the receivers 210 can include cell phones or other mobile devices equipped with FM receivers. Advantages of FM transmission include simplicity, fidelity, ability to serve an unlimited number of receivers with no additional installation cost, no impact on or interference with other communication and/or electronic systems of the venue, and a relatively small delay or latency, not an excessive delay, is typically introduced when using RF transmission.

In some implementations, the signal-access management system 206 can cause the FM transmitter(s) to encrypt the enhanced audio version of the audio signal before sending over the FM channel(s). For example, the signal-access management system 206 can provide encryption keys to the FM transmitter(s) for use to encrypt the enhanced-quality version of the audio signal. The signal-access management system 206 can be configured to change the encryption keys used over time to avoid or mitigate the chances of uncovering the encryption keys by hackers or intruders. In some implementations, the signal-access management system 206 can be configured to control the receivers 210, e.g., FM receivers. In particular, the receivers 210 can be owned or controlled by the venue operators. The signal-access management system 206 can be configured or capable of turning any FM receiver ON and OFF.

AM Broadcast

In some implementations, the venue sound system 200 can include one or more amplitude modulation (AM) transmitters configured to transmit the enhanced-quality version of the audio signal over one or more commercial low-power AM channels. In such case, the receivers 210 can include AM receivers. In some implementations, the receivers 210 can include cell phones or other mobile devices equipped with AM receivers. Similar to FM transmission, AM transmission can be achieved with relatively low complexity transmitters/receivers, may allow for serving an unlimited number of receivers with no additional installation cost, may have no impact on or interference with other communication and/or electronic systems of the venue, and may introduce a relatively small delay or latency (e.g., a low percent, such as below about 5%).

When using AM transmission, the signal-access management system 206 can control encryption of the enhanced-quality audio signal and/or control the AM receivers in the venue (e.g., turning ON/OFF).

Infrared Transmission

In some implementations, the venue sound system 200 can include an infrared transmitter or transmitting system configured to transmit the enhanced-quality version of the audio signal as infrared signals. The receiving systems 208 or receivers 210 can include infrared receivers.

T-Loop

In some implementations, the venue sound system 200 can include a T-Loop transmission system. The T-Loop transmission system can include a plurality of base band magnetic loops distributed over the venue. For example, the T-Loop transmission system can include a T-Loop around (or in the vicinity) each seating area in the venue. Each T-Loop can provide short distance magnetic transformer-like coupling to a coil (T-Coil) in a user's hearing aid, user's headset or user's receiving system 210.

In some implementations, the signal-access management system 206 can be coupled to the T-Loops in the venue and configured to control which T-Loops to be turned ON/OFF.

LAN

In some implementations, the venue sound system 200 can include a transmitter or transmitting system configured to transmit the enhanced quality signal over a local area network (LAN), e.g., WiFi, of the venue using digital audio transmission. Users or individuals in the venue can use their cell phones or mobile devices to connect to the LAN of the venue and receive the enhanced-quality version of the audio signal.

BLUETOOTH

In some implementations, the venue sound system 200 can include a digital audio transmission system configured to transmit the enhanced-quality version of the audio signal using BLUETOOTH or versions thereof, such as AURA-CAST. Users or individuals in the venue can use their cell phones or mobile devices to tune in to one broadcast channel(s) over BLUETOOTH.

Streaming

In some implementations, the venue sound system 200 can include one or more streaming servers or systems configured to stream the enhanced-quality version of the audio signal, e.g., over the Internet. Users or individuals in the venue can use cell phones or other mobile devices to access the audio stream. For example, cell phones or mobile devices can connect via cellular networks or WiFi to access or receive the audio stream.

Hybrid Transmission Systems

In some implementations, the venue sound system 200 can include a hybrid transmission system including a combination of the various types of transmission systems, such as the transmission systems described above and/or other types of transmission systems known or to become known to a person skilled in the art. For example, the hybrid transmission system can include a combination of FM transmission and digital audio transmission, a combination of FM transmission and T-Loop transmission or a combination of T-Loop and digital audio transmission.

One technical challenge when using digital audio transmission, e.g., streaming, WiFi and/or BLUETOOTH is the amount of delay or latency introduced. As discussed in relation with FIGS. 2A and 3A, delays can be introduced in the enhanced-quality version of the audio signal by delay modules 318, e.g., before transmitting the enhanced-quality version of the audio signal. Different delays can be introduced depending on the area or location of the intended receiving system(s) 210. However, when transmitting the enhanced-quality version of the audio signal over a digital transmission system, additional delay may be introduced by the transmission system. Also, in venues where users or individuals can move around in the venue, e.g., concert venues, bars, night clubs, airports, airplanes, trains, public spaces, etc., it becomes a challenge to track the exact location of a receiving system and adjusting the delay accordingly.

In some implementations, the delay modules 318 can be integrated in the receiving systems 210. The receiving system 210 can include a microphone to capture or receive ambient audio signals. The receiving system 210 can be configured to determine a proper delay to be introduced in the received enhanced quality version of the audio signal based on the ambient audio signal and the enhanced quality version received over a communication channel. For example, the receiving system 210 can compute or determine a cross-correlation function between the ambient audio signal received over the microphone and the enhanced quality version received over the communication channel. The receiving system 210 can determine the delay to be introduced in the enhanced-quality version using or based on a maximum of the cross-correlation function.

Referring back to FIG. 10, the method 1000 can include the signal-access management system 206 determining one or more receivers registered to access and/or render the enhanced-quality version (STEP 1006). In some implementations, access to the enhanced-quality version of the audio signal can be provided as a paid or subscription-based service. Individuals or attendants of a venue can pay for such service per unit time, per venue program or as monthly (or yearly) subscription, among other options.

In some implementations, individuals can pay or subscribe for the service via the UI 207 or the mobile application 209 provided by the signal-access management system 206. The signal-access management system 206 can maintain a database of indicative of individuals or receiving systems 208 who subscribed or paid for the service. For example, the signal-access management system 206 can receive indications of subscriptions and/or payments via the UI 207 or the mobile application 209. The signal-access management system 206 can record in the database identifiers of receiving systems 208 or receivers 210 associated with subscriptions or payments for the service. The identifiers (IDs) can include Internet Protocol (IP) addresses and/or other types of the receiving systems 208 or receivers 210.

In some implementations, individuals can pay for the service at a ticketing booth or a point of sale associated with the venue. For example, a ticket can include a barcode, a QR code and/or some other type of code indicative of payment or subscription to the service. In a case where the receiving systems 208 or receivers 210 are owned or operated by venue operators, each receiving system 208 or receiver 210 can include or can be associated with a code-reading device. The code-reading device can be coupled to the signal-access management system 206 and/or the database and can send an indication of a scanned code to the signal-access management system 206 and/or the database. Upon receiving the indication of scanned code (and may be validating the scanned code), the signal-access management system 206 and/or the database can update a record to indicate that the corresponding receiving system 208 or receiver 210 is subscribed or registered to receive the enhanced-quality version of the audio signal.

In some implementations, a user or individual can scan the code using a respective cell phone or mobile device. The cell phone or mobile device can run the UI 207 or mobile application 209 provided by the signal-access management system 206. The cell phone or mobile device can send an indication of the scanned code, e.g., via the UI 207 or mobile application 209, to the signal-access management system 206, which can update a database record to indicate that cell phone or mobile device is eligible to receive the enhanced-quality version of the audio signal.

In general, payment or subscription for the service of accessing or receiving the enhanced-quality version of the audio signal can be performed or achieved as discussed above or according to other ways. For example, an individual can pay or subscribe for the service at a ticketing booth or point of sale associated with the venue. The individual or a salesperson of the venue can enter or send, e.g., via a computer device, an indication of a device ID, a receiving system 208 or receiver 210 or a seat designated for the paying individual to the signal-access management system 206.

At any point of time, the signal-access management system 206 can access the database to determine or identify the receiving systems 208 or receivers 210 eligible for receiving the service of accessing the enhanced-quality version of the audio signal. For example, the signal-access management system 206 can access the database to determine whether a receiving system 208 or receiver 210 is eligible to access or receive the enhanced-quality version of the audio signal at the beginning of a program, responsive to a request from the receiving system 208 or receiver 210 and/or on a regular basis.

The method 1000 can include the signal-access management system 206 restricting access of the enhanced-quality version to the one or more registered receivers (STEP 1008). The signal-access management system 206 can restrict access to the enhanced-quality version of the audio signal according to various ways. For example, and as discussed above, the signal-access management system 206 cause the enhanced-quality version of the audio signal to be transmitted to various receiving systems 208 or receivers 210 in encrypted form. The signal-access management system 206 cause provide decryption keys (or decryption algorithms) only to receiving systems 208 or receivers 210 determined to be eligible (e.g., paid or registered) to access or receive the enhanced-quality version of the audio signal. The signal-access management system 206 cause provide the decryption keys (or decryption algorithms) to the receiving systems 208 or receivers 210 via the UI 207, the mobile application 209 and/or a digital communication link. In some implementations, the receiving systems 208 or receivers 210 can receive the decryption keys (or decryption algorithms) via hyperlink provided by the signal-access management system 206 or a secured connection with the signal-access management system 206.

In some implementations, the signal-access management system 206 can restrict access to the enhanced-quality version of the audio signal by switching ON eligible (e.g., subscribed or paying) receiving systems 208 or receivers 210 while keeping non-eligible receiving systems 208 or receivers 210 switched OFF. In some implementations, the signal-access management system 206 can identify which based on subscription and/or payment data which T-Loops to be switched on and which ones to be switched OFF.

It is to be noted, that the signal-access management system 206 can provide, e.g., via digital communication, means for subscribed or paying users or individuals to control rendering or access of the enhanced-quality version of the audio signal. For example, eligible receiving systems 208 or receivers 210 can switch between different transmission channels, send feedback to the signal-access management system 206, pay for more access time and/or other control functions.

Figure 11:
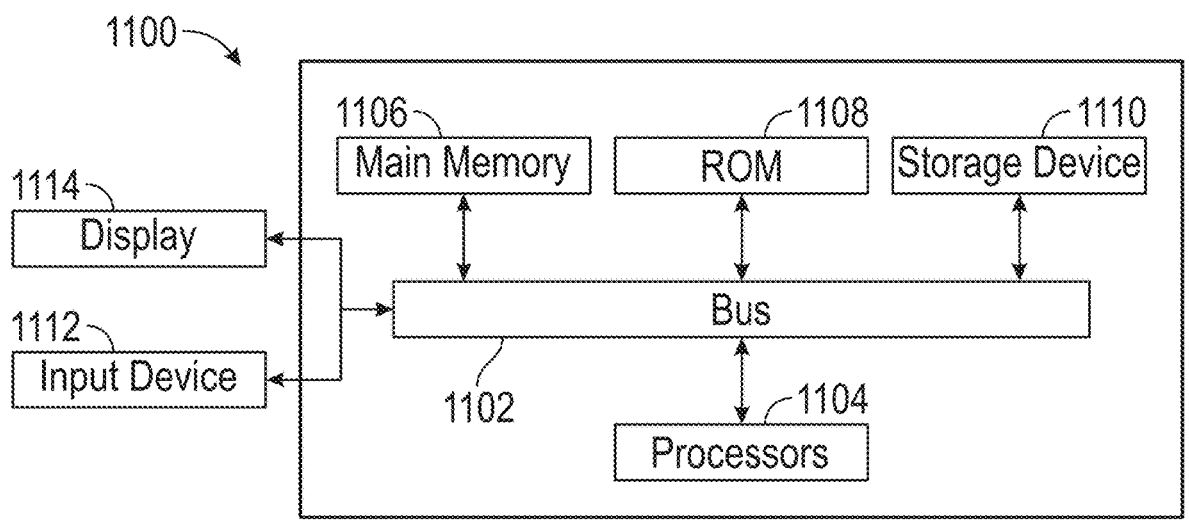
FIG. 11 is a block diagram depicting one implementation of a general architecture for a computer system that may be employed to implement various elements of the systems and methods described and illustrated herein.

FIG. 11 is a block diagram of a computer system 1100 that can be used to implement the venue sound system equipment 202, the hearing-assist system 204, the headset management computing system 206 and/or any of the modules described in relation to FIGS. 3-8A and 10. The computing system 1100 includes a bus 1102 or other communication component for communicating information and a processor 1104 coupled to the bus 1102 for processing information. The computing system 1100 can also include one or more processors 1104 coupled to the bus for processing information. The computing system 1100 also includes main memory 1106, such as a RAM or other dynamic storage device, coupled to the bus 1102 for storing information, and instructions to be executed by the processor 1104. Main memory 1106 can also be used for storing position information, temporary variables, or other intermediate information during execution of instructions by the processor 1104. The computing system 1100 may further include a ROM 1108 or other static storage device coupled to the bus 1102 for storing static information and instructions for the processor 1104. A storage device 1110, such as a solid state device, magnetic disk or optical disk, is coupled to the bus 1102 for persistently storing information and instructions. Computing device 1100 may include, but is not limited to, digital computers, such as laptops, desktops, workstations, personal digital assistants, servers, blade servers, mainframes, cellular telephones, smart phones, mobile computing devices (e.g., a notepad, e-reader, etc.) etc.

The computing system 1100 may be coupled via the bus 1102 to a display 1114, such as a Liquid Crystal Display (LCD), Thin-Film-Transistor LCD (TFT), an Organic Light Emitting Diode (OLED) display, LED display, Electronic Paper display, Plasma Display Panel (PDP), or other display, etc., for displaying information to a user. An input device 1112, such as a keyboard including alphanumeric and other keys, may be coupled to the bus 1102 for communicating information and command selections to the processor 1104. In another implementation, the input device 1112 may be integrated with the display 1114, such as in a touch screen display. The input device 1112 can include a cursor control, such as a mouse, a trackball, or cursor direction keys, for communicating direction information and command selections to the processor 1104 and for controlling cursor movement on the display 1114. Still yet, the input device 1112 may be a code reader, such as a barcode reader, RFID reader, or other machine-readable indicia reader, configured to image and decode a QR code, identify an RFID tag, or otherwise. In an embodiment, the input device 1112 may be an inductive magnetic coupling device configured to inductively couple with corresponding inductive magnetic coupling devices configured within receiving systems. In response to the input device 1112 performing an inductive coupling, a signal may cause a timer of the receiving system to be set for a certain period of time, such as 4 hours, that enable the receiving system to be operated during that time period and disabled thereafter until reset again by the input device 1112. It should be understood that there may be multiple input devices 1112 to provide for flexibility for an operator and different configurations of the receiving system.

According to various implementations, the processes or methods described herein can be implemented by the computing system 1100 in response to the processor 1104 executing an arrangement of instructions contained in main memory 1106. Such instructions can be read into main memory 1106 from another computer-readable medium, such as the storage device 1110. Execution of the arrangement of instructions contained in main memory 1106 causes the computing system 1100 to perform the illustrative processes or method ACTs described herein. One or more processors in a multi-processing arrangement may also be employed to execute the instructions contained in main memory 1106. In alternative implementations, hard-wired circuitry may be used in place of or in combination with software instructions to effect illustrative implementations. Thus, implementations are not limited to any specific combination of hardware circuitry and software.

Although an implementation of a computing system 1100 has been described in FIG. 11, implementations of the subject matter and the functional operations described in this specification can be implemented in other types of digital electronic circuitry, or in computer software, firmware, or hardware, including the structures disclosed in this specification and their structural equivalents, or in combinations of one or more of them.

Figure 12:
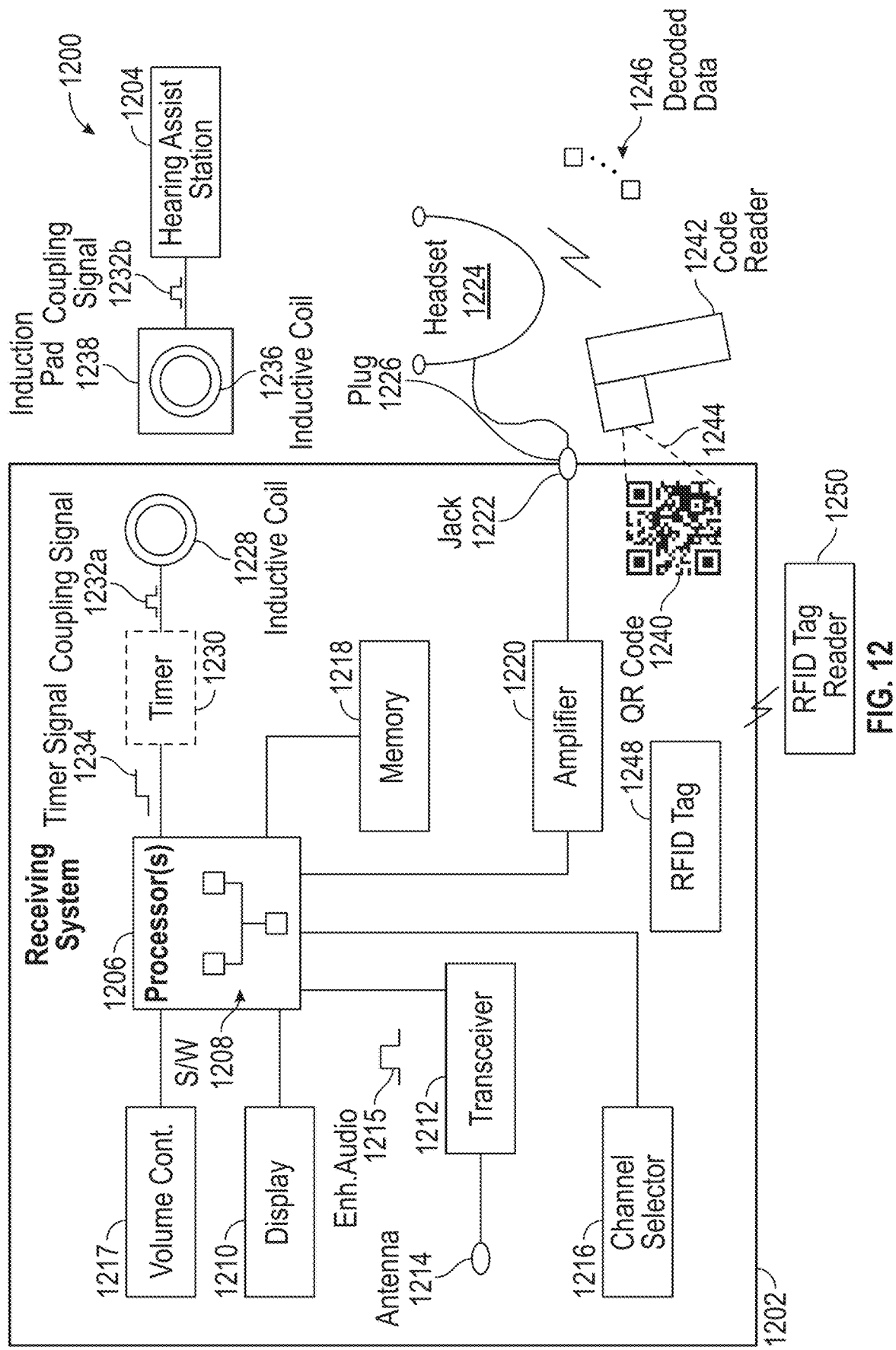
FIG. 12 is an illustration of an illustrative receiving system that functions to serve as a hearing assist system to improve a patron's hearing of speech at a performance, such as a play, that is configured to interact with a hearing assist rental station.

With regard to FIG. 12, an illustration of an illustrative environment 1200 in which a receiving system 1202 that functions to serve as a hearing assist system to improve a patron's hearing of speech at a performance, such as a play, that is configured to interact with a hearing assist station 1204 is shown. The receiving system 1202 may include one or more processors 1206 configured to execute software 1208. The software 1208 may be configured to perform a number of functions, including signal processing (e.g., filtering, gain control, etc.), channel control (e.g., select frequency), optionally perform decryption of audio signals, and so on. The processor(s) 1206 may be in electrical communication with an electronic display 1210 to display channel, battery status, fault or warning messages, timer information, remaining performances, remaining hours, and so on. A transceiver 1212 may be in electrical communication with the processor(s) 1206 and antenna 1214, and configured to receive enhanced audio signals 1215 from a hearing assist system that processed audio signals of a performance, as previously described. The enhanced audio signals 1215 may be digital or analog and converted to a digital signal or processed by an analog circuit (not shown).

A channel selector 1216 may be a physical element, such as a switch, push button, dial, or otherwise, that allows for two or more channels to be selected by a patron utilizing the receiving system 1202. In an alternative embodiment, rather than or in addition to the channel selector 1216, the software 1206 may be configured with channel selector that is remotely controlled by the hearing assist station 1204, as further described hereinbelow. A volume control element 1217, which may be a dial, push button, or otherwise, may be utilized to alter volume of the receiving system 1202 by controlling the software 1208 or gain of an amplifier.

The processor(s) 1206 may further be in electrical communication with a non-transitory memory 1218 and amplifier 1220. The memory may be configured to store data, such as current channel, identification, current date and time, serial number, decryption key(s), current volume, and so on, along with software utilized to control the receiving system 1202. The amplifier 1220 may be configured to receive audio signals and perform amplification thereon. The amplification may be based on a volume setting (e.g., digital setting that is communicated to the amplifier 1220 by the processor(s) 1206 or analog setting directly or indirectly applied to the amplifier 1220). The amplifier 1220 may output an audio signal, which may be digital or analog, to an output jack 1222 with which a headset 1224 may connect via a plug 1226. In an alternative embodiment, the receiving system 1202 may include local wireless communication electronics (not shown), such as Bluetooth® wireless communications electronics with which a wireless headset (not shown) may communicate to pair and receive processed audio signals.

The receiving system 1202 may include an inductive coil 1228 or other means for use in activating a timer circuit 1230. The timer circuit 1230 is optionally an electrical circuit or may be a software function of the software 1208. If an electrical circuit 1230, the timer circuit 1230 may be a one-shot circuit that, in response to receiving a coupling signal 1232a, generates a timer signal 1234 that extends for a certain period of time, such as four hours, and enables the software to process the enhanced audio signals 1215 received from the transceiver 1212. To generate the coupling signal 1232*a*, the inductive coil 1228 may be placed in a magnetic coupling distance with a corresponding inductive coil 1236 of an induction pad 1238 at the hearing assist station 1204. In response to the inductive coupling between the inductive coils 1228 and 1236, the coupling signal 1232*a* and coupling signal 1232*b* may be generated. The coupling signal 1232*b* may be communicated to the hearing assist station 1204 to enable the hearing assist station 1204 to detect that a receiving system was issued to a patron. In an embodiment, the coupling signal 1232*b* may include a unique ID associated with the receiving system 1202, thereby enabling the hearing assist station 1204 to update a record in a database (see FIG. 13) that a particular receiving system 1202 was issued to the patron.

In addition to or as an alternative to the inductive coil 1228, a printed machine-readable indicia, in this case a QR code, 1240 may be affixed to or applied to a housing of the receiving system 1202. The machine-readable indicia 1240 may contain a variety of information, such as unique identifier of the receiving system 1202, venue at which the receiving system 1202 is issued, configuration of the receiving system 1202, and so on. If the receiving system 1202 is purchased or seasonally rented, for example, the machine-readable indicia 1202 may contain information associated with the patron that acquired or rented the receiving system 1202 along with terms of the rental or acquisition (e.g., seasonal, number of hours, due date for return, etc.). As shown, a code reader 1242 configured to read the machine-readable indicia 1240 may be utilized to capture and decode content and/or data represented by the machine-readable indicia 1240. Decoded data 1246 may be communicated wirelessly or via a wire to the hearing assist station 1204 for processing and/or storage thereby. In yet another embodiment, an RFID tag 1248 may be applied to or contained within a housing of the receiving system 1202 and an RFID tag reader 1250. The RFID tag 1248 may contain information that is the same, similar to, or different from the information stored in the machine-readable indicia 1240. The RFID tag reader 1250 may communicate the information stored by the RFID tag 1248 to the hearing assist station 1204 in the same or similar manner as the code reader 1242.

Rental, Registration, and Activation Configurations and Processes

Operators who rent the receiving systems to patrons want to avoid unauthorized use of the receiving systems without compensation. In most circumstances, the operator (e.g., independent company or venue employees) rents the receiving systems at a station within a venue (e.g., music hall, movie theater, airport, etc.) that issues the receiving systems to patrons for rental fee compensation. Currently, as a receiving system is issued to a patron, the receiving system may be optionally be registered into a computer and handed to the patron with a security deposit and/or credit card. In an embodiment, a patron may simply provide a security deposit and/or credit card (or other form of identification, such as a driver's license) and be issued a receiving system without an operator recording the receiving system into a computing system. However, if someone keeps the receiving system or is able to obtain another one (e.g., from another source or from a previous show), then a general broadcast may allow for someone to pick up broadcast signals. To avoid someone with a receiving system, authorized (e.g., purchased from the official seller of the receiving systems) or unauthorized (e.g., purchased from an unauthorized seller of the receiving systems), from being able to simply receive the broadcast signals, the headsets may be configured with a circuit and/or software that may be activated when a patron picks up or checks in with a registration station at the venue or a remote or cloud-based registration system prior to an event. Registration of a receiving system may also be utilized to automatically register or account for the receiving system in a receiving system tracking database, thereby making the registration process more efficient than having a human having to manually enter each of the receiving systems into the database.

Figure 13:
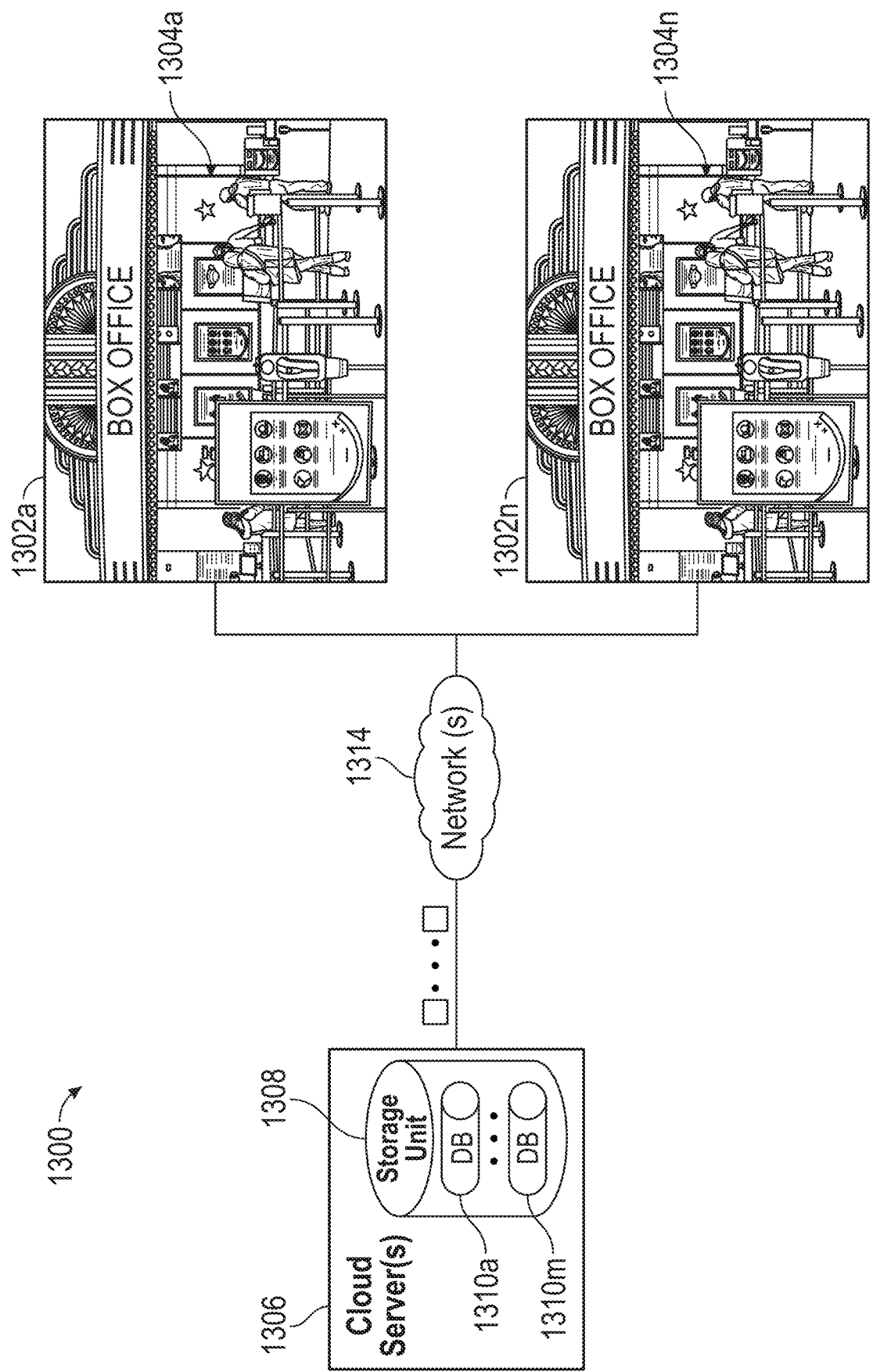
FIG. 13 is an illustration of an environment in which multiple venues are configure with hearing assist stations configured to communicate with one or more cloud servers.

With regard to FIG. 13, an illustration of an environment 1300 in which multiple venues 1302*a*-1302*n* (collectively 1302) are configured with hearing assist stations 1304*a*-1304*n* configured to communicate with one or more cloud servers 1306 is shown. The cloud server(s) 1306 may be configured with a storage unit 1308, such as a disk drive or other non-transitory memory, that stores one or more databases 1310*a*-1310*m* (collectively 1310). The databases 1310 may store information from multiple venues 1302 or may be configured on a venue-by-venue basis (i.e., each of the databases 1310 stores information from a single venue of the venues 1302). The database(s) 1310 may be configured to track usage of receiving systems and/or patrons, including subscriptions or rentals (e.g., number of performances utilized by patrons, number of remaining hours, etc.), number of rentals at an individual venue, number of total rentals across all venues, types of rentals, money collected for rentals, number of uses per receiving system, and so on. The hearing assist stations 1304 may be automated or operated by an operator. The hearing assist stations 1304 may be configured with the same or similar functional features as provided in FIG. 12 based on configurations of the receiving systems provided by a venue or across multiple venues 1302. In operation, the hearing assist stations 1304 may communicate collected data via one or more networks 1314, such as the Internet, mobile network, or other local area network or wide area network, to communicate the collected data via data packets 1316 or otherwise to the cloud server(s) 1306. By utilizing the cloud server(s) 1306 and databases 1310 operated thereby, a patron may utilize a receiving system in multiple venues 1302 in the same or different cities and/or countries and have a subscription or rental plan handled the same as if the patron were in a home venue.

In an embodiment, rather than performing a single event rental, a patron may rent the receiving system for a season. The seasonal rental of a receiving system may be considered a personal receiving system (i.e., a receiving system that only the patron uses for the purposes of cleanliness, guaranteed availability, reduced logistics at a venue, reduced setup time, and consistency of sound quality). Optionally, the operator may sell or cause to be sold or offered to a patron a personal headset for the reasons stated hereinabove. In one embodiment, rather than a seasonal or other type (e.g., performance series) of rental, an operator may sell a receiving system to a patron. For a patron with a rental or purchased receiving system, the operator may issue an identification card (e.g., inclusive of a name, receiving system ID, patron photo, etc.) or produce a machine-readable indicia (e.g., QR code, programmed RFID, etc.) and optionally affixed or included within the receiving system, such a patron may simply present the ID card or allow for the machine-readable indicia to be scanned by a reader operated by the operator.

For a receiving system that is rented and/or owned, the patron may purchase an unlimited amount of usage (e.g., an entire season, a lifetime, a certain number of performances, a certain number of hours, etc.), and a database, such as local or national database, may be used to monitor actual usage. To monitor actual usage, a system that records a performance check-in of the receiving system may add to a total number of performances, amount of time usage (e.g., based on the length of the performance), dates and times of usage, and so on. If the patron purchased a seasonal pass, then the database may record an expiration at the end of the season, thereby requiring the patron to purchase a new seasonal pass for the following season. If the patron purchased a certain number of performances (e.g., six), then after the system deducts the number of performance of usage from the database, the patron will be required to purchase more performances to further use the receiving system. If the patron purchased a certain number of hours of usage (e.g., 50 hours), then after the system deducts the number of hours of usage of usage from the database, the patron will be required to purchase more hours for continued usage of the receiving system. The system may also accommodate promotional offers (e.g., buy 10 performances, get two free), which may be included in the database and automatically managed by a system that operates the database. When the system determines that the purchased units (e.g., season, hours, performances, etc.) are depleted, the system may disable audio from being distributed to the receiving system if a point-to-point communication is utilized (e.g., network addressable receiving system) or processed or otherwise communicated to earphones of the receiving system by electronics (e.g., timer being set to zero, processor preventing audio signals being output to the headset, etc.).

It should also be understood that the type of previous purchases by the patron may not be limiting to future purchases by the patron for use of the receiving system. For example, if the patron previously purchased a certain number of performance for usage of the receiving system, then a future purchase may enable the patron to purchase a seasonal usage, a certain number of hours, and so on. Moreover, the patron may be offered the ability to purchase a patron-only usage or family usage (e.g., spouses, spouses and children, etc.).

In practice, upon entering the venue, the patron may proceed to a service desk or automated station where the patron's ID may be scanned or entered into the database (e.g., local or centralized for multiple venues), adequate audio access (e.g., sufficient number of performances remaining) may be verified, amount to be used subtracted from the patron's available balance, and a receiving system (plus, perhaps, a T Loop adapter, cochlear implant cable, etc. or these may be purchased) provided to the patron along with the receiver ID entered into the database associated with information associated with the patron.

Prior to leaving the venue, the patron may merely hand the receiving system to the operator or drops the receiving system into a conveniently located receptacle for return (and receive the ID or other deposit). Thereafter, the returned receiving systems are scanned and the database is updated to remove the returned receiving system from the patrons' entry. Any remaining receiving systems in the database may be considered unreturned. Such a patron is then contacted to return the receiving system or a credit card on file is charged.

Assuming a central database for all users of the receiving systems, a patron from Dallas, for example, may travel to New York to see Broadway shows and bring the receiving system and/or personal headset, ID card, etc., and required by the operators. The patron may access a compatible broadcast system with the receiving system at a New York theater, the database may be debited (e.g., available hours reduced, available performances reduced, etc.). As a centralized database may be utilized, revenue for the hours or used this way may be split between the Dallas, New York, or other participating venues.

In an embodiment, the receiving systems may be configured with a unique machine-readable indicia, such as a barcode, QR code, radio frequency identifier (RFID) tag, or any other machine-readable identifier. At the registration station, a machine-readable identifier reader, such as a barcode reader, RFID reader, or other machine-readable identifier reader, may be connected to or in communication with a system that manages a database for the event so as to track headsets that are distributed and/or activated for the event. In an embodiment, in addition to or alternative to the machine-readable indicia reader, a local wireless device that may be configured to communicate with an electrical element and/or electronic circuit of the receiving system may be utilized to activate the receiving system. In an embodiment, the local wireless device may include an inductive pad (e.g., magnetic coupling coil in the pad and corresponding inductive coupling coil in the wireless headset), RF pad (e.g., RF transmitter/antenna in a pad and corresponding antenna/receiver in the wireless receiving system), or any other wireless electrical coupling device.

In operation, as a patron is issued at least a portion of a receiving system, an operator may register the receiving system or a portion thereof by using a code reader (e.g., using a barcode reader or RFID reader). Alternatively, the operator may type in a code associated with the receiving system (e.g., identifier associated with a machine-readable indicia) into a keyboard or otherwise to register that the specific receiving system is being issued and optionally to a specific patron or payment mechanism (e.g., credit card). After registering the receiving system, the receiving system may be enabled by the operator. In an embodiment, the operator may activate the receiving system my applying a wireless signal thereto. The wireless signal may be a wireless coupling signal (e.g., inductive magnetic coupling with a specific frequency), RF signal, or otherwise that causes a timer circuit to be activated, which in turn, enables the receiving system to operate (e.g., apply electrical power to a receiver or headphone amplifier). If the receiving system is configured with a network address and configured to receive an activation signal in the form of a control signal and/or data signal, then registration of the headset may automatically cause a control and/or data signal to be communicated to the receiving system to cause a timer, either hardware or software, to activate. If software, one or more processors may be utilized to enable operation while the timer has not reached a final countdown. Whether the timer is a hardware timer or software timer, the timer may enable operation of the headset for a minimum amount of time, such as four hours so that the patron can utilize the headset during a performance. The receiving system thereafter has to be re-registered and re-activated for a next usage. In an embodiment, an operator may actively turn off the timer using a setting on the headset, the same or different inductive or RF pad, communicate another control signal to the receiving system, or otherwise.

If the receiving system is integrated into a mobile app that enables a patron to utilize a mobile electronic device (e.g., smartphone) that provides the functionality of the hearing assist audio signals as previously described, the patron may make a payment via the mobile app to activate the audio during a specific performance and the mobile app may support the functionality during the performance. For example, the mobile app may perform the functionality over the time of the performance and automatically deactivate thereafter. If a patron desires to use the mobile app during subsequent performance, then payment is to be made before activating the audio output from the mobile app. The mobile app may utilize a timer or simply activate and deactivate the audio for a specific performance for which a patron selects and pays. A mobile app being executed on a mobile electronic device in which a patron wears earphones to listed to enhanced audio output by the mobile app may be considered a receiving system. As with certain embodiments of the receiving system, the mobile app may access a microphone of the mobile device and perform a correlation of ambient sound to processed sound being received so as to add a proper delay. Other characteristics of the ambient sound detected by the microphone identified and/or adjusted by the mobile app being executed by the receiving device may include excessive bass, mix of the voice spectrum levels in the audio stream versus ambient sound levels, and/or any other related output parameters of the audio output stream from the device (e.g., mobile phone executing the mobile app or other electronic device executing dedicated software as opposed to an app). Because the mobile app may have additional controls available to the patron, a manually adjustable delay may be possible.

As part of the audio enhancement process described hereinabove, the enhanced dialog due to signal processing and volume control of the voice frequency spectrum typically has significantly higher voice frequency spectrum content than, for example, a listener receives at a distance from a person or group of people talking or singing. This significantly higher voice frequency spectrum content results because higher frequencies tend to dissipate more over distance than lower frequencies. Further, because of the characteristics of many sound reinforcement speakers and audio systems, high frequencies in the voice spectrum significantly dissipate rapidly over distance to the listener. In many cases, the listener may experience further distortion or reduction of the high frequencies that enable patrons to more clearly discern speech due to destructive 'comb filtering' and out-of-phase addition of signals arriving at a listener from reflected paths or multiple speakers in a venue.

Although the preceding is described for voice frequencies, it is also true for musical instruments, etc. Such problematic audio situations are typically interpreted by a listener as distance sounds. Thus, a listener or patron who is located far from a 'front and center' (e.g., first several rows and centrally located relative to a stage) venue seat location may psychologically feel distanced from and not part of the performance. However, as a result of signal processing of the system described herein (and in many cases further enhanced by microphones being close to performer's mouth), the headsets and/or patron purposely admitting ambient sound into his or her ears so as to not feel isolated, the mix of ambient and processed sounds psychologically makes the patron utilizing the principles described herein feel 'front and center' and closer to the stage, thus more immersed in the performance. By providing a patron utilizing the receiving system, whether embodied in a custom device or mobile device executing a mobile app, the patron having access to adjust volume control psychologically brings the listener 'closer' to the stage as well as changing volume. It should be understood that the improvement to voice frequencies apply to output from loudspeakers and other transducers.

One embodiment may enable for a patron to pay for a season usage of the receiving system and/or mobile app. In such a situation, the patron and/or operators may be able to register and activate the receiving system in the same or similar manner, but payment may not be needed for any performance during the season. Rather, a database may be configured to identify payment has been performed for all performances during a season at a venue, thereby allowing the patron to simply pick up a receiving system and the operator activate the receiving system or allow the patron to activate a mobile app for any performance during a season (e.g., a season membership for use of a receiving system). There may be different levels of a seasonal purchase, such as particular type of performance (e.g., operas, plays, movies, etc.), all performances at a specific venue, all performance at multiple venues, or otherwise, and a local or centralized database (e.g., cloud-based database) may support the season membership.

The above may be adapted for hearing impaired patrons by configuring the receiving system to include the headset or alternatives, such as a cochlear implant interconnection, a hearing aid streamer interconnection, a Bluetooth send/receive pair used in place of a physical interface or as a direct connection to a compatible hearing aid or cellphone (note that any patrons may have hearing aids controlled by mobile phones, which could 'insert' venue hearing assist audio into the hearing aid's audio system).

The above may be adapted for typical hearing impaired patrons. Using a hearing aid or mobile phone may allow for a lower cost season or individual use rental or access as use of such systems without having to utilize a receiving system may mean faster service and no waiting in line to return the receiving system and cost/time savings for the venue. Alternatively, equipping the typical hearing impaired patron (e.g., assumed by the American Disabilities Act (ADA)) with an ID card that may be part of the receiving station to conveniently allow for conveniences of fast service and return of the receiving system, such as described with regard to FIG. 12. Moreover, as a patron may access the audio stream using an alternative means (e.g., mobile app) as opposed having to use a receiving system provided by the operator at the venue(s), more people may utilize the principles provided herein with minimal cost to the operator.

As an alternative to encryption of the audio signal, 'fixed channel hopping' or other signal instructions may be input to a receiving system at the time the receiving system is registered and released to a patron. For example, a standard hearing assist transmitter may have 15-50 available channels. Assume a different channel is selected for every performance, the current channel number may be transmitted to the receiving system at the time of registration. Rather that complex encryption, other easier methods that may be relatively simple transmitter modifications for a wider FM band channel, definition of a channel still within the allowed frequency range, but a different center-point frequency, single side band, etc. Different channels may also be assigned for foreign languages users, commentary to the blind, etc.

As an alternative to wireless communications, there may be cases where a venue may wire seats or similar access points. Based on construction of a suitable 'wired receiver,' the same functionality may be maintained as described above with similar output options in the receiving system. To prevent unauthorized use, the access point receptacle and the receiving system may be a proprietary or uncommon configuration to prevent access by common plugs, such as a 3 mm phone jack, as typically used on wired headsets. In an embodiment, a receptacle and the receiving system may have an uncommon or proprietary configuration to prevent access by common plugs, such as a 3 mm phone jack or otherwise, as typically used on wired headsets.

The foregoing method descriptions and the process flow diagrams are provided merely as illustrative examples and are not intended to require or imply that the steps of the various embodiments must be performed in the order presented. As will be appreciated by one of skill in the art, the steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations may be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed here may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to and/or in communication with another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description here.

When implemented in software, the functions may be stored as one or more instructions or code on a non-transitory computer-readable or processor-readable storage medium. The steps of a method or algorithm disclosed here may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used here, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The previous description is of a preferred embodiment for implementing the invention, and the scope of the invention should not necessarily be limited by this description. The scope of the present invention is instead defined by the following claims.

What is claimed is:

1. A method for enhancing audio quality of audio signals in venues hosting sound programs, the method comprising:
   reducing, by a computer system, amplitudes of one or more segments of an audio signal to generate a first audio signal, the amplitudes of the one or more segments determined to be below a first threshold;
   applying, by the computer system, multi-band compression to the first audio signal to generate a second audio signal, applying the multi-band compression includes reducing dynamic ranges of the first audio signal within multiple frequency bands;
   reducing, by the computer system, a dynamic range of the second audio signal to generate a third audio signal;
   generating, by the computer system, an output audio signal using a sum of the second audio signal and the third audio signal; and
   transmitting, by the computer system, the output signal over one or more communication channels to a plurality of receivers, each receiver communicatively coupled to a corresponding output component.

2. The method of claim 1, further comprising applying high pass filtering to the audio signal before reducing the amplitudes of the one or more segments determined to be below the first threshold.

3. The method of claim 1, further comprising applying a corrective equalizer to enhance amplitudes of frequency components of the audio signal at frequencies greater than or equal to 2 KHz before reducing the amplitudes of the one or more segments determined to be below the first threshold.

4. The method of claim 1, wherein reducing the amplitudes of the one or more segments of the audio signal includes:
   initiating amplitude suppression of the audio signal upon detecting that an amplitude of the audio signal is below the first threshold for a first predefined time period; and
   turning off the amplitude suppression upon detecting that the amplitude of the audio signal exceeds the first threshold for a second predefined time period.

5. The method of claim 4, wherein the amplitude suppression includes multiplying a difference between the amplitude of the audio signal and the first threshold by a predefined scaler.

6. The method of claim 4, wherein the first threshold is between −25 and −45 decibels relative to full scale (dBFS).

7. The method of claim 1, wherein generating the first audio signal further comprises:
applying wide-band compression to the audio signal with reduced amplitudes of the one or more segments, applying the wide-band compression includes reducing a dynamic range of the audio signal after reducing the amplitudes of the one or more segments.

8. The method of claim 7, wherein applying the wide-band compression includes:
detecting, after reducing the amplitudes of the one or more segments, one or more second segments of the audio signal having amplitudes exceeding a second threshold and including frequency components within a predefined frequency band; and
reducing the dynamic range of audio signal within the one or more second segments.

9. The method of claim 8, comprising:
initiating amplitude suppression of the audio signal upon detecting that (i) an amplitude of the first audio signal exceeds the second threshold for a first predefined time period and that (ii) the audio signal includes at least one frequency component within the predefined frequency band during the first predefined time period; and
turning off the amplitude suppression of the audio signal upon detecting that (i) the amplitude of the audio signal is below the second threshold for a second predefined time period or that (ii) the audio signal does not include frequency components with the predefined frequency band during the second predefined time period.

10. The method of claim 9, wherein the amplitude suppression includes multiplying a difference between the amplitude of the audio signal and the second threshold by a predefined scalar.

11. The method of claim 8, wherein the second threshold is between −25 and −10 decibels relative to full scale (dBFS).

12. The method of claim 8, wherein the predefined frequency band is between about 100 Hz and about 2 KHz.

13. The method of claim 1, wherein applying multi-band compression to the first audio signal includes:
applying a first band-pass filter to the first audio signal to generate a first band-pass filtered audio signal;
applying a second band-pass filter to the first audio signal to generate a second band-pass filtered audio signal, the first band-pass filter and the second band-pass filter associated with different frequency bands;
detecting one or more segments of the first band-pass filtered audio signal having amplitudes exceeding a second threshold;
reducing a dynamic range of the one or more segments of the first band-pass filtered audio signal;
detecting one or more segments of the second band-pass filtered audio signal having amplitudes exceeding a third threshold;
reducing a dynamic range of the one or more segments of the second band-pass filtered audio signal; and
generating the second audio signal using a sum or weighted sum of the first band-pass filtered audio signal and the second band-pass filtered audio signal.

14. The method of claim 13, comprising:
initiating amplitude suppression of the first band-pass filtered audio signal upon detecting that an amplitude of the first band-pass filtered audio signal exceeds the second threshold for a first predefined time period.

15. The method of claim 1, wherein reducing the dynamic range of the second audio signal includes reducing the dynamic range of the second audio signal within a predefined frequency range.

16. The method of claim 15, wherein reducing the dynamic range of the second audio signal within the predefined frequency range includes:
initiating amplitude suppression of the second audio signal upon detecting that (i) an amplitude of the second audio signal exceeds a second threshold for a first predefined time period and that (ii) the second audio signal includes at least one frequency component within the predefined frequency band during the first predefined time period; and
turning off the amplitude suppression of the first band-pass filtered audio signal upon detecting that (i) the amplitude of the second audio signal is below the second threshold for a second predefined time period or that (ii) the second audio signal does not include frequency components with the predefined frequency band during the second predefined time period.

17. The method of claim 16, wherein the first threshold is between −20 and −40 decibels relative to full scale (dBFS).

18. The method of claim 15, wherein the predefined frequency band is between about 600 Hz and about 6 KHz.

* * * * *